(12) United States Patent
Kwon et al.

(10) Patent No.: US 11,011,710 B2
(45) Date of Patent: May 18, 2021

(54) ORGANOMETALLIC COMPOUND AND ORGANIC LIGHT-EMITTING DEVICE INCLUDING THE SAME

(71) Applicants: Samsung Electronics Co., Ltd., Suwon-si (KR); Samsung SDI Co., Ltd., Yongin-si (KR)

(72) Inventors: Eunsuk Kwon, Suwon-si (KR); Wook Kim, Suwon-si (KR); Minsik Min, Suwon-si (KR); Sangho Park, Anyang-si (KR); Hyejin Bae, Suwon-si (KR); Jhunmo Son, Yongin-si (KR); Hasup Lee, Seoul (KR); Yongsik Jung, Yongin-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 127 days.

(21) Appl. No.: 16/192,051

(22) Filed: Nov. 15, 2018

(65) Prior Publication Data

US 2020/0358007 A1 Nov. 12, 2020

(30) Foreign Application Priority Data

Nov. 23, 2017 (KR) .................. 10-2017-0157499
Nov. 6, 2018 (KR) .................. 10-2018-0135417

(51) Int. Cl.
*H01L 51/00* (2006.01)
*C07F 15/00* (2006.01)
(Continued)

(52) U.S. Cl.
CPC ...... *H01L 51/0085* (2013.01); *C07F 15/0033* (2013.01); *C09K 11/06* (2013.01);
(Continued)

(58) Field of Classification Search
CPC ............. H01L 51/0085; H01L 51/5016; C07F 15/0033; C09K 11/06
See application file for complete search history.

(56) References Cited

U.S. PATENT DOCUMENTS 10,069,081 B2 * 9/2018 Xia ..................... H01L 51/0061
2014/0158992 A1 6/2014 Xia et al.
2017/0365802 A1 12/2017 Bold et al.

FOREIGN PATENT DOCUMENTS

JP 2009-102533 A 5/2013
WO 02-15645 A1 2/2002
(Continued)

OTHER PUBLICATIONS

Abramov Pavel et al. "Emission tuning in Re(I) complexes: Expanding heterocyclic ligands and/or introduction of perfluorinated ligands", Polyhedron, vol. 137, Sep. 5, 2017, pp. 231-237.
(Continued)

*Primary Examiner* — Anthony Ho
(74) *Attorney, Agent, or Firm* — Cantor Colburn LLP

(57) ABSTRACT

An organometallic compound represented by Formula 1:

$$M_{11}(L_{11})_{n11}(L_{12})_{n12} \quad \text{Formula 1}$$

wherein, in Formula 1, $M_{11}$, $L_{11}$, $L_{12}$, n11, and n12 are the same as described in the specification.

20 Claims, 1 Drawing Sheet

(51) Int. Cl.
*C09K 11/06* (2006.01)
*H01L 51/50* (2006.01)

(52) U.S. Cl.
CPC ............ *C09K 2211/1059* (2013.01); *C09K 2211/185* (2013.01); *H01L 51/5016* (2013.01)

(56) References Cited

FOREIGN PATENT DOCUMENTS

WO    2005019373  A2    3/2005
WO    2015-130780 A1    9/2015

OTHER PUBLICATIONS

Alexey Gusev et al. "New Zn complexes based on 1,2,4-triazoles: Synthesis, structure and luminescence", Inorganica Chimica Acta, Elsevier BV, NL, vol. 376, No. 1, Jul. 11, 2011, pp. 509-514.

Alexey N Gusev et al. "Structural and photophysical studies of europium complexes containing triazole ligands", Inorganica Chimica Acta, Elsevier BV, NL, vol. 387, Feb. 10, 2012, pp. 321-326.

Database WPI Week 200934 Thomson Scientific, London, GB; AN 2009-J24211.

EESR issued by the European Patent Office dated Mar. 4, 2019 in the examination of the European Patent Application No. 182056341-1109, 10 pp.

Gusev A. N. et al. "Adducts of lanthanide acetylacetonates with 5-phynyl-2-(2-pyridyl)-7,8-benzo-6,5-dihydro-1,3,6-triazaindolizine: structure and photoluminescence", Russian Chemical Bulletin, Springer New York LLC, US, vol. 63, No. 7, Mar. 7, 2015, pp. 1493-1497.

Gusev Alexey et al. "Structural and photophysical studies on ternary Sm(III), Nd(III), Yb(III), Er(III) complexes containing pyridyltriazole ligands", Polyhedron, vol. 47, No. 1, 2012, pp. 37-45.

Ruben Seifert et al. "Chemical degradation mechanisms of highly efficient blue phosphorescent emitters used for organic light emitting diodes", Organic Electronics 14 (2013) 115-123.

Shin-ya et al. "Phosphorescent Iridium Complexes Based on 2-Phenylimidazo[1,2-a]pyridine Ligands: Tuning of Emission Color toward the Blue Region and Application to Polymer Light-Emitting Devices", Inorganic Chemistry, 2007, 46, 4308-4319.

\* cited by examiner

ORGANOMETALLIC COMPOUND AND ORGANIC LIGHT-EMITTING DEVICE INCLUDING THE SAME

CROSS-REFERENCE TO RELATED APPLICATION

This application claims priority to Korean Patent Application No. 10-2017-0157499, filed on Nov. 23, 2017, and Korean Patent Application No. 10-2018-0135417 filed on Nov. 6, 2018 in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound and an organic light-emitting device including the same.

2. Description of the Related Art

Organic light-emitting devices (OLEDs) are self-emission devices that produce full-color images, and that also have wide viewing angles, high contrast ratios, short response times, and excellent characteristics in terms of brightness, driving voltage, and response speed, compared to devices in the art.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Various types of organic light emitting devices are known. However, there still remains a need in OLEDs having low driving voltage, high efficiency, high brightness, and long lifespan.

SUMMARY

Aspects of the present disclosure provide a novel organometallic compound and an organic light-emitting device including the same.

Additional aspects will be set forth in part in the description which follows and, in part, will be apparent from the description, or may be learned by practice of the presented embodiments.

An aspect of the present description provides an organometallic compound represented by Formula 1:

$$M_{11}(L_{11})_{n11}(L_{12})_{n12}.$$ Formula 1

In Formula 1, $M_{11}$ may be a transition metal, $L_{11}$ may be selected from a group represented by Formula 1A, n11 may be selected from 1, 2, 3, and 4, wherein, when n11 is 2 or more, 2 or more groups $L_1$ are the same or different from each other, $L_{12}$ may be selected from a one-coordinate ligand, a two-coordinate ligand, and a three-coordinate ligand, n12 may be selected from 0, 1, 2, 3, and 4, wherein, when n12 is 2 or more, 2 or more groups $L_{12}$ are the same or different from each other, $L_{11}$ and $L_{12}$ may be different from each other, Formula 1A

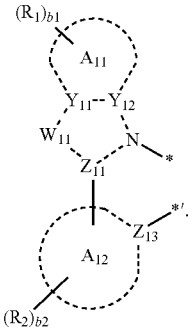

In Formula 1A, $A_{11}$ may be a $C_1$-$C_{30}$ heterocyclic group, $A_{12}$ may be a $C_5$-$C_{30}$ carbocyclic group or a $C_1$-$C_{30}$ heterocyclic group, $W_{11}$ may be selected from N and $N(R_{11})$, $Y_{11}$ and $Y_{12}$ may each independently be selected from N and C, wherein at least one selected from $Y_{11}$ and $Y_{12}$ is N, $Z_{11}$ and $Z_{13}$ may be each C, $R_1$, $R_2$, and $R_{11}$ may each independently be selected from hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_1$)($Q_2$), two or more selected from $R_1$, $R_2$, and $R_{11}$ may optionally be linked to each other to form a ring, two, three, or four selected from a plurality of neighboring $R_1$, $R_2$, and $R_{11}$ may optionally be linked to form a four-coordinate ligand, a six-coordinate ligand, or an eight-coordinate ligand, $Q_1$ to $Q_9$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_1$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, and the following compound may be excluded from the organometallic compound represented by Formula 1:

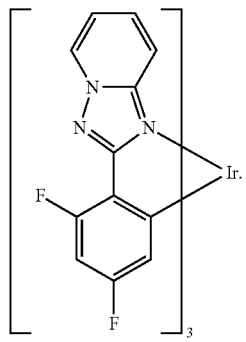

Another aspect of the present description provides an organic light-emitting device including:

a first electrode;

a second electrode; and an organic layer disposed between the first electrode and the second electrode and including an emission layer, wherein the organic layer includes the organometallic compound described above.

The organometallic compound may act as a dopant in the emission layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
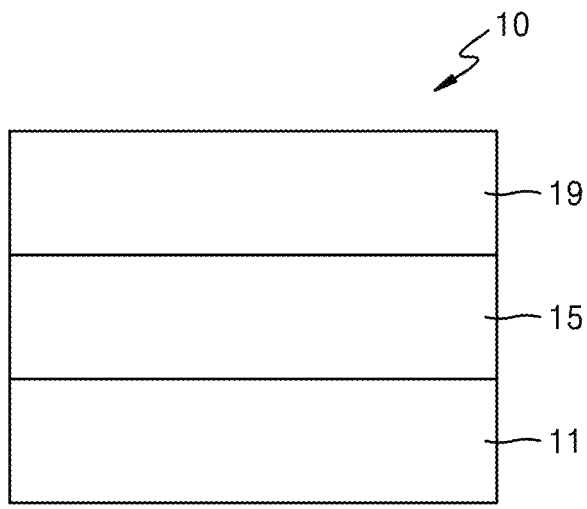
FIG. 1 is a schematic view of an organic light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In an embodiment, an organometallic compound is provided. The organometallic compound according to an embodiment may be represented by Formula 1:

$$M_{11}(L_{11})_{n11}(L_{12})_{n12}.$$ Formula 1

In Formula 1, $M_{11}$ may be a transition metal.

For example, in Formula 1, $M_{11}$ may be selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm), but embodiments of the present disclosure are not limited thereto.

In an embodiment, in Formula 1, $M_{11}$ may be selected from Ir, Os, and Pt, but embodiments of the present disclosure are not limited thereto.

In an embodiment, in Formula 1, $M_{11}$ may be Ir, but embodiments of the present disclosure are not limited thereto.

In Formula 1, $L_{11}$ may be selected from a group represented by Formula 1A:

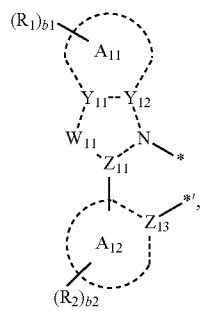

Formula 1A

The description of Formula 1A may be the same as described herein.

In Formula 1A, $A_{11}$ may be $C_1$-$C_{30}$ heterocyclic group, $A_{12}$ may be $C_5$-$C_{30}$ carbocyclic group or $C_1$-$C_{30}$ heterocyclic group.

For example, in Formula 1A, $A_{11}$ may be selected from a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a benzoquinoxaline group, a quinazoline group and a benzoquinazoline group.

For example, in Formula 1A, $A_{12}$ may be selected from a benzene group, a naphthalene group, a fluorene group, a carbazole group, a dibenzofuran group, a dibenzothiophene group, a pyridine group, a pyrimidine group, a pyrazine group, a pyridazine group, a triazine group, a quinoline group, an isoquinoline group, a benzoquinoline group, a benzoisoquinoline group, a phthalazine group, a naphthyridine group, a quinoxaline group, a benzoquinoxaline group, a quinazoline group and a benzoquinazoline group.

In Formula 1A, a bond between $Z_{11}$ and N, a bond between $Z_{11}$ and $W_{11}$, a bond between $W_{11}$ and $Y_{11}$, a bond between $Y_{11}$ and $Y_{12}$, and a bond between N and $Y_{12}$ may each independently be a single bond or a double bond.

In Formula 1A, $W_{11}$ may be selected from N and $N(R_{11})$, and $R_{11}$ may be the same as described herein.

For example, in Formula 1A, $W_{11}$ may be N, but embodiments of the present disclosure are not limited thereto.

In this embodiment, in Formula 1A, a bond between $Z_{11}$ and $W_{11}$ may be a double bond; or a bond between $Y_{11}$ and $W_{11}$ may be a double bond, but embodiments of the present disclosure are not limited thereto.

In Formula 1A, $Y_{11}$ and $Y_{12}$ may each independently be selected from N and C, wherein at least one selected from $Y_{11}$ and $Y_{12}$ may be N.

For example, in Formula 1A, $Y_{11}$ may be N, and $Y_{12}$ may be C; $Y_{11}$ may be C, and $Y_{12}$ may be N; or $Y_{11}$ may be N, and $Y_{12}$ may be N, but embodiments of the present disclosure are not limited thereto.

In an embodiment, in Formula 1A, $Y_{11}$ may be N, and $Y_{12}$ may be C; $Y_{11}$ may be C, and $Y_{12}$ may be N, but embodiments of the present disclosure are not limited thereto.

In this embodiment, a bond between $Y_{11}$ and $Y_{12}$ may be a double bond, but embodiments of the present disclosure are not limited thereto.

In Formula 1A, $Z_{11}$ and $Z_{13}$ may each independently be C.

For example, in Formula 1A, two bonds selected from a bond between $Z_{11}$ and N, a bond between $Z_{11}$ and $W_{11}$, a bond between W and Yu, a bond between $Y_{11}$ and $Y_{12}$, and a bond between N and $Y_{12}$ may each be a double bond, and the others thereof may each be a single bond, but embodiments of the present disclosure are not limited thereto.

In an embodiment, in Formula 1A, a moiety represented by

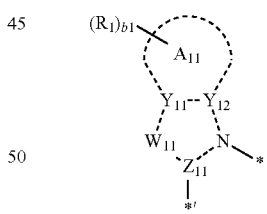

may be represented by Formula 1A-1, and a moiety represented by

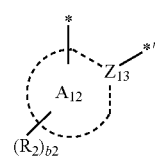

may be represented by Formula 1A-2, but embodiments of the present disclosure are not limited thereto:

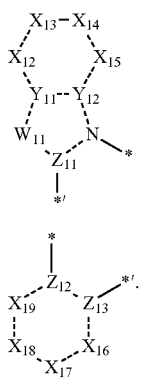

Formula 1A-1

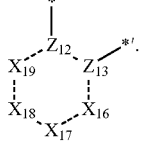

Formula 1A-2

In Formulae 1A-1 and 1A-2, $Y_{11}$, $Y_{12}$, $W_{11}$, $Z_{11}$, and $Z_{13}$ may each independently be the same as defined in Formula 1A;

$X_{12}$ may be selected from N, $N(R_{12a})$, O, S, $C(R_{12a})$, and $C(R_{12a})(R_{12b})$, $X_{13}$ may be selected from N, $N(R_{13a})$, O, S, $C(R_{13a})$, and $C(R_{13a})(R_{13b})$, $X_{14}$ may be selected from N, $N(R_{14a})$, O, S, $C(R_{14a})$, and $C(R_{14a})(R_{14b})$, $X_{15}$ may be selected from N, $N(R_{15a})$, O, S, $C(R_{15a})$, and $C(R_{15a})(R_{15b})$, $X_{16}$ may be selected from N, $N(R_{16a})$, O, S, $C(R_{16a})$, and $C(R_{16a})(R_{16b})$, $X_{17}$ may be selected from N, $N(R_{17a})$, O, S, $C(R_{17a})$, and $C(R_{17a})(R_{17b})$, $X_{18}$ may be selected from N, $N(R_{18a})$, O, S, $C(R_{18a})$, and $C(R_{18a})(R_{18b})$, and $X_{19}$ may be selected from N, $N(R_{19a})$, O, S, $C(R_{19a})$, and $C(R_{19a})(R_{19b})$, $R_{12a}$, $R_{12b}$, $R_{13a}$, $R_{13b}$, $R_{14a}$, $R_{14b}$, $R_{15a}$, $R_{15b}$, $R_{16a}$, $R_{16b}$, $R_{17a}$, $R_{17b}$, $R_{18a}$, $R_{18b}$, $R_{19a}$, and $R_{19b}$ may each independently be defined the same as $R_1$ in Formula 1A, in Formulae 1A-1, * may be a binding site to Mu of Formula 1, and *' may be a binding site to a neighboring atom, and in Formulae 1A-2, *' may be a binding site to $M_{11}$ of Formula 1, and * may be a binding site to a neighboring atom.

In Formulae 1A-1 and 1A-2, a bond between $Y_{12}$ and $X_{15}$, a bond between $X_{15}$ and $X_{14}$, a bond between $X_{13}$ and $X_{14}$, a bond between $X_{12}$ and $X_{13}$, a bond between Y and $X_{12}$, a bond between $Z_{12}$ and $Z_{13}$, a bond between $Z_{13}$ and $X_{16}$, a bond between $X_{16}$ and $X_{17}$, a bond between $X_{17}$ and $X_{18}$, a bond between $X_{18}$ and $X_{19}$, and a bond between $X_{19}$ and $Z_{12}$ may each independently be a single bond or a double bond.

In an embodiment, in Formulae 1A-1 and 1A-2, $X_{12}$ may be selected from N and $C(R_{12a})$, $X_{13}$ may be selected from N and $C(R_{13a})$, $X_{14}$ may be selected from N and $C(R_{14a})$, $X_{15}$ may be selected from N and $C(R_{15a})$, $X_{16}$ may be selected from N and $C(R_{16a})$, $X_{17}$ may be selected from N and $C(R_{17a})$, $X_{18}$ may be selected from N and $C(R_{18a})$, and $X_{19}$ may be selected from N and $C(R_{19a})$, but embodiments of the present disclosure are not limited thereto.

In an embodiment, in Formula 1A-1, $X_{12}$ may be $C(R_{12a})$, $X_{13}$ may be $C(R_{13a})$, $X_{14}$ may be $C(R_{14a})$, and $X_{15}$ may be $C(R_{15a})$, but embodiments of the present disclosure are not limited thereto.

In an embodiment, in Formula 1A-1, at least one selected from $X_{12}$ to $X_{15}$ may be selected from O and S, but embodiments of the present disclosure are not limited thereto.

In an embodiment, in Formula 1A-2, $X_{16}$ may be N, $X_{17}$ may be $C(R_{17a})$, $X_{18}$ may be $C(R_{18a})$, and $X_{19}$ may be $C(R_{19a})$; $X_{16}$ may be $C(R_{16a})$, $X_{17}$ may be N, $X_{18}$ may be $C(R_{18a})$, and $X_{19}$ may be $C(R_{19a})$; $X_{16}$ may be $C(R_{16a})$, $X_{17}$ may be $C(R_{17a})$, $X_{18}$ may be N, and $X_{19}$ may be $C(R_{19a})$; $X_{16}$ may be $C(R_{16a})$, $X_{17}$ may be $C(R_{17a})$, $X_{18}$ may be $C(R_{18a})$, and $X_{19}$ may be N; or $X_{16}$ may be $C(R_{16a})$, $X_{17}$ may be $C(R_{17a})$, $X_{18}$ may be $C(R_{18a})$, and $X_{19}$ may be $C(R_{19a})$, but embodiments of the present disclosure are not limited thereto.

In an embodiment, in Formula 1A-1, three bonds selected from a bond between $Y_{11}$ and $Y_{12}$, a bond between $Y_{12}$ and $X_{15}$, a bond between $X_{15}$ and $X_{14}$, a bond between $X_{13}$ and $X_{14}$, a bond between $X_{12}$ and $X_{13}$, and a bond between $Y_{11}$ and $X_{12}$ may each be a double bond, and the others thereof may each be a single bond, but embodiments of the present disclosure are not limited thereto.

In an embodiment, in Formula 1A-2, three bonds selected from a bond between $Z_{12}$ and $Z_{13}$, a bond between $Z_{13}$ and $X_{16}$, a bond between $X_{16}$ and $X_{17}$, a bond between $X_{17}$ and $X_{18}$, a bond between $X_{18}$ and $X_{19}$, and a bond between $X_{19}$ and $Z_{12}$ may each be a double bond, and the others thereof may each be a single bond, but embodiments of the present disclosure are not limited thereto.

In an embodiment, in Formula 1A, a moiety represented by

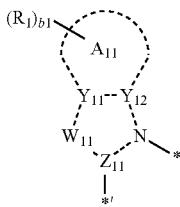

may be represented by one selected from Formulae 2-1 to 2-15, but embodiments of the present disclosure are not limited thereto:

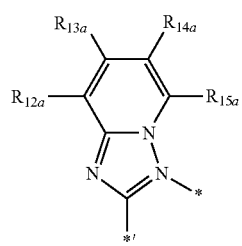

2-1

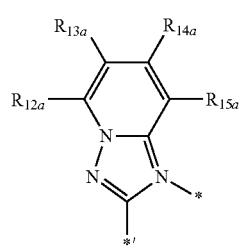

2-2

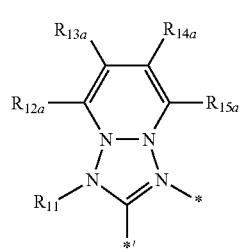

2-3

2-4 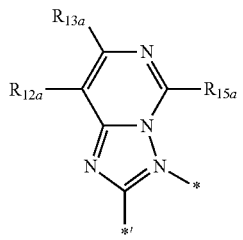
2-5 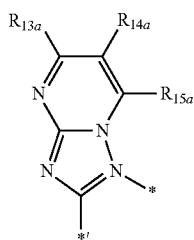
2-6 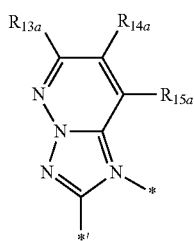
2-7 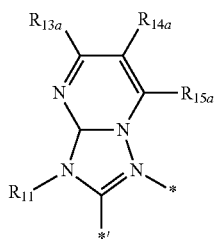
2-8 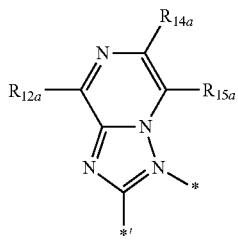
2-9 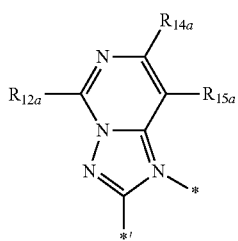
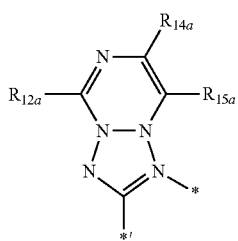
2-10 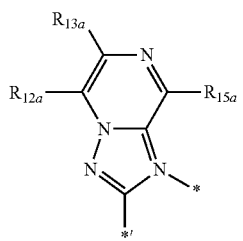
2-11
2-12 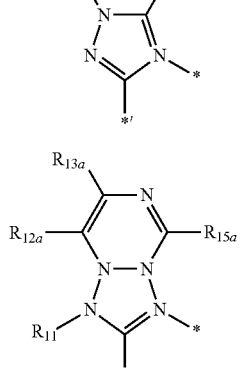
2-13
2-14 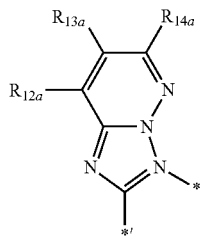
2-15 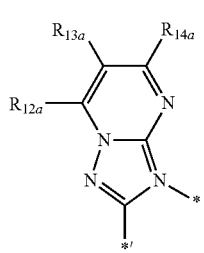
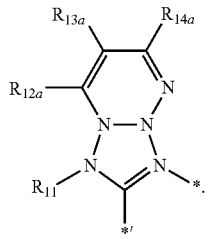
In Formulae 2-1 to 2-15,
$R_{11}$ may be the same as described in Formula 1, $R_{12a}$, $R_{13a}$, $R_{14a}$, and $R_{15a}$ may each independently be defined the same as $R_1$ in Formula 1A; and
* and *' each indicate a binding site to a neighboring atom.

In one or more embodiments, in Formula 1A, a moiety represented by

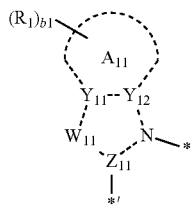

may be represented by one selected from Formulae 2-1 and 2-2, but embodiments of the present disclosure are not limited thereto.

In one or more embodiments, in Formula 1A, a moiety represented by

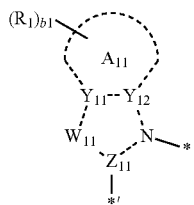

may be represented by Formula 2-1, but embodiments of the present disclosure are not limited thereto.

In an embodiment, in Formula 1A, a moiety represented by

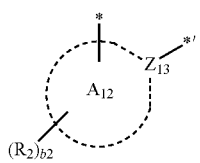

may be represented by one selected from Formulae 3-1 to 3-8, but embodiments of the present disclosure are not limited thereto:

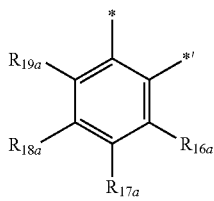  3-1

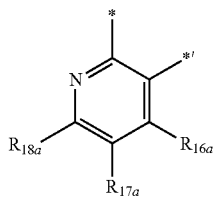  3-2

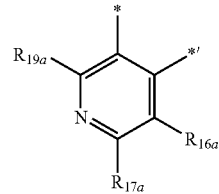  3-3

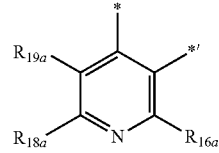  3-4

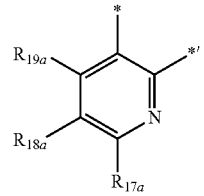  3-5

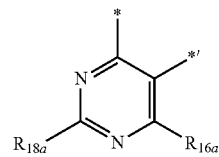  3-6

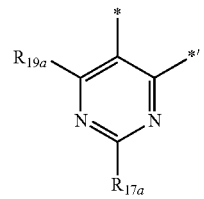  3-7

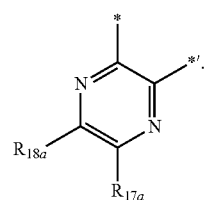  3-8

In Formulae 3-1 to 3-8, $R_{16a}$, $R_{17a}$, $R_{18a}$, and $R_{19a}$ may each independently be the same as $R_2$ described in Formula 1, and

* and *' each indicate a binding site to a neighboring atom.

In one or more embodiments, in Formula 1A, a moiety represented by

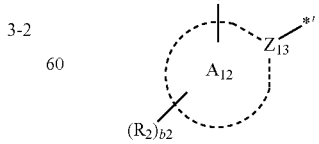

may be represented by one selected from Formulae 3-1 to 3-5, but embodiments of the present disclosure are not limited thereto.

In one or more embodiments, in Formula 1A, a moiety represented by

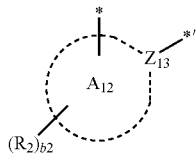

may be represented by Formula 3-1, but embodiments of the present disclosure are not limited thereto.

In Formula 1A, $R_1$, $R_2$, and $R_{11}$ may each independently be selected from hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), two or more selected from $R_1$, $R_2$, and $R_{11}$ may optionally be linked to each other to form a ring, and $Q_1$ to $Q_9$ may each independently be selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{60}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

For example, in Formula 1A, $R_1$, $R_2$, and R may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group and —Si($Q_{33}$)($Q_{34}$)($Q_{35}$); and —N($Q_1$)($Q_2$), —Si($Q_3$)($Q_4$)($Q_5$), —B($Q_6$)($Q_7$), and —P(=O)($Q_8$)($Q_9$), and $Q_1$ to $Q_9$ and $Q_{33}$ to $Q_{35}$ may each independently be selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments of the present disclosure are not limited thereto.

In an embodiment, in Formula 1A, $R_1$, $R_2$, and $R_{11}$ may each independently be selected from:

hydrogen, deuterium, —F, a cyano group, a nitro group, —$SF_5$, a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group;

a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group, each substituted with at least one selected from deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, a dibenzosilolyl group, and —Si($Q_{33}$)($Q_{34}$)($Q_{35}$); and —N($Q_1$)($Q_2$), —Si($Q_3$)($Q_4$)($Q_5$), —B($Q_6$)($Q_7$), and —P(=O)($Q_8$)($Q_9$), and $Q_1$ to $Q_9$ and $Q_{33}$ to $Q_{35}$ may each independently be selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$ and —$CD_2CDH_2$; an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments of the present disclosure are not limited thereto.

In an embodiment, in Formula 1A, $R_1$, $R_2$, and $R_{11}$ may each independently be selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-21, groups represented by Formulae 10-1 to 10-246, —N($Q_1$)($Q_2$), —Si($Q_3$)($Q_4$)($Q_5$), —B($Q_6$)($Q_7$), and —P(=O)($Q_8$)($Q_9$), but embodiments of the present disclosure are not limited thereto:

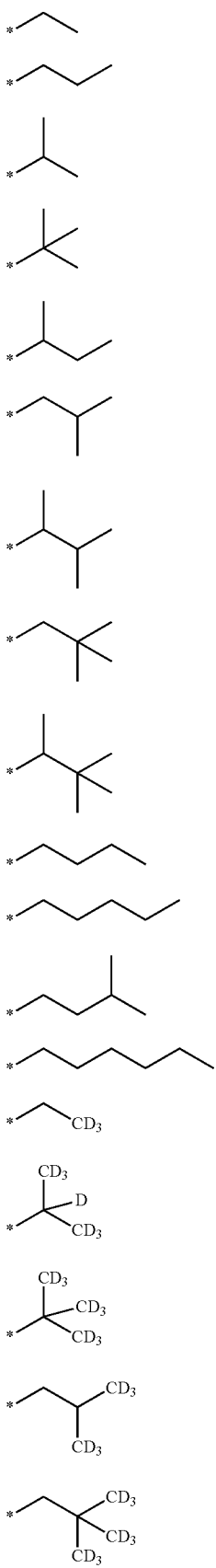
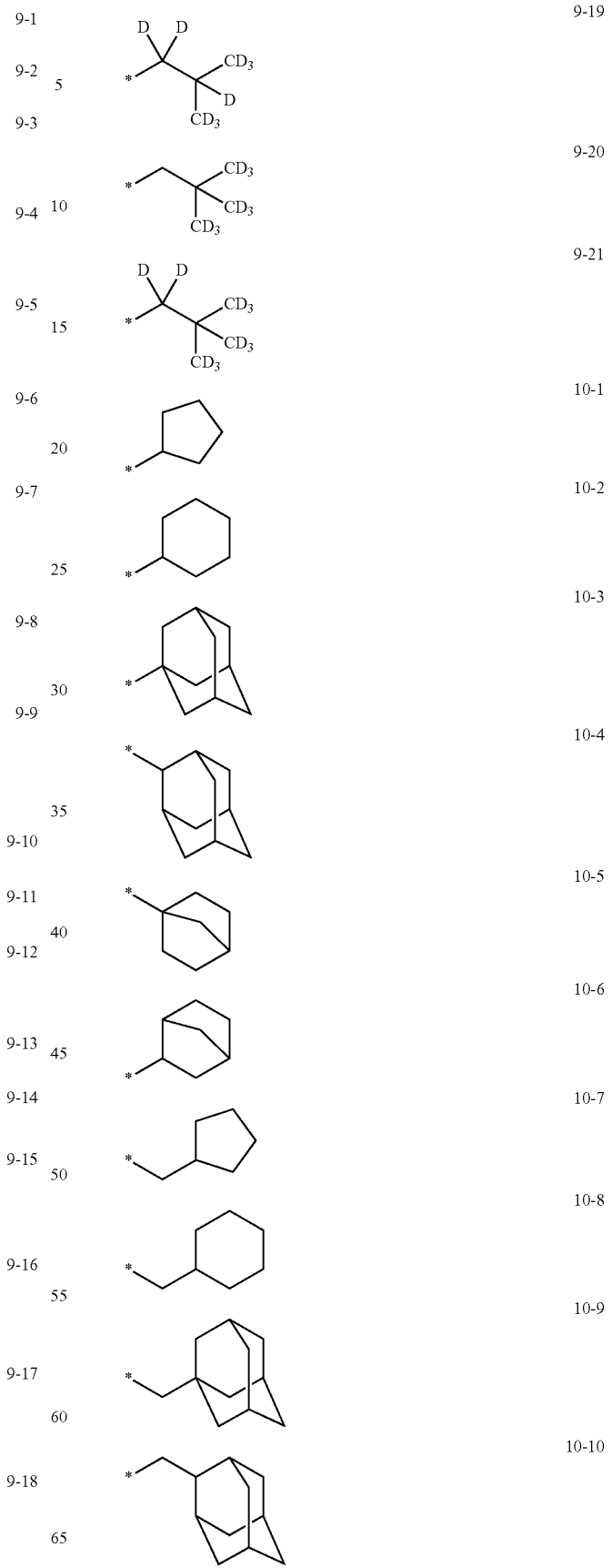

-continued
10-11 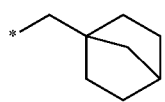
10-12 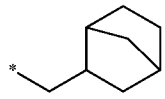
10-13 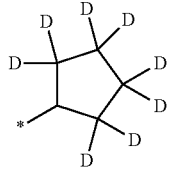
10-14 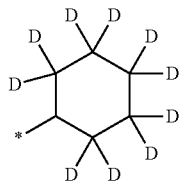
10-15 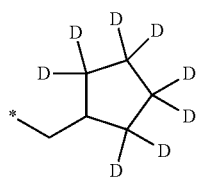
10-16 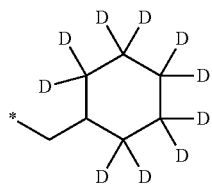
10-17 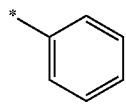
10-18 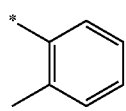
10-19 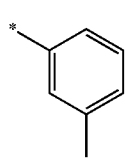
10-20 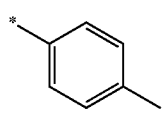
10-21 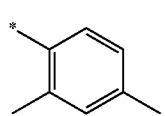
-continued
10-22 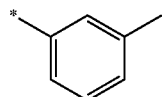
10-23 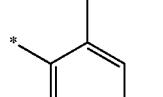
10-24 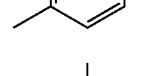
10-25 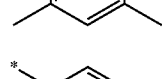
10-26 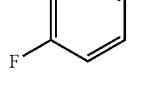
10-27 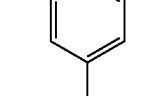
10-28 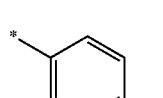
10-29 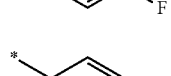
10-30 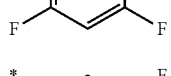
10-31 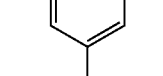
10-32 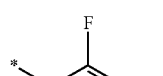

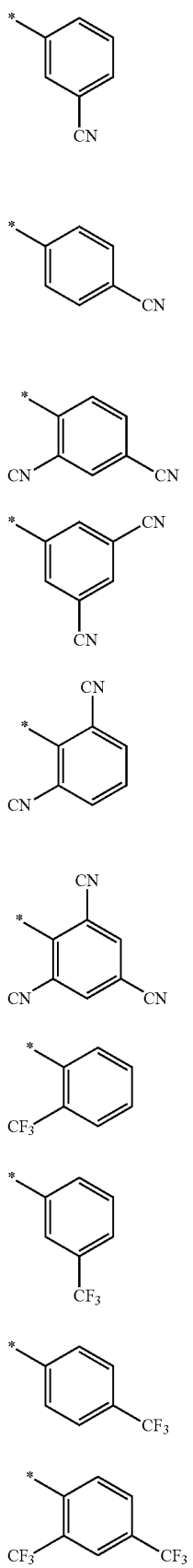
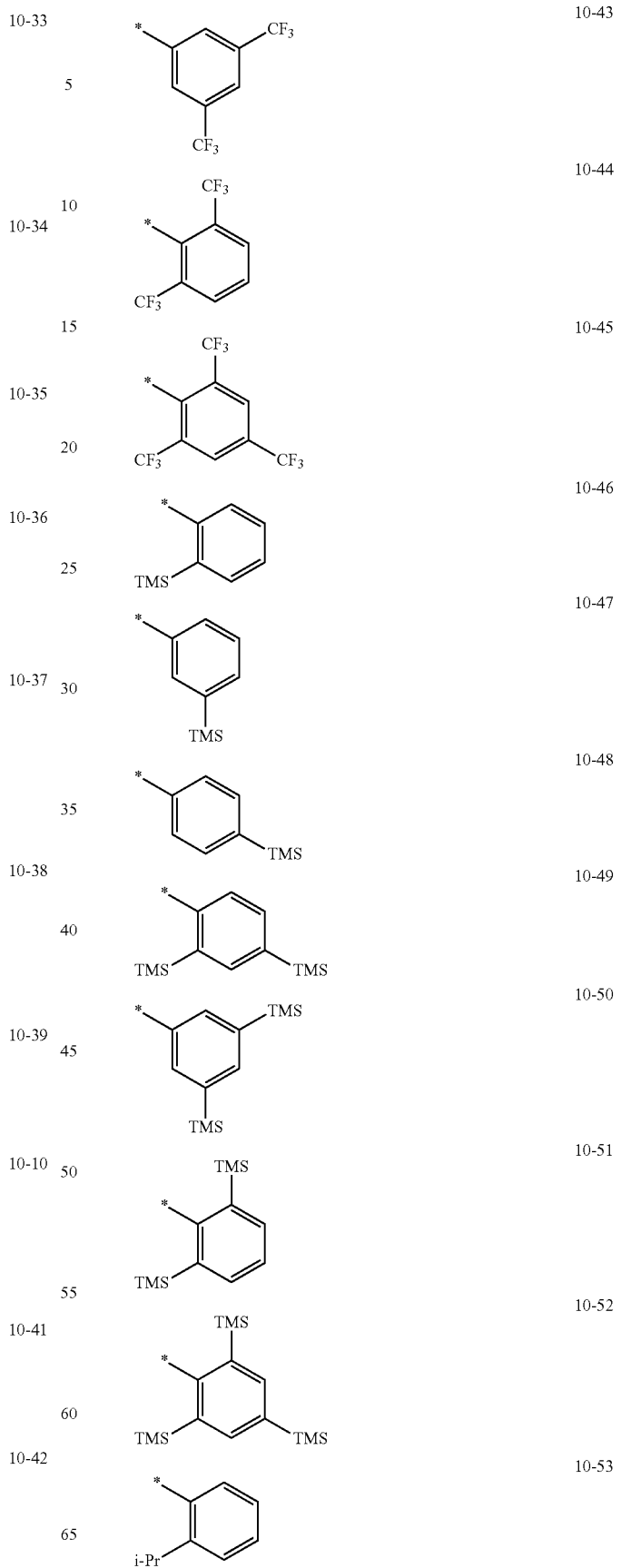

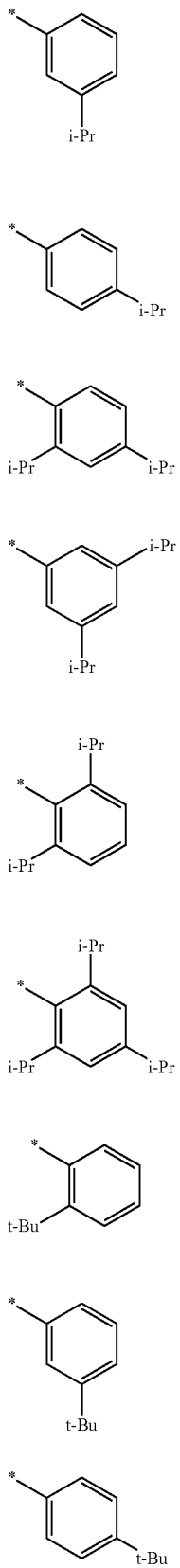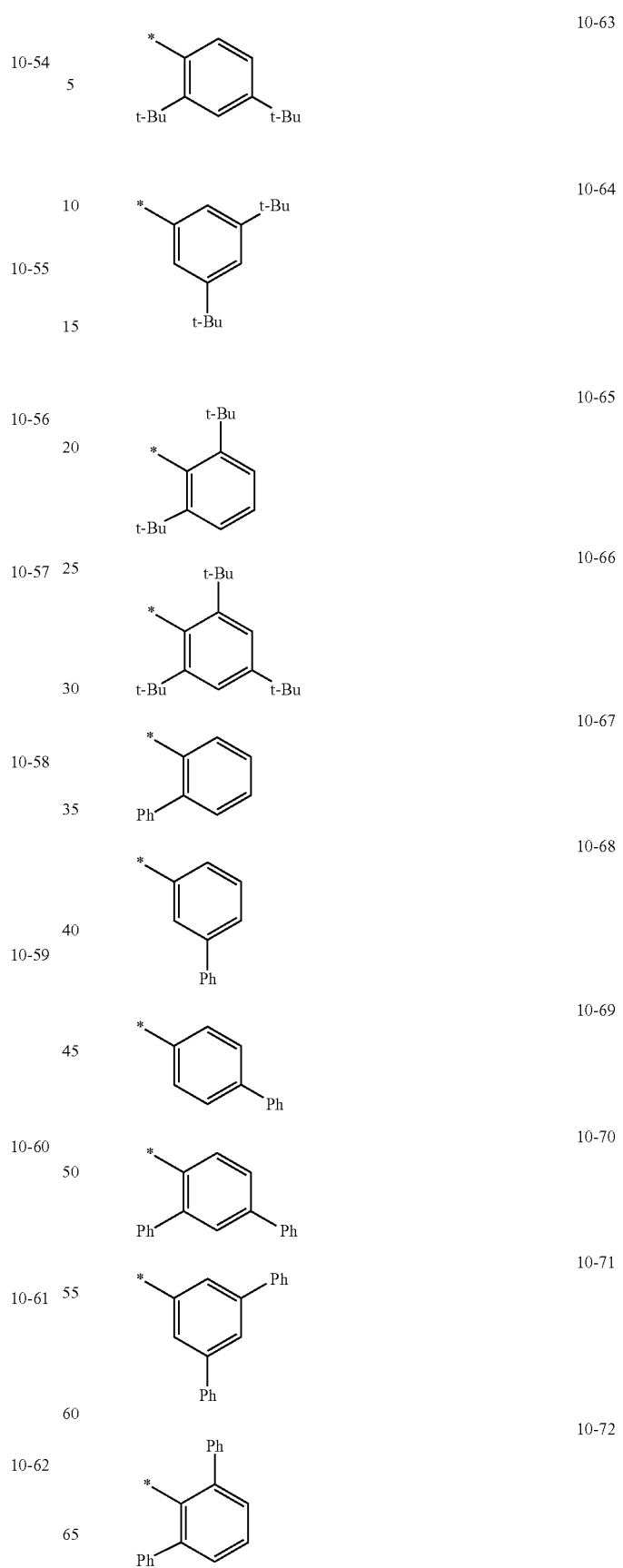

-continued
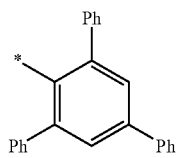 10-73
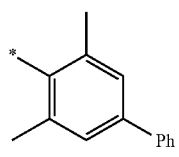 10-74
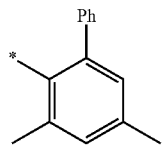 10-75
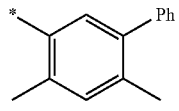 10-76
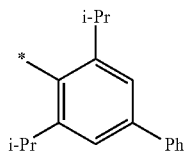 10-77
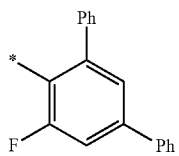 10-78
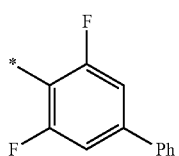 10-79
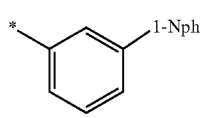 10-80
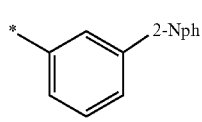 10-81
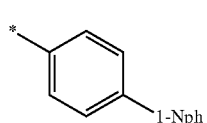 10-82
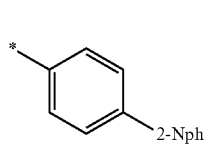 10-83
-continued
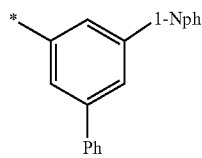 10-84
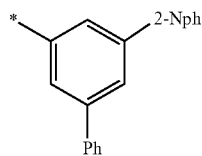 10-85
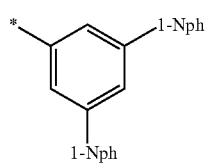 10-86
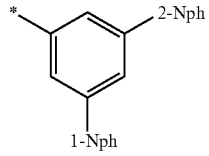 10-87
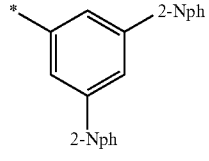 10-88
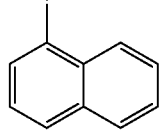 10-89
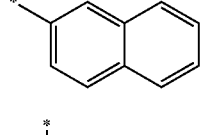 10-90
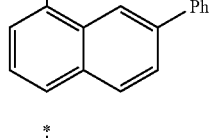 10-91
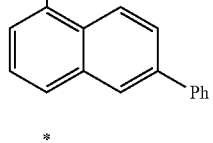 10-92
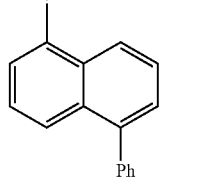 10-93

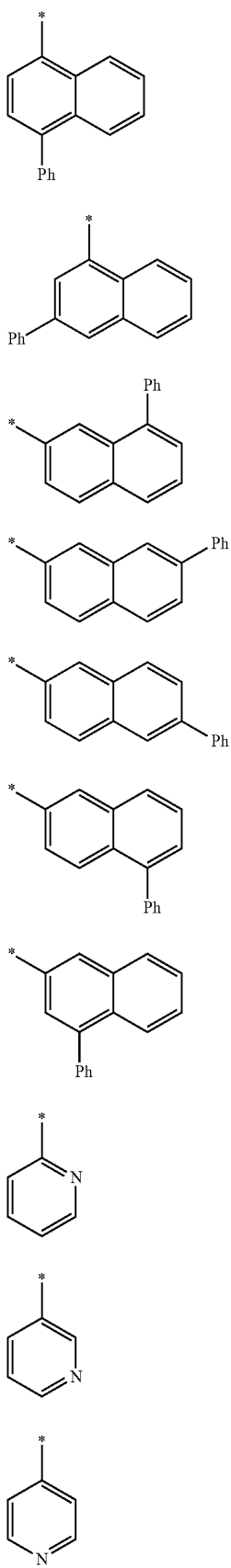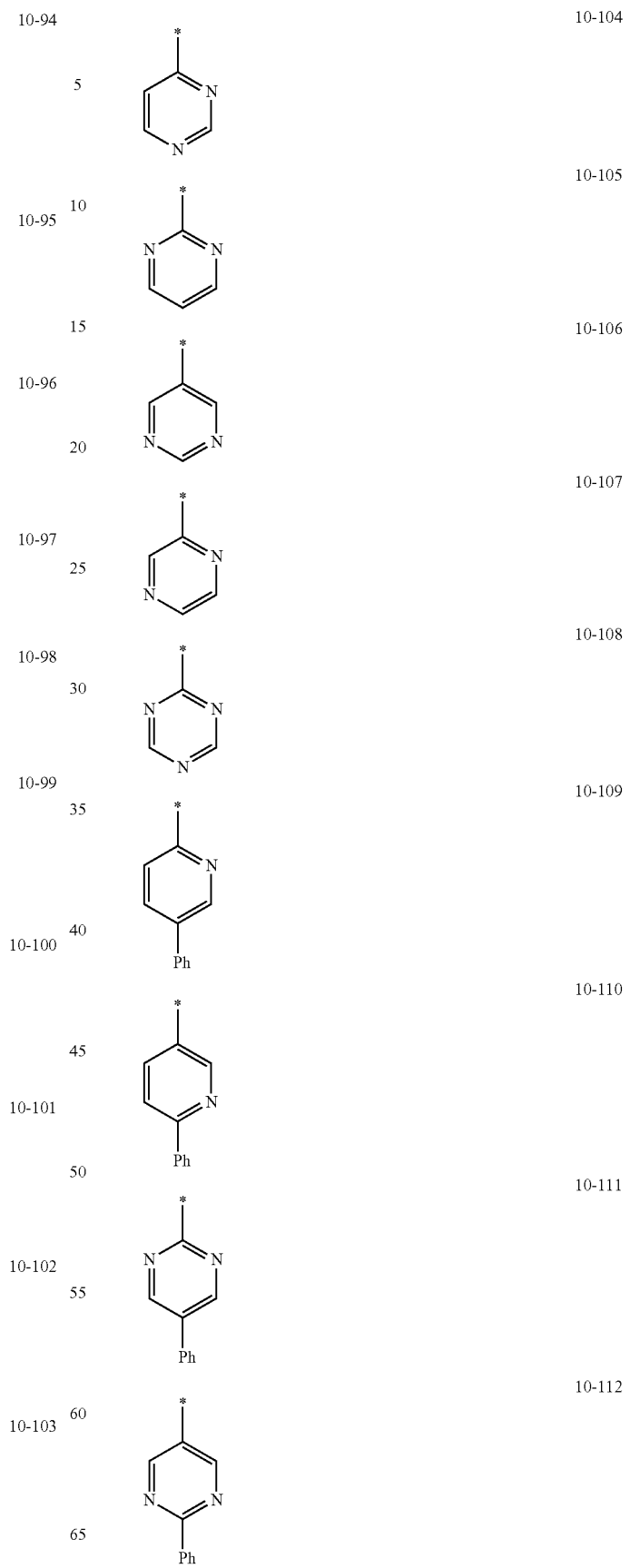

-continued
10-113 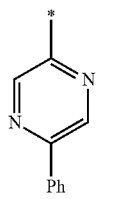
10-114 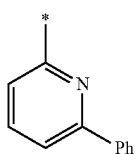
10-115 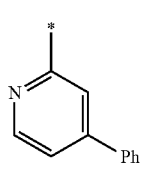
10-116 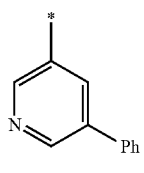
10-117 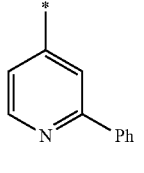
10-118 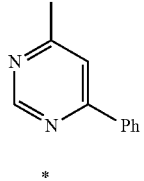
10-119 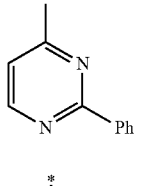
10-120 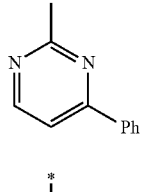
10-121 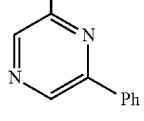
-continued
10-122 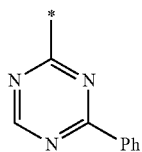
10-123 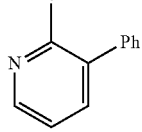
10-124 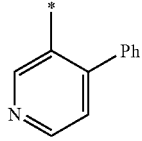
10-125 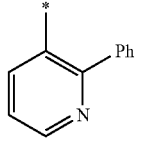
10-126 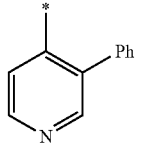
10-127 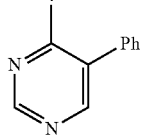
10-128 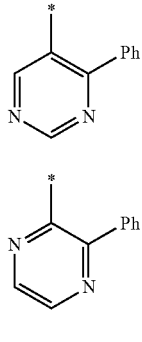
10-129 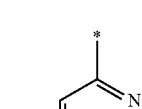
10-130 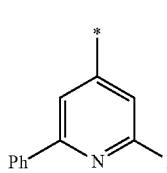
10-131

-continued
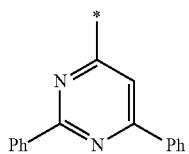
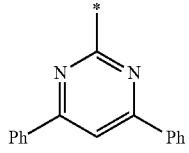
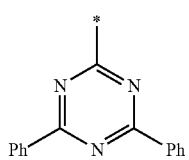
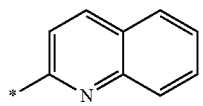
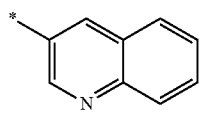
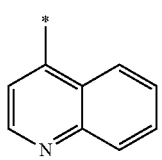
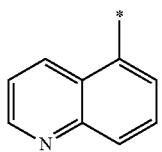
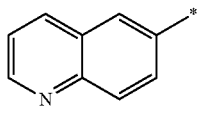
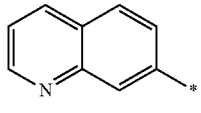
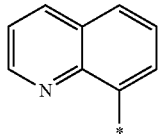
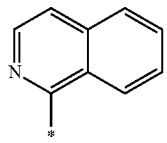
-continued
10-132
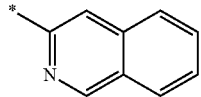
10-133
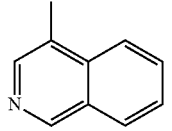
10-134
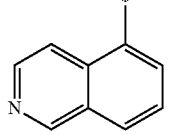
10-135
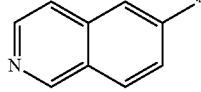
10-136
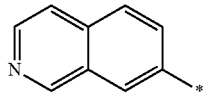
10-137
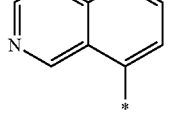
10-138
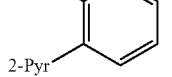
10-139
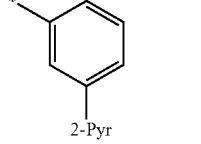
10-140
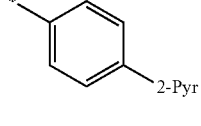
10-141
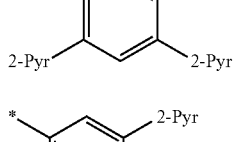
10-142
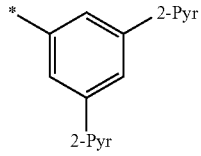
10-143
10-144
10-145
10-456
10-457
10-148
10-149
10-150
10-151
10-152
10-153

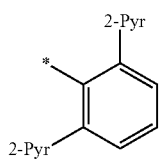
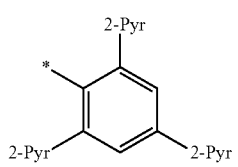
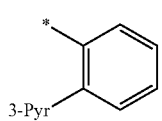
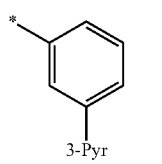
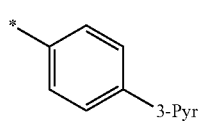
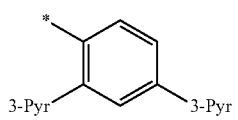
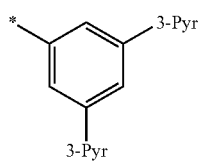
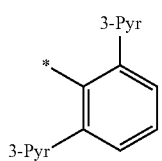
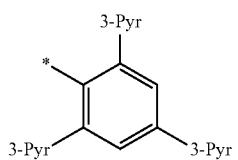
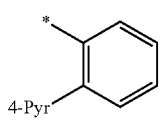
10-154
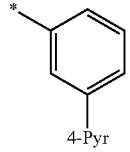
10-155
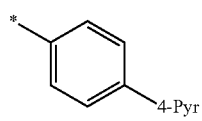
10-156
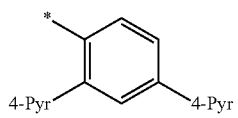
10-157
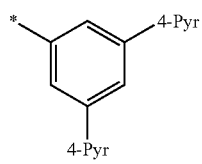
10-158
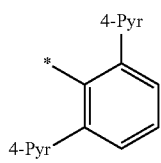
10-159
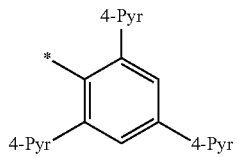
10-160
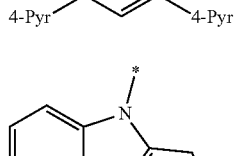
10-161
10-162
10-163
10-164
10-165
10-166
10-167
10-168
10-169
10-170
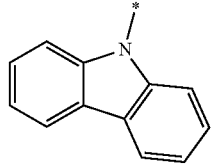
10-171
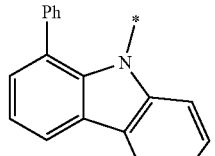
10-172
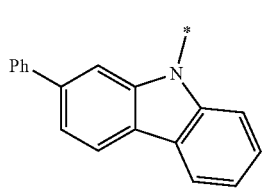

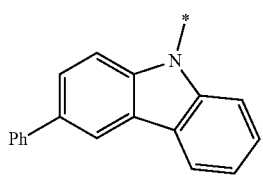
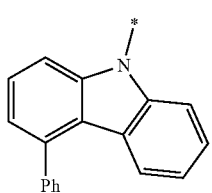
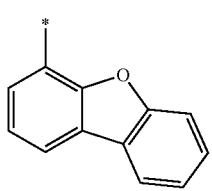
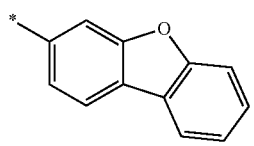
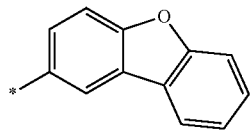
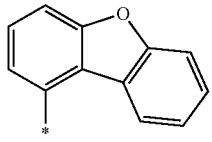
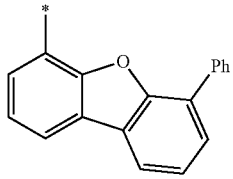
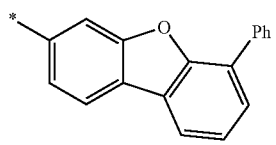
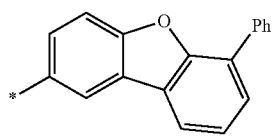
10-173
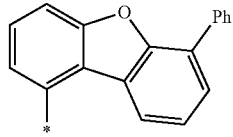
10-174
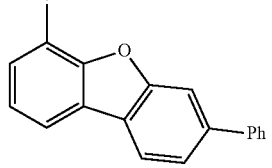
10-175
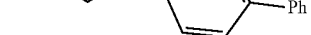
10-176
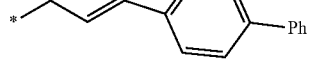
10-177
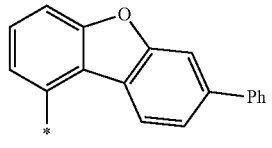
10-178
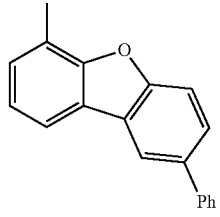
10-179
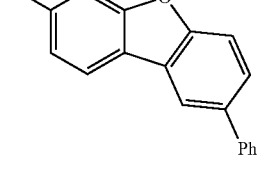
10-180
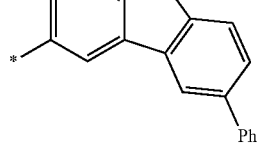
10-181
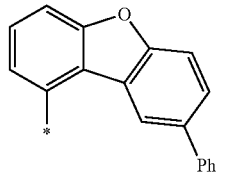
10-182
10-183
10-184
10-185
10-186
10-187
10-188
10-189
10-190

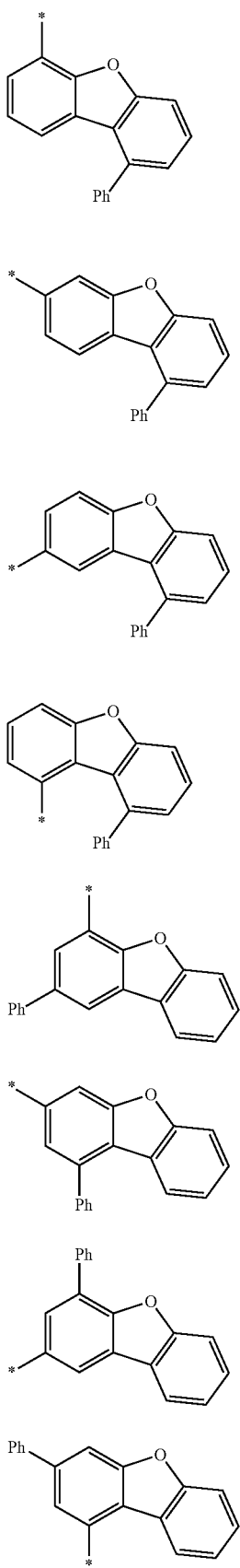
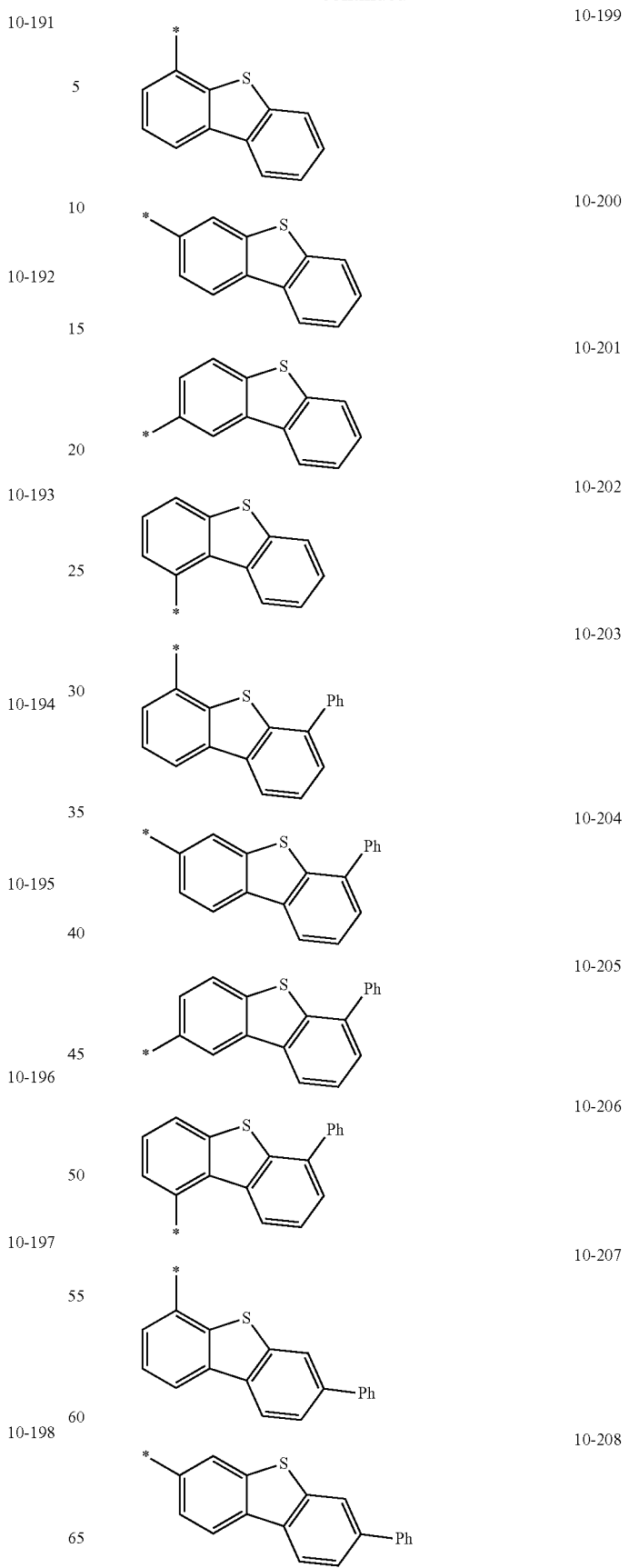

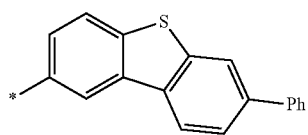
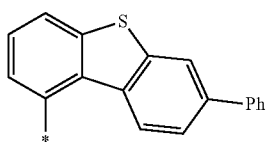
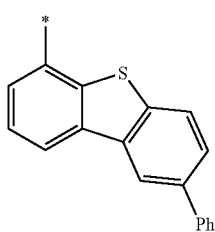
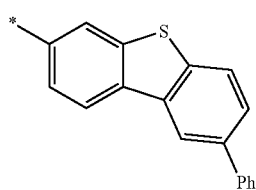
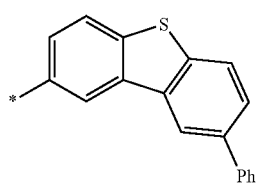
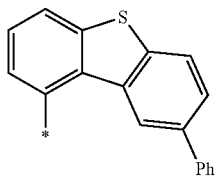
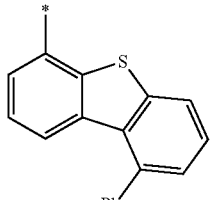
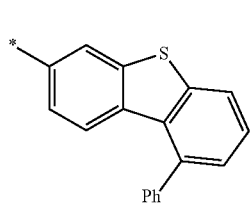
10-209
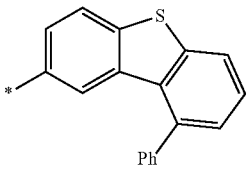
10-210
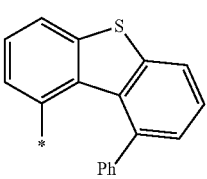
10-211
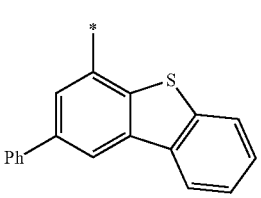
10-212
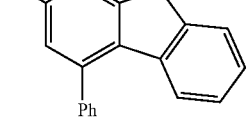
10-213
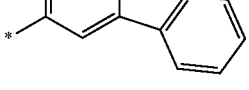
10-214
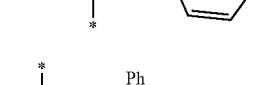
10-215
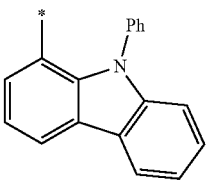
10-216
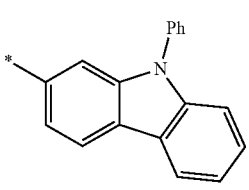
10-217
10-218
10-219
10-220
10-221
10-222
10-223
10-224
10-225
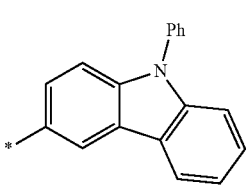

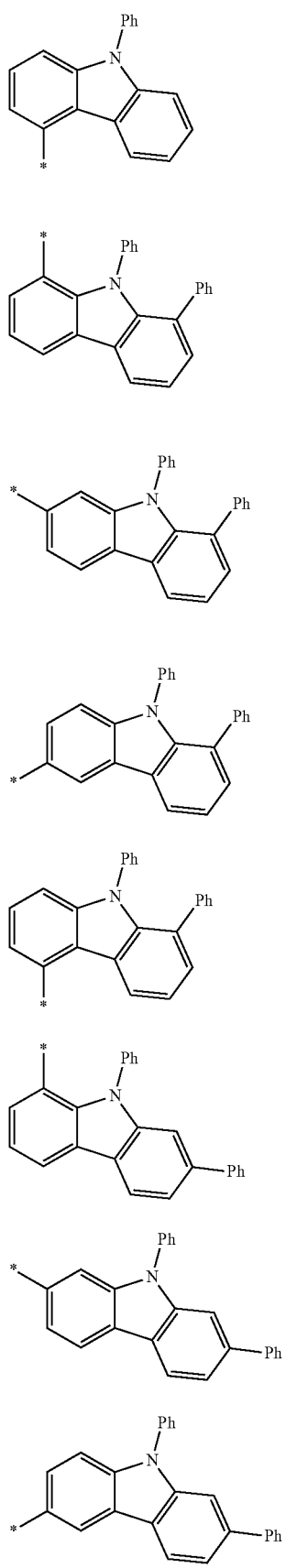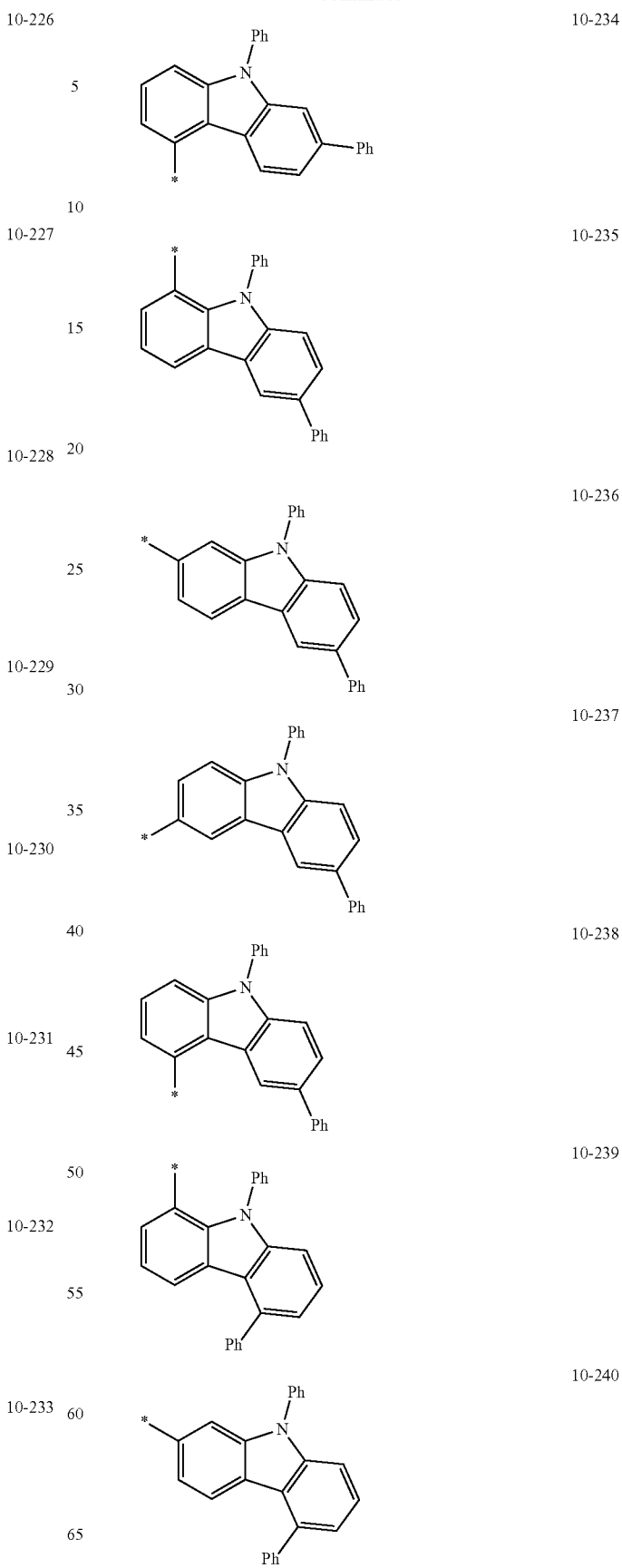

-continued 10-241
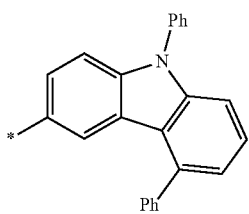

10-242
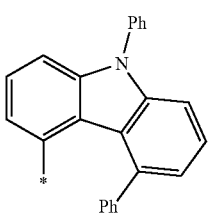

10-243
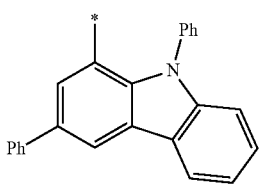

10-244
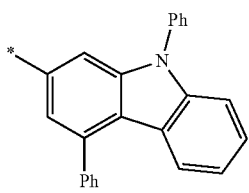

10-245
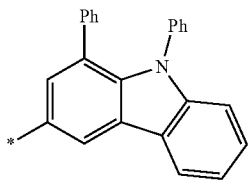

10-246
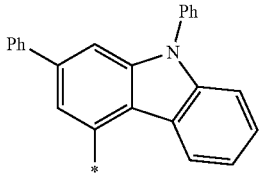

$Q_1$ to $Q_9$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a C$_1$-C$_{10}$ alkyl group, and a phenyl group.

In Formulae 9-1 to 9-21 and 10-1 to 10-246,
* indicates a binding site to a neighboring atom,
i-Pr indicates an iso-propyl group,
t-Bu indicates a t-butyl group,
Ph indicates a phenyl group,
1-Nph indicates a 1-naphthyl group,
2-Nph indicates a 2-naphthyl group,
2-Pyr indicates a 2-pyridyl group,
3-Pyr indicates a 3-pyridyl group,
4-Pyr indicates a 4-pyridyl group, and
TMS indicates a trimethylsilyl group.

In an embodiment, in Formula 1A, $R_1$, $R_2$, and $R_{11}$ may each independently be selected from hydrogen, deuterium, —F, a cyano group, a nitro group, —SF$_5$, —CH$_3$, —CF$_3$, groups represented by Formulae 9-1 to 9-13, and groups represented by Formulae 10-17 to 10-79, but embodiments of the present disclosure are not limited thereto:

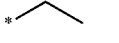
9-1

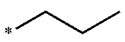
9-2

9-3

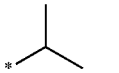
9-4

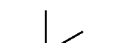
9-5

9-6

9-7

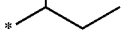
9-8

9-9

9-10

9-11

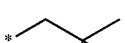
9-12

9-13

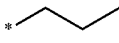
10-17

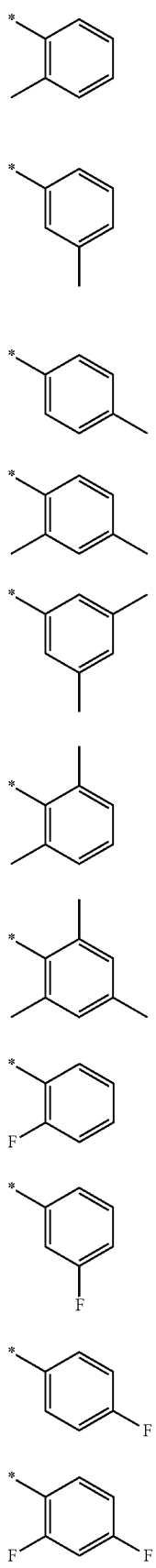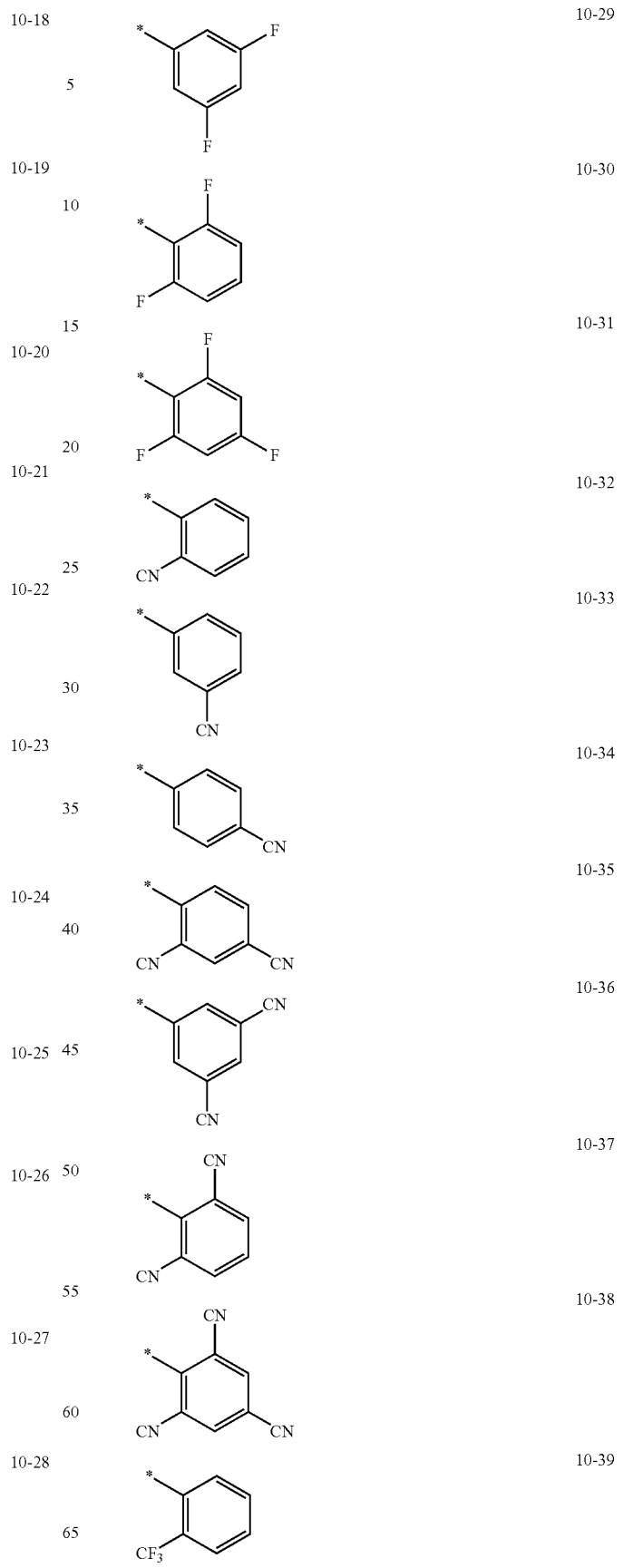

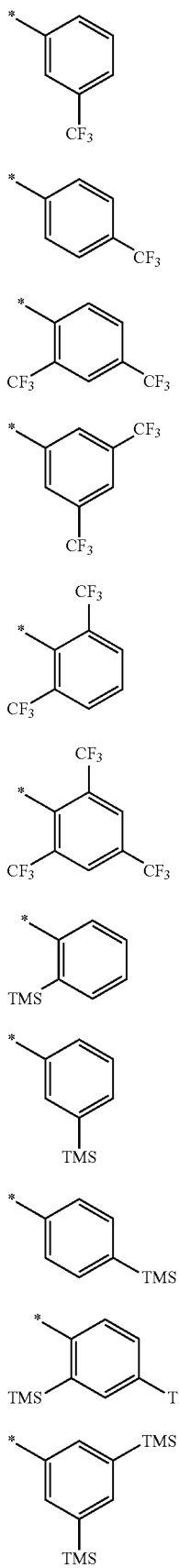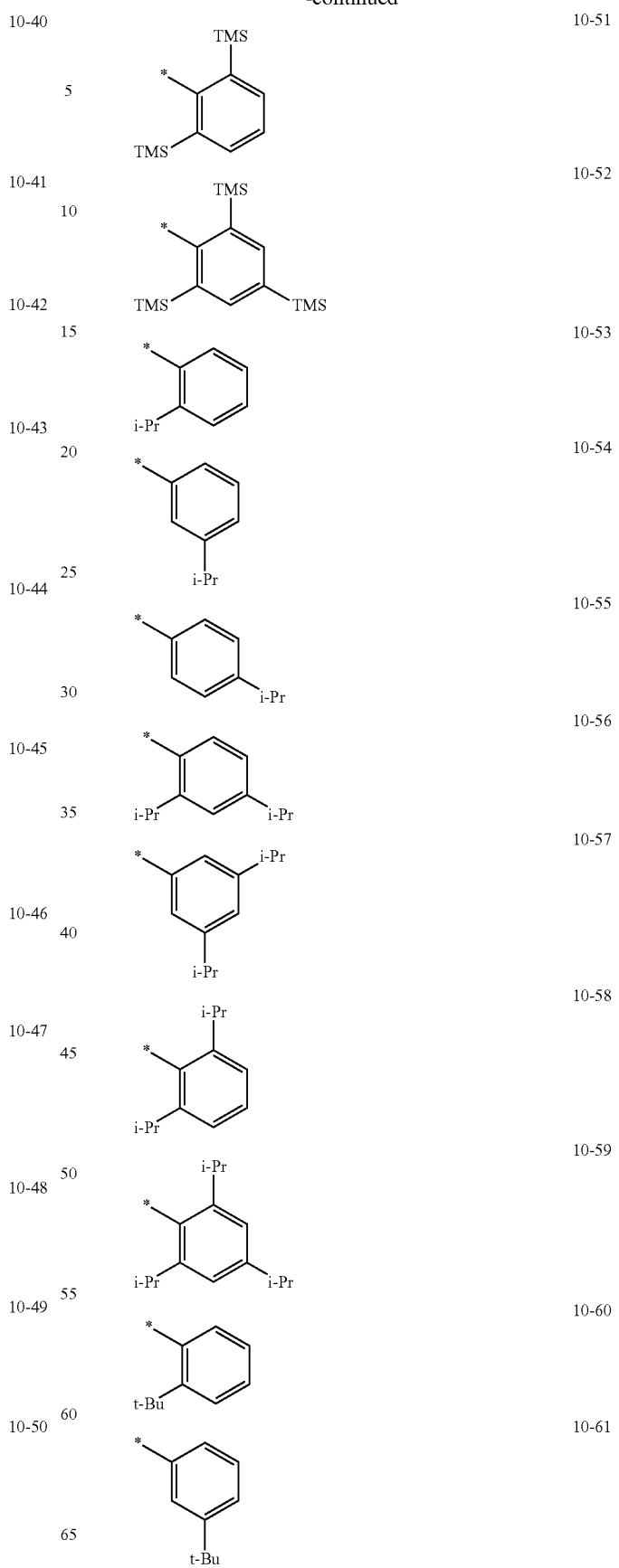

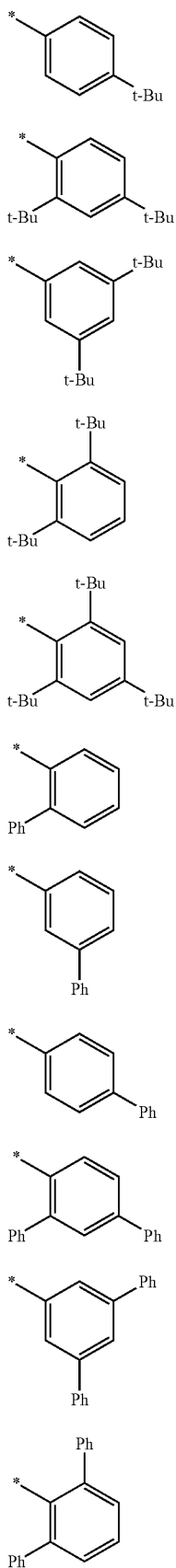

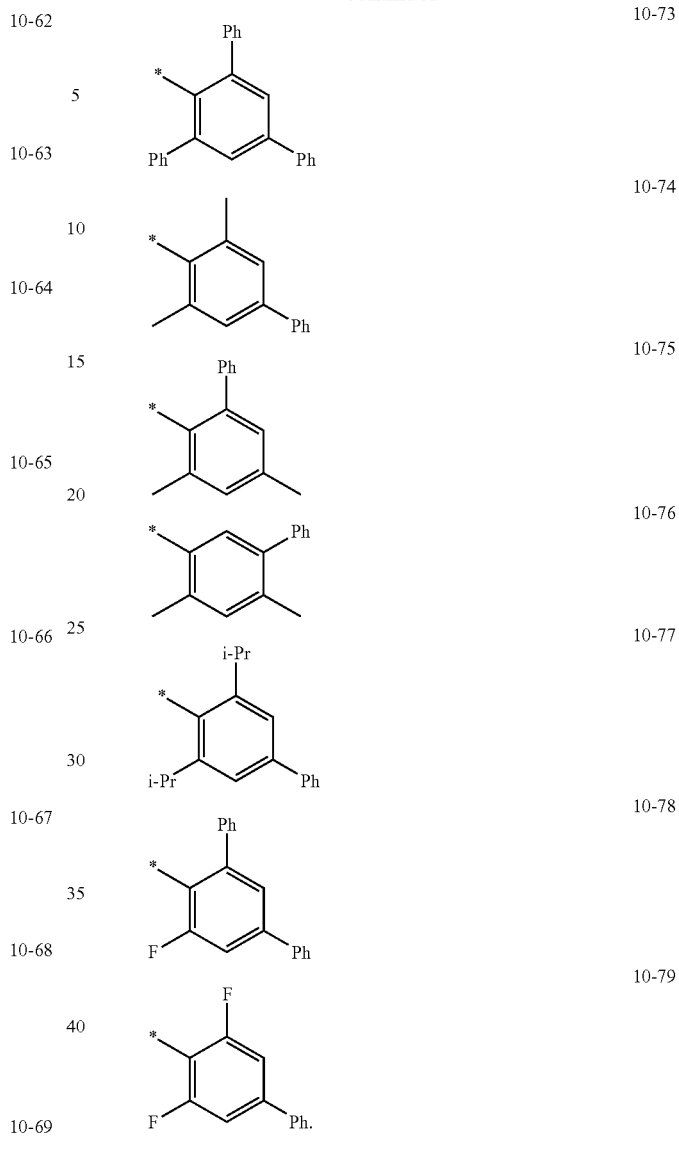

In Formulae 9-1 to 9-13 and 10-17 to 10-79,

* indicates a binding site to a neighboring atom, i-Pr indicates an iso-propyl group, and t-Bu indicates a t-butyl group, Ph indicates a phenyl group, and TMS indicates a trimethylsilyl group.

In an embodiment, in Formula 1A, at least one selected from $R_1$, $R_2$, and $R_{11}$ may be selected from deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), but embodiments of the present disclosure are not limited thereto.

In Formula 1A, two, three, or four selected from a plurality of neighboring $R_1$, $R_2$, and $R_{11}$ may optionally be linked to form a four-coordinate, six-coordinate, or eight-coordinate ligand.

For example, in Formula 1A-1, two neighboring groups $R_{12a}$ may optionally be linked to form a tetradentate ligand, but embodiments of the present disclosure are not limited thereto.

In an embodiment, in Formula 1A-1, two neighboring groups $R_{13a}$ may optionally be linked to form a tetradentate ligand, but embodiments of the present disclosure are not limited thereto.

In an embodiment, in Formula 1A-1, two neighboring groups $R_{14a}$ may optionally be linked to form a tetradentate ligand, but embodiments of the present disclosure are not limited thereto.

In an embodiment, in Formula 1A-1, two neighboring groups $R_{15a}$ may optionally be linked to form a tetradentate ligand, but embodiments of the present disclosure are not limited thereto.

In an embodiment, in Formula 1A-2, two neighboring groups $R_{16a}$ may optionally be linked to form a tetradentate ligand, but embodiments of the present disclosure are not limited thereto.

In an embodiment, in Formula 1A-2, two neighboring groups $R_{17a}$ may optionally be linked to form a tetradentate ligand, but embodiments of the present disclosure are not limited thereto.

In an embodiment, in Formula 1A-2, two neighboring groups $R_{18a}$ may optionally be linked to form a tetradentate ligand, but embodiments of the present disclosure are not limited thereto.

In an embodiment, in Formula 1A-2, two neighboring groups $R_{19a}$ may optionally be linked to form a tetradentate ligand, but embodiments of the present disclosure are not limited thereto.

For example, in Formula 1A-1, three neighboring groups $R_{12a}$ may optionally be linked to form a tetradentate ligand, but embodiments of the present disclosure are not limited thereto.

In an embodiment, in Formula 1A-1, three neighboring groups $R_{13a}$ may optionally be linked to form a tetradentate ligand, but embodiments of the present disclosure are not limited thereto.

In an embodiment, in Formula 1A-1, three neighboring groups $R_{14a}$ may optionally be linked to form a tetradentate ligand, but embodiments of the present disclosure are not limited thereto.

In an embodiment, in Formula 1A-1, three neighboring groups $R_{15a}$ may optionally be linked to form a tetradentate ligand, but embodiments of the present disclosure are not limited thereto.

In an embodiment, in Formula 1A-2, three neighboring groups $R_{16a}$ may optionally be linked to form a tetradentate ligand, but embodiments of the present disclosure are not limited thereto.

In an embodiment, in Formula 1A-2, three neighboring groups $R_{17a}$ may optionally be linked to form a tetradentate ligand, but embodiments of the present disclosure are not limited thereto.

In an embodiment, in Formula 1A-2, three neighboring groups $R_{18a}$ may optionally be linked to form a tetradentate ligand, but embodiments of the present disclosure are not limited thereto.

In an embodiment, in Formula 1A-2, three neighboring groups $R_{19a}$ may optionally be linked to form a tetradentate ligand, but embodiments of the present disclosure are not limited thereto.

In Formula 1, n11 may be selected from 1, 2, 3, and 4, wherein, when n11 is 2 or more, 2 or more groups $L_{11}$ are the same or different from each other.

For example, In Formula 1, n11 may be selected from 1, 2 and 3, but embodiments of the present disclosure are not limited thereto.

In Formula 1, $L_{12}$ may be selected from a one-coordinate ligand, a two-coordinate ligand, and a three-coordinate ligand.

For example, in Formula 1, $L_{12}$ may be selected from one-coordinate ligands, for example, $I^-$, $Br^-$, $Cl^-$, sulfide, nitrate, azide, hydroxide, cyanate, isocyanate, thiocyanate, water, acetonitrile, pyridine, ammonia, carbon monoxide, $P(Ph)_3$, $P(Ph)_2CH_3$, $PPh(CH_3)_2$, and $P(CH_3)_3$, but embodiments of the present disclosure are not limited thereto.

In an embodiment, in Formula 1, $L_{12}$ may be selected from two-coordinate ligands, for example, oxalate, acetylacetonate, picolinic acid, 1,2-bis(diphenylphosphino)ethane, 1,1-bis(diphenylphosphino)methane, glycinate, and ethylenediamine, but embodiments of the present disclosure are not limited thereto.

In an embodiment, in Formula 1, $L_{12}$ may be a ligand represented by one selected from Formulae 7-1 to 7-11, but embodiments of the present disclosure are not limited thereto:

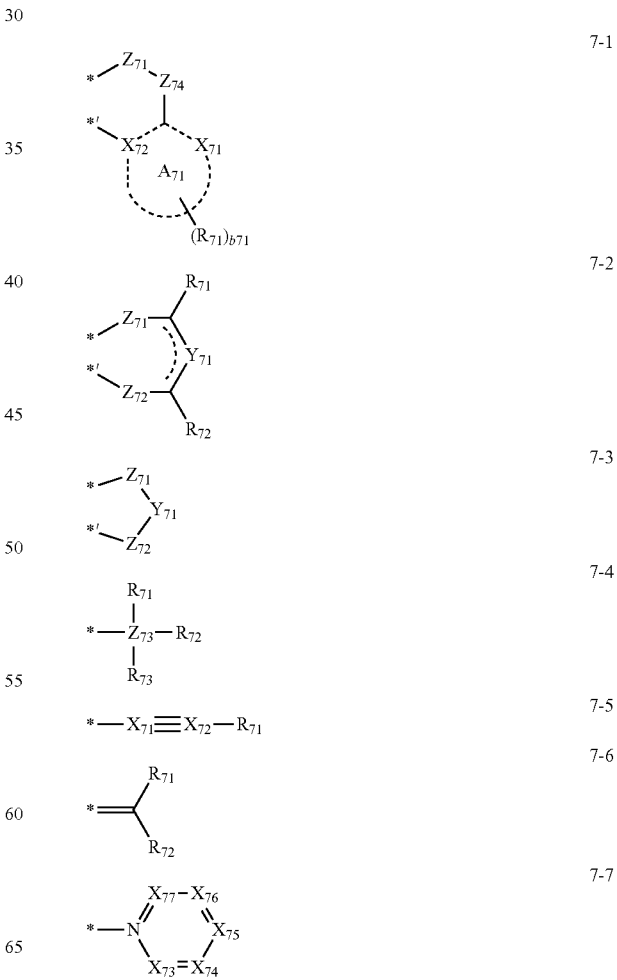

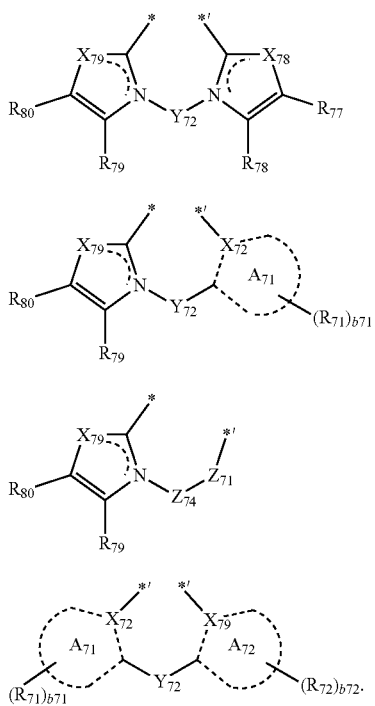

In Formulae 7-1 to 7-11, $A_{71}$ and $A_{72}$ may each independently be selected from a $C_5$-$C_{20}$ carbocyclic group and a $C_1$-$C_{20}$ heterocyclic group, $X_{71}$ and $X_{72}$ may each independently be selected from C and N, $X_{73}$ may be N or $C(Q_{73})$; $X_{74}$ may be N or $C(Q_{74})$; $X_{75}$ may be N or $C(Q_{75})$; $X_{76}$ may be N or $C(Q_{76})$; and $X7_{27}$ may be N or $C(Q_{77})$, $X_{78}$ may be O, S, or $N(Q_{78})$; and $X_{79}$ may be O, S, or $N(Q_{79})$, $Y_{71}$ and $Y_{72}$ may each independently be selected from a single bond, a double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group, $Z_{71}$ and $Z_{72}$ may each independently be selected from N, O, $N(R_{75})$, $P(R_{75})(R_{76})$, and $As(R_{75})(R_{76})$, $Z_{73}$ may be selected from P and As, $Z_{74}$ may be selected from CO and $CH_2$, $R_{71}$ to $R_{80}$ and $Q_{73}$ to $Q_{79}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group; $R_{71}$ and $R_{72}$ may optionally be linked to each other to form a ring; $R_{77}$ and $R_{78}$ may optionally be linked to each other to form a ring; $R_{78}$ and $R_{79}$ may optionally be linked to each other to form a ring; and $R_{79}$ and $R_{80}$ may optionally be linked to each other to form a ring, b71 and b72 may each independently be selected from 1, 2, and 3, and

* and *' each indicate a binding site to a neighboring atom.

For example, in Formula 7-1, $A_{71}$ may be selected from a benzene group, a naphthalene group, an imidazole group, a benzimidazole group, a pyridine group, a pyrimidine group, a triazine group, a quinoline group, and an isoquinoline group, but embodiments of the present disclosure are not limited thereto.

For example, in Formula 7-1, $X_{71}$ and $X_{72}$ may each independently be N, but embodiments of the present disclosure are not limited thereto.

For example, in Formula 7-7, $X_{73}$ may be $C(Q_{73})$, $X_{74}$ may be $C(Q_{74})$, $X_{75}$ may be $C(Q_{75})$, $X_{76}$ may be $C(Q_{76})$, and $X_{77}$ may be $C(Q_{77})$, but embodiments of the present disclosure are not limited thereto.

For example, in Formula 7-8, $X_{78}$ may be $N(Q_{78})$, and $X_{79}$ may be $N(Q_{79})$, but embodiments of the present disclosure are not limited thereto.

For example, in Formulae 7-2, 7-3, and 7-8, $Y_{71}$ and $Y_{72}$ may each independently be selected from a substituted or unsubstituted methylene group and a substituted or unsubstituted phenylene group, but embodiments of the present disclosure are not limited thereto.

For example, in Formulae 7-1 and 7-2, $Z_{71}$ and $Z_{72}$ may each independently be O, but embodiments of the present disclosure are not limited thereto.

For example, in Formula 7-4, $Z_{73}$ may be P, but embodiments of the present disclosure are not limited thereto.

For example, in Formulae 7-1 to 7-11, $R_{71}$ to $R_{80}$ and $Q_{73}$ to $Q_{79}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a pyridinyl group, and a pyrimidinyl group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group; and a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a C$_1$-C$_{20}$ alkoxy group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and an imidazopyridinyl group, but embodiments of the present disclosure are not limited thereto.

In one or more embodiments, in Formula 1, $L_{12}$ may be a ligand represented by one selected from Formulae 5-1 to 5-116 and Formulae 8-1 to 8-43, but embodiments of the present disclosure are not limited thereto:

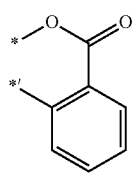
8-1

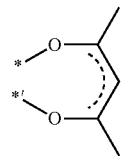
8-2

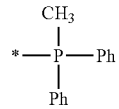
8-3

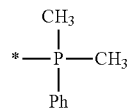
8-4

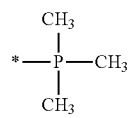
8-5

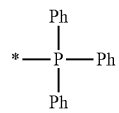
8-6

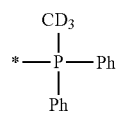
8-7

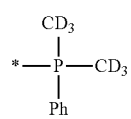
8-8

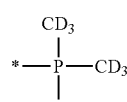
8-9

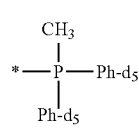
8-10

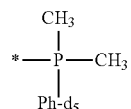
8-11

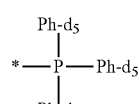
8-12

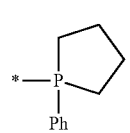
8-13

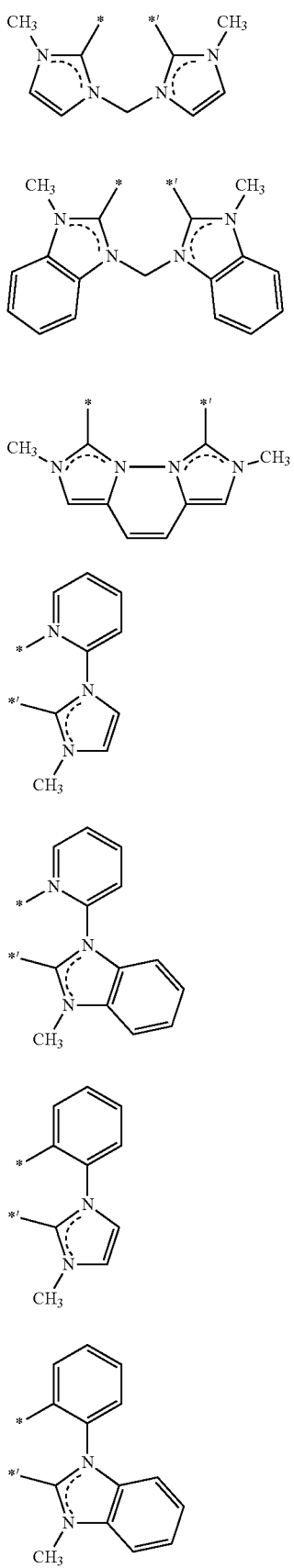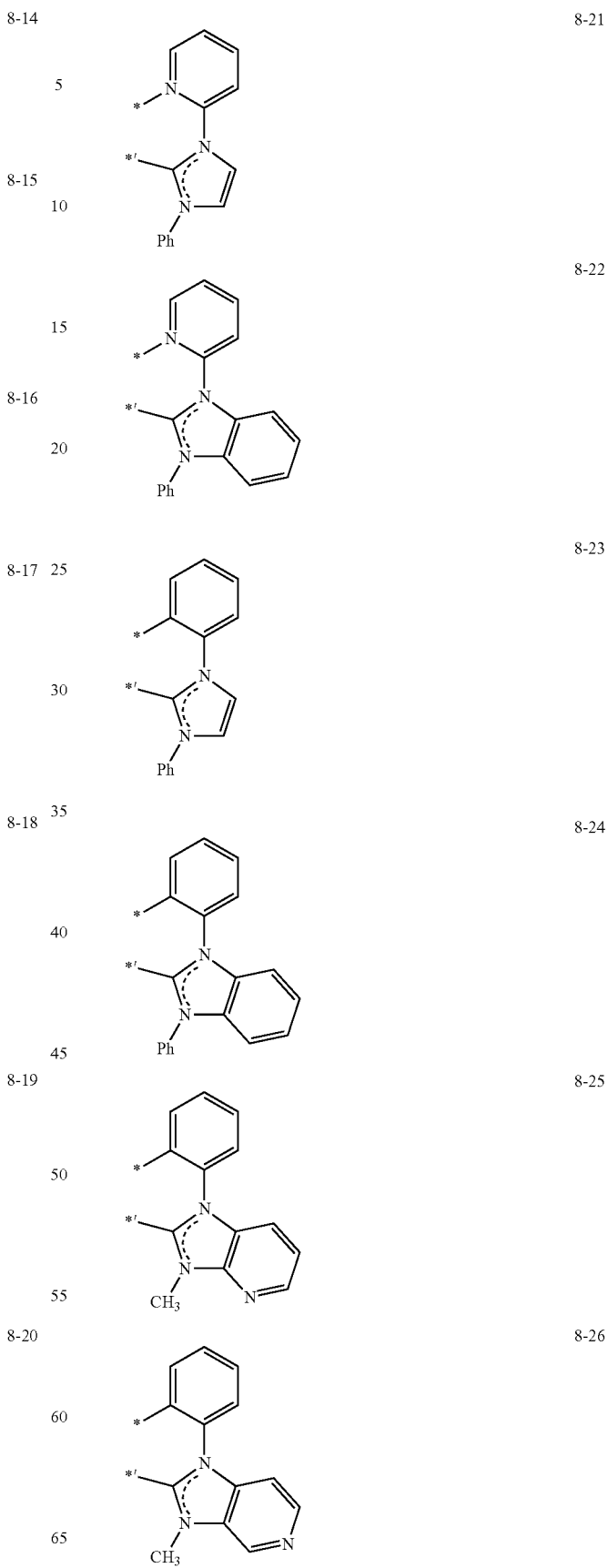

8-27 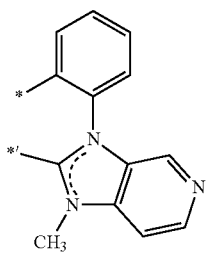
8-28 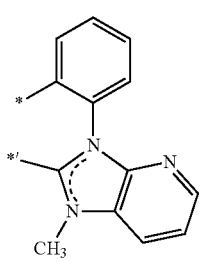
8-29 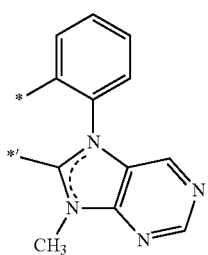
8-30 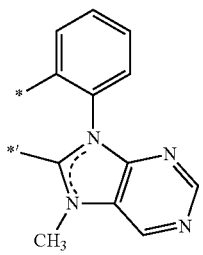
8-31 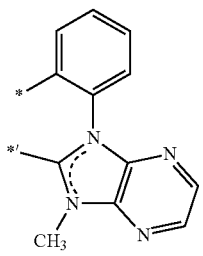
8-32 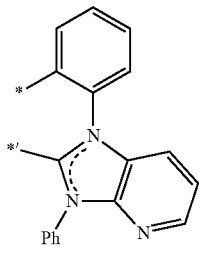
8-33 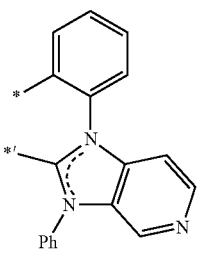
8-34 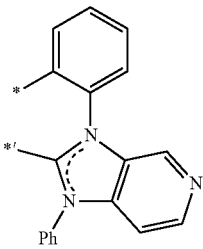
8-35 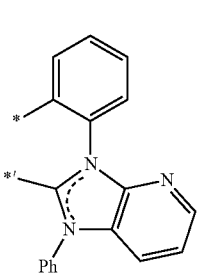
8-36 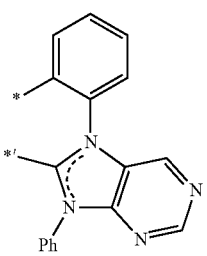
8-37 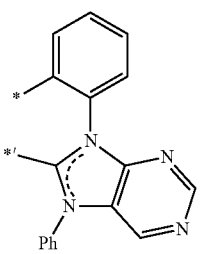
8-38 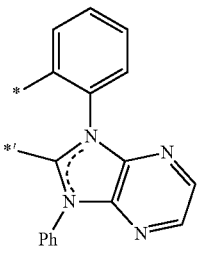

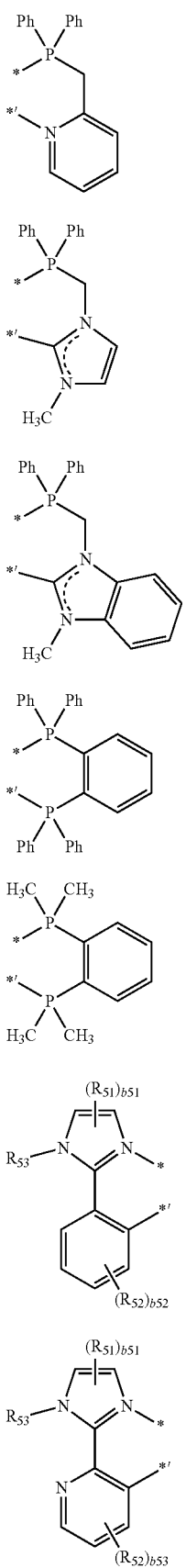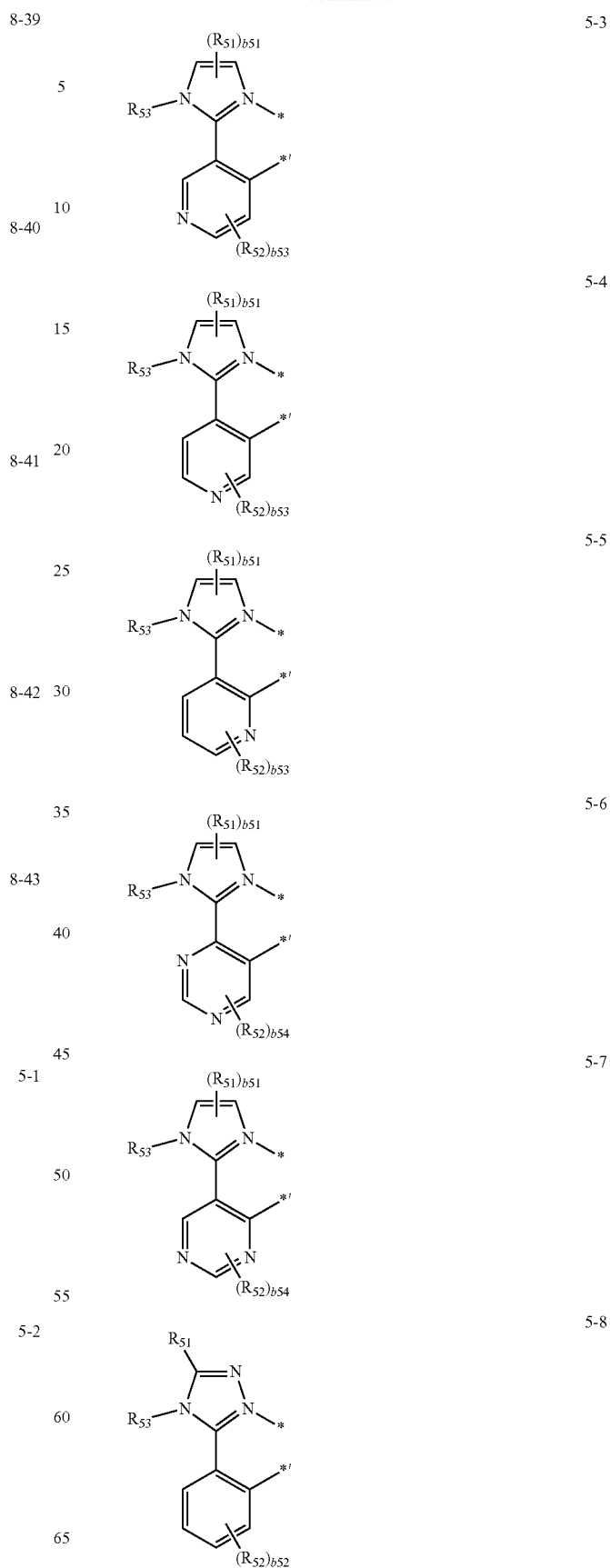

5-9 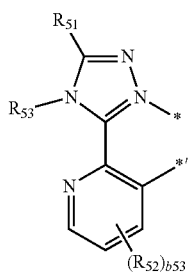
5-10 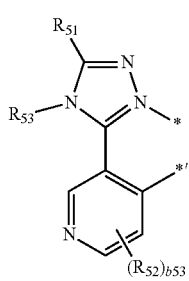
5-11 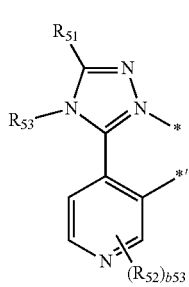
5-12 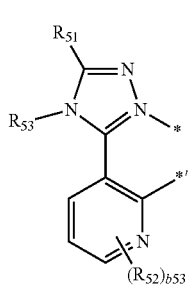
5-13 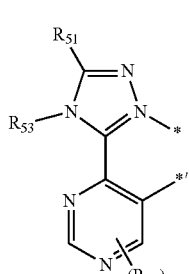
5-14 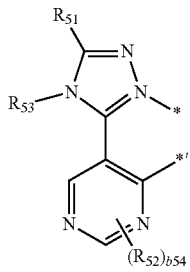
5-15 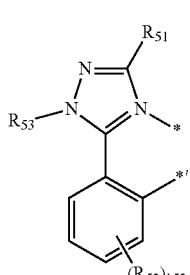
5-16 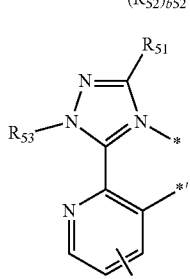
5-17 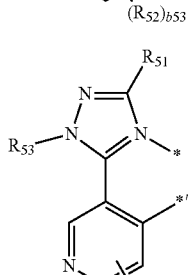
5-18 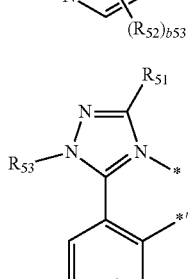
5-19 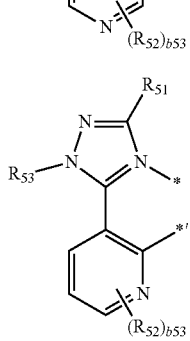

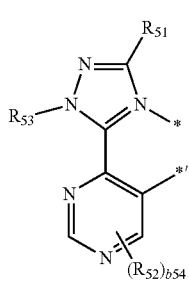
5-20
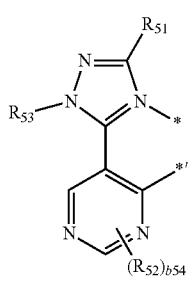
5-21
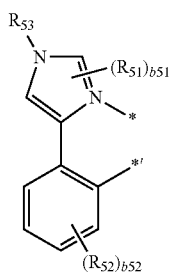
5-22
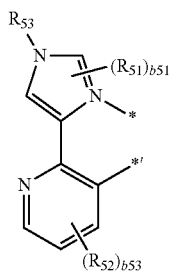
5-23
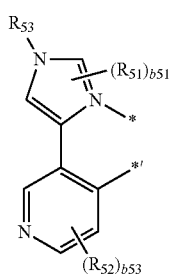
5-24
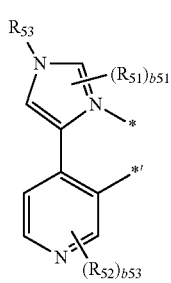
5-25
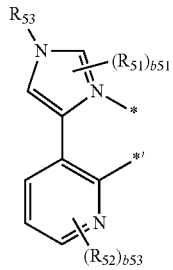
5-26
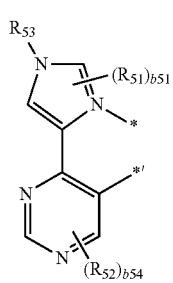
5-27
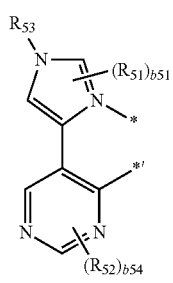
5-28
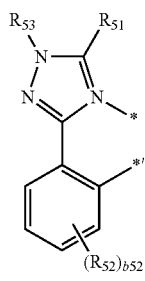
5-29
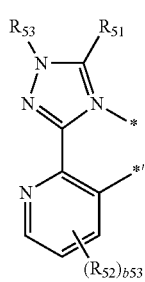
5-30

-continued
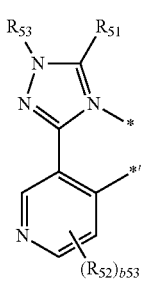
5-31
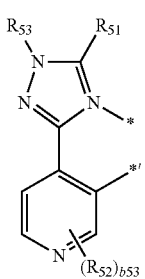
5-32
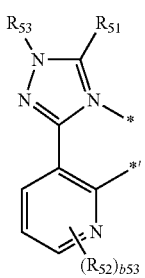
5-33
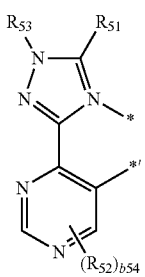
5-34
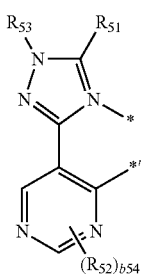
5-35
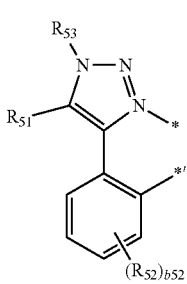
5-36
-continued
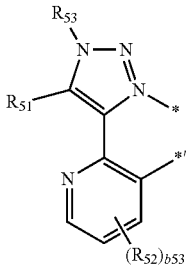
5-37
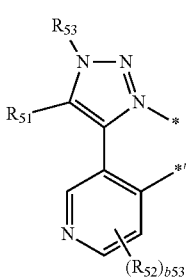
5-38
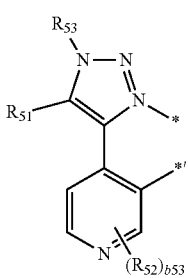
5-39
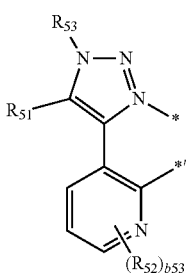
5-40
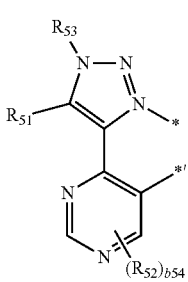
5-41
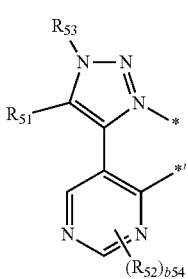
5-42

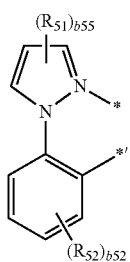
5-43
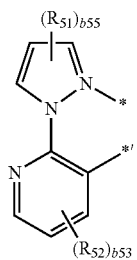
5-44
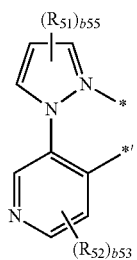
5-45
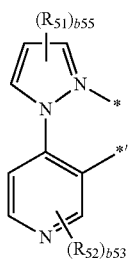
5-46
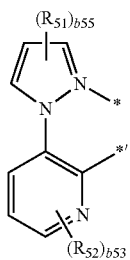
5-47
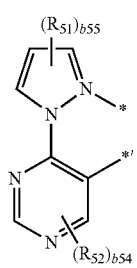
5-48
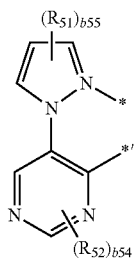
5-49
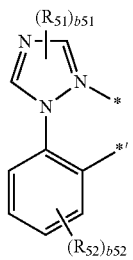
5-50
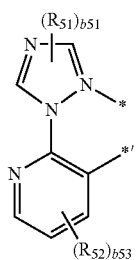
5-51
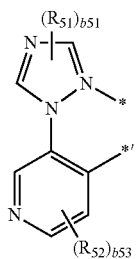
5-52
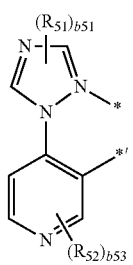
5-53
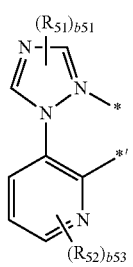
5-54

-continued
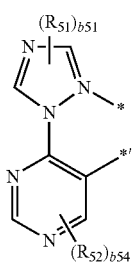
5-55
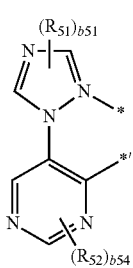
5-56
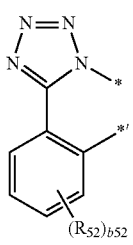
5-57
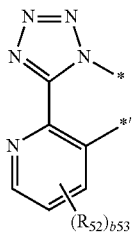
5-58
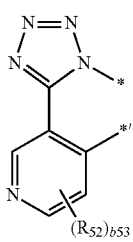
5-59
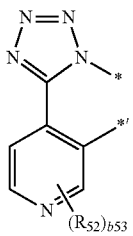
5-60
-continued
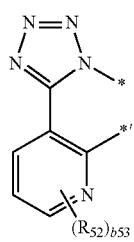
5-61
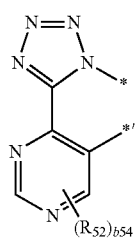
5-62
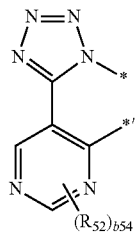
5-63
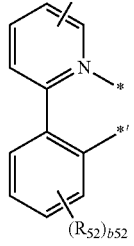
5-64
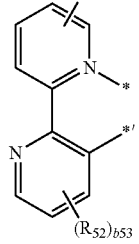
5-65
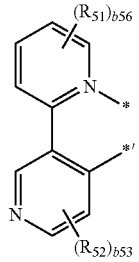
5-66

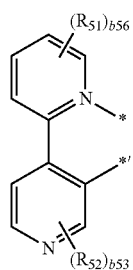
5-67
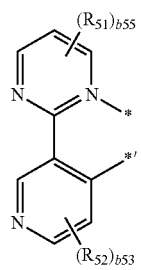
5-73
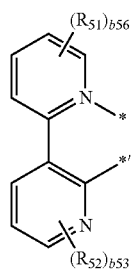
5-68
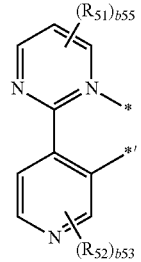
5-74
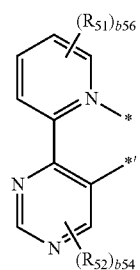
5-69
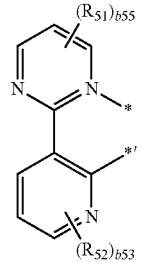
5-75
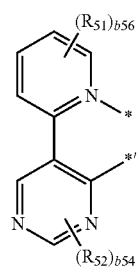
5-70
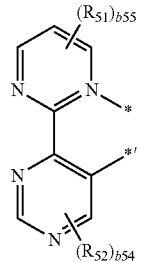
5-76
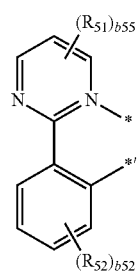
5-71
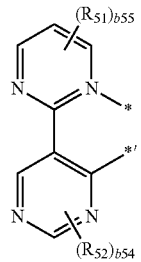
5-77
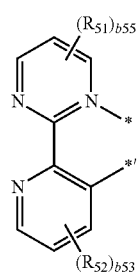
5-72
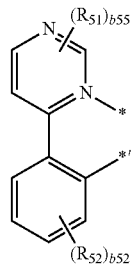
5-78

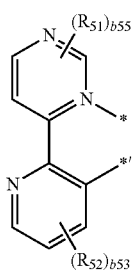# 5-79
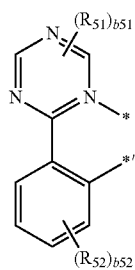# 5-85
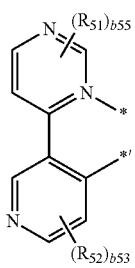# 5-80
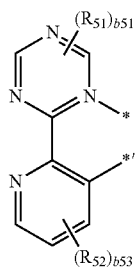# 5-86
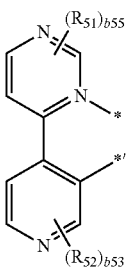# 5-81
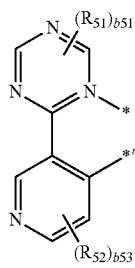# 5-87
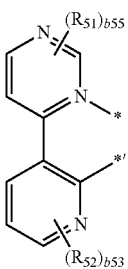# 5-82
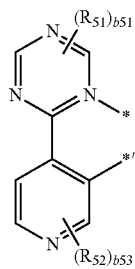# 5-88
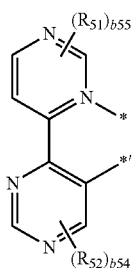# 5-83
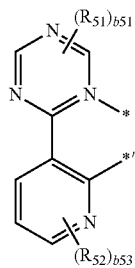# 5-89
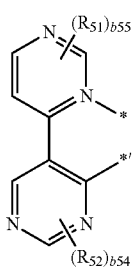# 5-84
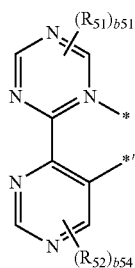# 5-90

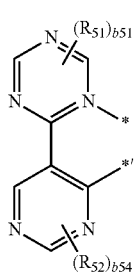
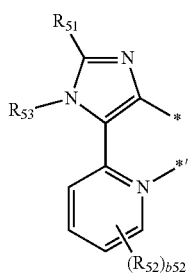
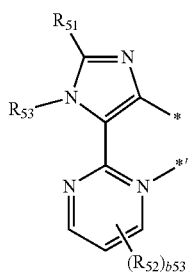
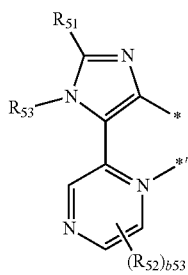
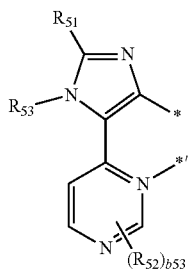
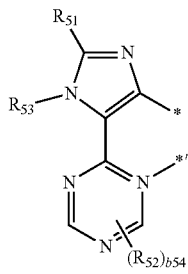
5-91
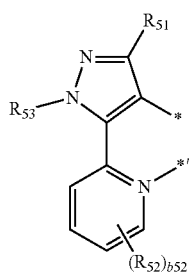
5-92
5-93
5-94
5-95
5-96
5-97
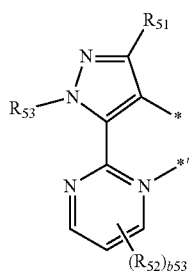
5-98
5-99
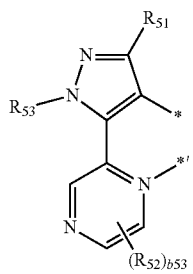
5-100
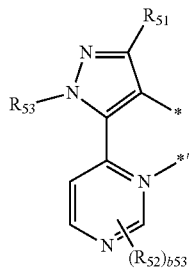
5-101
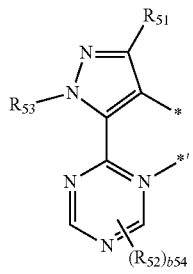

5-102 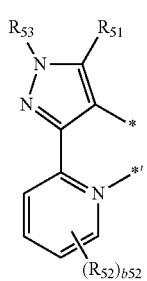
5-103 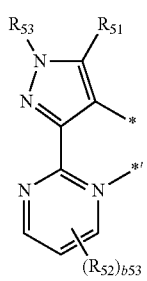
5-104 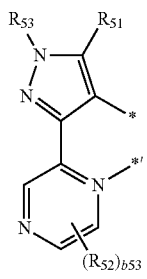
5-105 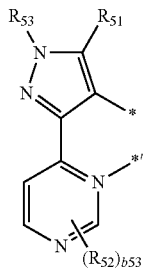
5-106 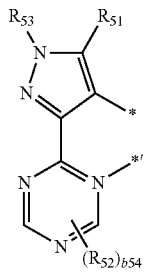
5-107 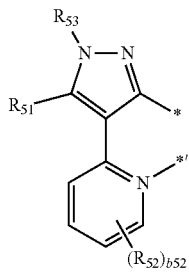
5-108 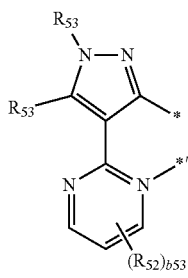
5-109 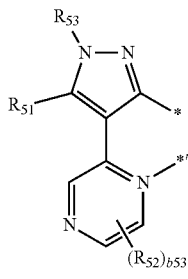
5-110 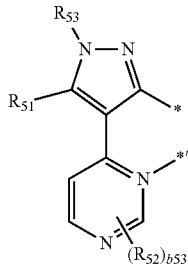
5-111 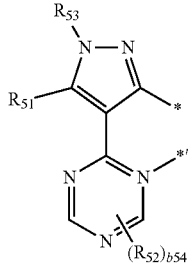
5-112 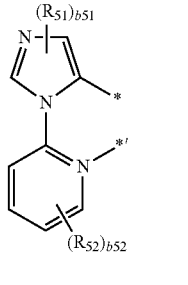
5-113 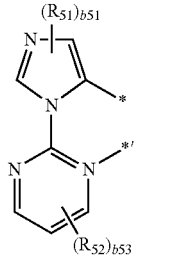

-continued 5-114
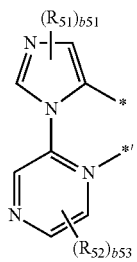

5-115
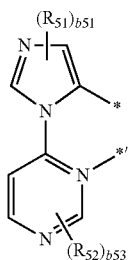

5-116
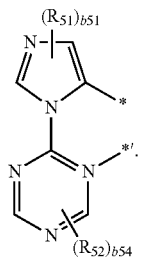

In Formulae 5-1 to 5-116 and 8-1 to 8-43, $R_{51}$ to $R_{53}$ may each independently be selected from:

hydrogen, —F, a cyano group, a nitro group, a methyl group, an ethyl group, a propyl group, an n-butyl group, an iso-butyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decanyl group, an isodecanyl group, a sec-decanyl group, a tert-decanyl group, a methoxy group, an ethoxy group, a propoxy group, a butoxy group, a pentoxy group, a phenyl group, a naphthyl group, a pyridinyl group, a pyrimidinyl group, a triazinyl group, a dibenzofuranyl group, and a dibenzothiophenyl group; and a methyl group, an ethyl group, a propyl group, an n-butyl group, an iso-butyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decanyl group, an isodecanyl group, a sec-decanyl group, a tert-decanyl group, a methoxy group, an ethoxy group, a propoxy group, a butoxy group, a pentoxy group, a phenyl group, a naphthyl group, a pyridinyl group, a pyrimidinyl group, a triazinyl group, a dibenzofuranyl group, and a dibenzothiophenyl group, each substituted with at least one selected from —F, a cyano group, and a nitro group, b51 and b54 may each independently be selected from 1 and 2, b53 and b55 may each independently be selected from 1, 2, and 3, b52 may be selected from 1, 2, 3, and 4, Ph indicates a phenyl group, Ph-d5 indicates a phenyl group in which all hydrogen atoms are each independently substituted with deuterium, and

* and *' each independently indicates a binding site to a neighboring atom.

In Formula 1, n12 may be selected from 0, 1, 2, 3, and 4, wherein, when n12 is 2 or more, 2 or more groups $L_{12}$ are the same or different from each other.

For example, in Formula 1, n12 may be selected from 0, 1 and 2, but embodiments of the present disclosure are not limited thereto.

In an embodiment, in Formula 1, $M_{11}$ may be Ir, n11 may be selected from 2 and 3, and n12 may be selected from 0, 1, and 2, but embodiments of the present disclosure are not limited thereto.

In Formula 1, $L_{11}$ and $L_{12}$ may be different from each other.

In the organometallic compound represented by Formula 1, the following compound is excluded:

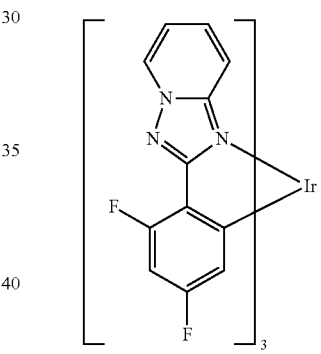

(hereinafter, referred to as Compound A).

In Compound A, since an —F substituent is decomposed at high temperature, stable device lifespan may not be implemented.

In an embodiment, the organometallic compound represented by Formula 1 may be represented by one selected from Formulae 1-1 and 1-2, but embodiments of the present disclosure are not limited thereto:

1-1
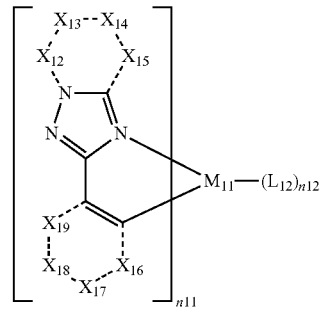

-continued

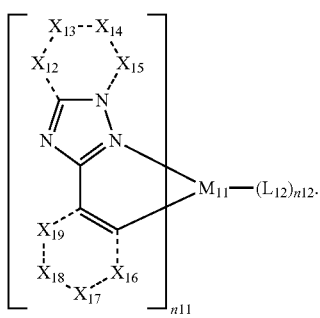

1-2

In Formulae 1-1 and 1-2, $M_{11}$, n11, n12, and $L_{12}$ may each independently be the same as described in Formula 1, $X_{12}$ may be selected from N, $N(R_{12a})$, O, S, $C(R_{12a})$, and $C(R_{12a})(R_{12b})$, $X_{13}$ may be selected from N, $N(R_{13a})$, O, S, $C(R_{13a})$, and $C(R_{13a})(R_{13b})$, $X_{14}$ may be selected from N, $N(R_{14a})$, O, S, $C(R_{14a})$, and $C(R_{14a})(R_{14b})$, $X_{15}$ may be selected from N, $N(R_{15a})$, O, S, $C(R_{15a})$, and $C(R_{15a})(R_{15b})$, $X_{16}$ may be selected from N, $N(R_{16a})$, O, S, $C(R_{16a})$, and $C(R_{16a})(R_{16b})$, $X_{17}$ may be selected from N, $N(R_{17a})$, O, S, $C(R_{17a})$, and $C(R_{17a})(R_{17b})$, $X_{18}$ may be selected from N, $N(R_{18a})$, O, S, $C(R_{18a})$, and $C(R_{18a})(R_{18b})$, and $X_{19}$ may be selected from N, $N(R_{19a})$, O, S, $C(R_{19a})$, and $C(R_{19a})(R_{19b})$, and $R_{12a}$, $R_{12b}$, $R_{13a}$, $R_{13b}$, $R_{14a}$, $R_{14b}$, $R_{15a}$, $R_{15b}$, $R_{16a}$, $R_{16b}$, $R_{17a}$, $R_{17b}$, $R_{18a}$, $R_{18b}$, $R_{19a}$, and $R_{19b}$ may each independently be the same as described in connection with $R_1$ in Formula 1A.

For example, in Formulae 1-1 and 1-2, $X_{12}$ may be selected from N and $C(R_{12a})$, $X_{13}$ may be selected from N and $C(R_{13a})$, $X_{14}$ may be selected from N and $C(R_{14a})$, $X_{15}$ may be selected from N and $C(R_{15a})$, $X_{16}$ may be selected from N and $C(R_{16a})$, $X_{17}$ may be selected from N and $C(R_{17a})$, $X_{18}$ may be selected from N and $C(R_{18a})$, and $X_{19}$ may be selected from N and $C(R_{19a})$, but embodiments of the present disclosure are not limited thereto. In this embodiment, in Formula 1-1, a bond between N and $X_{12}$, a bond between $X_{13}$ and $X_{14}$, and a bond between $X_{15}$ and C may each be a single bond, and a bond between $X_{12}$ and $X_{13}$ and a bond between $X_{14}$ and $X_{15}$ may each be a double bond, but embodiments of the present disclosure are not limited thereto. In this embodiment, in Formula 1-2, a bond between C and $X_{12}$, a bond between $X_{13}$ and $X_{14}$, and a bond between $X_{15}$ and N may each be a single bond, and a bond between $X_{12}$ and $X_{13}$ and a bond between $X_{14}$ and $X_{15}$ may each be a double bond, but embodiments of the present disclosure are not limited thereto.

In an embodiment, in Formulae 1-1 and 1-2, $X_{12}$ may be $C(R_{12a})$, $X_{13}$ may be $C(R_{13a})$, $X_{14}$ may be $C(R_{14a})$, and $X_{15}$ may be $C(R_{15a})$, but embodiments of the present disclosure are not limited thereto. In this embodiment, in Formula 1-1, a bond between N and $X_{12}$, a bond between $X_{13}$ and $X_{14}$, and a bond between $X_{15}$ and C may each be a single bond, and a bond between $X_{12}$ and $X_{13}$ and a bond between $X_{14}$ and $X_{15}$ may each be a double bond, but embodiments of the present disclosure are not limited thereto. In this embodiment, in Formula 1-2, a bond between C and $X_{12}$, a bond between $X_{13}$ and $X_{14}$, and a bond between $X_{15}$ and N may each be a single bond, and a bond between $X_{12}$ and $X_{13}$ and a bond between $X_{14}$ and $X_{15}$ may each be a double bond, but embodiments of the present disclosure are not limited thereto.

In an embodiment, in Formulae 1-1 and 1-2, at least one selected from $X_{12}$ to $X_{15}$ may be selected from O and S, but embodiments of the present disclosure are not limited thereto.

For example, in Formulae 1-1 and 1-2, $X_{16}$ may be N, $X_{17}$ may be $C(R_{17a})$, $X_{18}$ may be $C(R_{18a})$, and $X_{19}$ may be $C(R_{19a})$; $X_{16}$ may be $C(R_{16a})$, $X_{17}$ may be N, $X_{18}$ may be $C(R_{18a})$, and $X_{19}$ may be $C(R_{19a})$; $X_{16}$ may be $C(R_{16a})$, $X_{17}$ may be $C(R_{17a})$, $X_{18}$ may be N, and $X_{19}$ may be $C(R_{19a})$; $X_{16}$ may be $C(R_{16a})$, $X_{17}$ may be $C(R_{17a})$, $X_{18}$ may be $C(R_{18a})$, and $X_{19}$ may be N; or $X_{16}$ may be $C(R_{16a})$, $X_{17}$ may be $C(R_{17a})$, $X_{18}$ may be $C(R_{18a})$, and $X_{19}$ may be $C(R_{19a})$, but embodiments of the present disclosure are not limited thereto. In this embodiment, in Formulae 1-1 and 1-2, a bond between $X_{16}$ and $X_{17}$ and a bond between $X_{18}$ and $X_{19}$ may each be a double bond, and a bond between C and $X_{16}$, a bond between C and $X_{19}$, and a bond between $X_{17}$ and $X_{18}$ may each be a single bond, but embodiments of the present disclosure are not limited thereto.

In an embodiment, the organometallic compound represented by Formula 1 may be represented by one selected from Formulae 1-11 and 1-12, but embodiments of the present disclosure are not limited thereto:

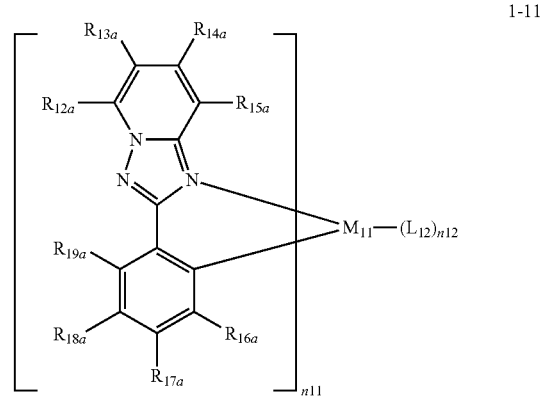

1-11

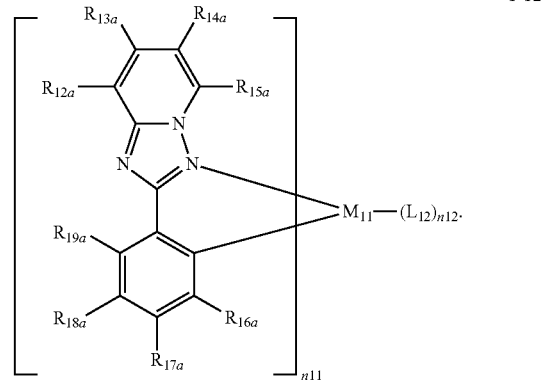

1-12

In Formulae 1-11 and 1-12, $M_{11}$, n11, n12, and $L_{12}$ may each independently be the same as described in Formula 1, and $R_{12a}$, $R_{13a}$, $R_{14a}$, $R_{15a}$, $R_{16a}$, $R_{17a}$, $R_{18a}$, and $R_{19a}$ may each independently be defined the same as $R_1$ in Formula 1A.

The organometallic compound represented by Formula 1 may be selected from Compounds 1 to 16, but embodiments of the present disclosure are not limited thereto:

1
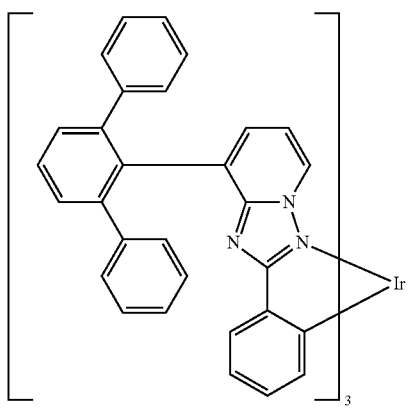
2
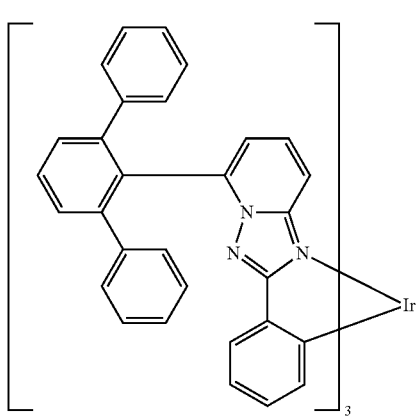
3
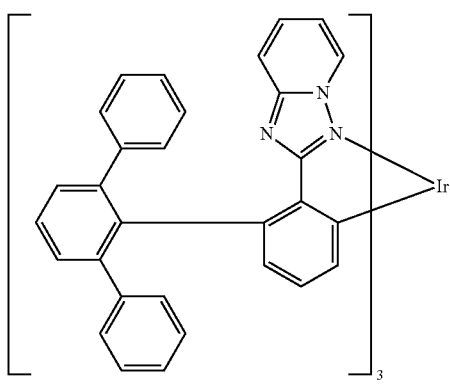
4
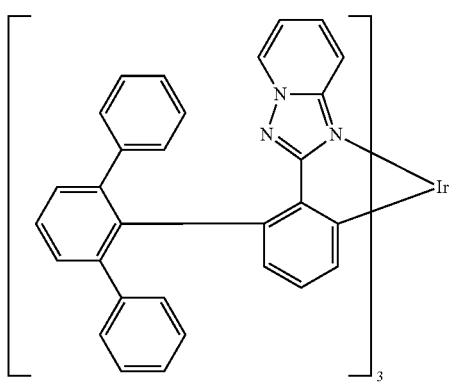
5
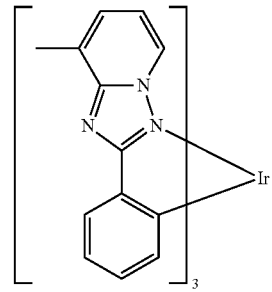
6
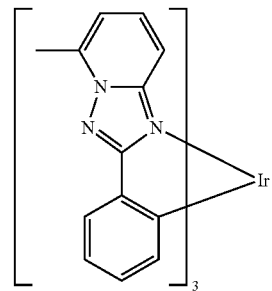
7
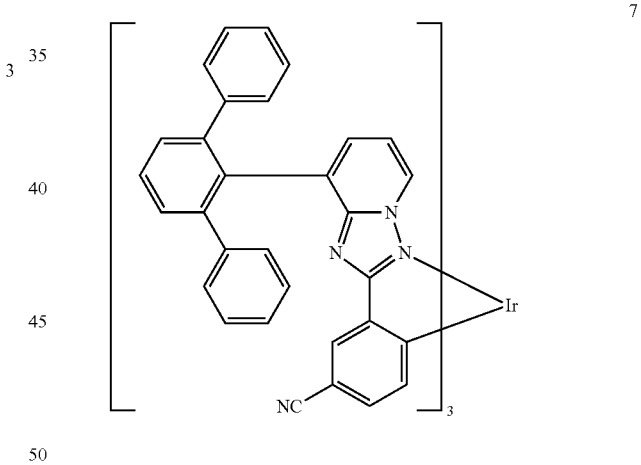
8
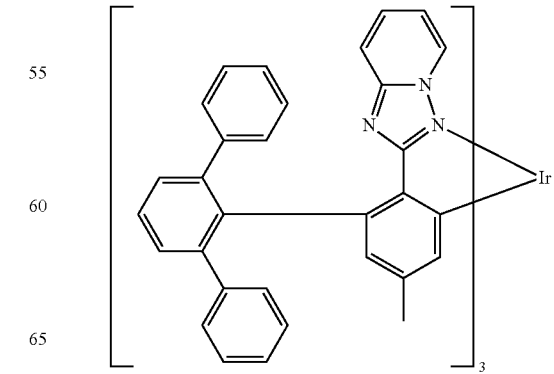

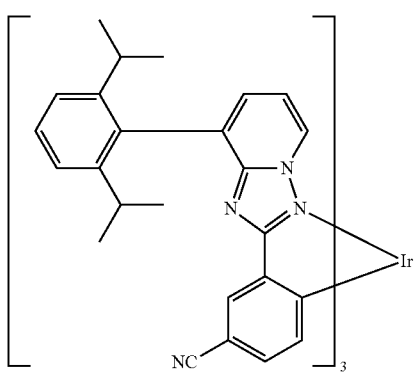

9

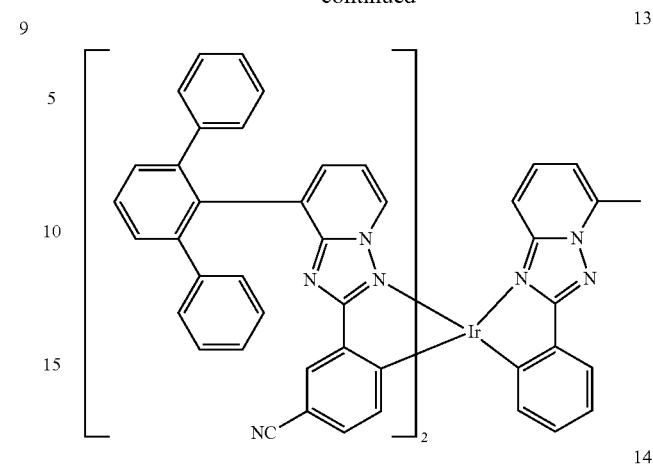

13

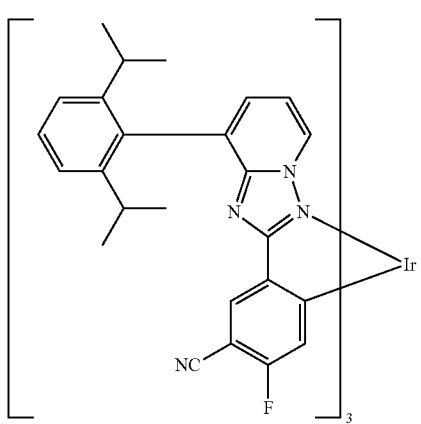

10

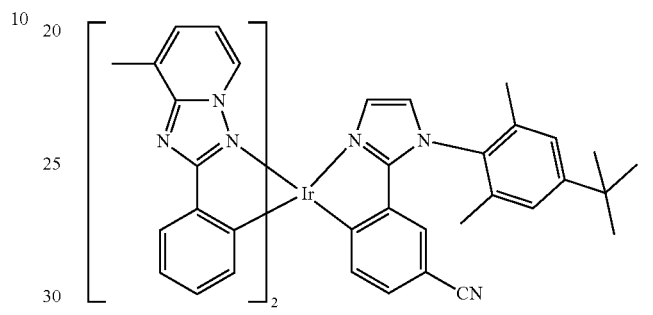

14

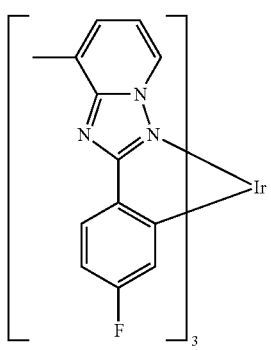

11

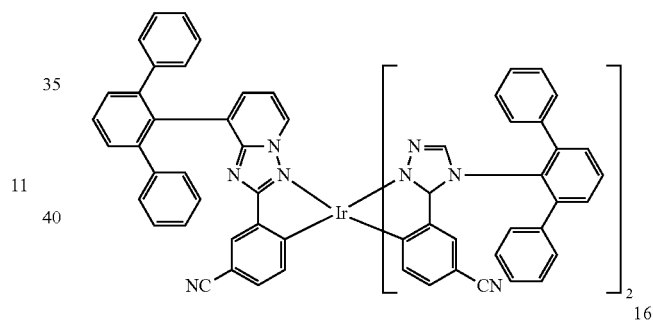

15

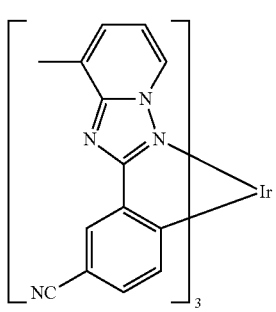

12

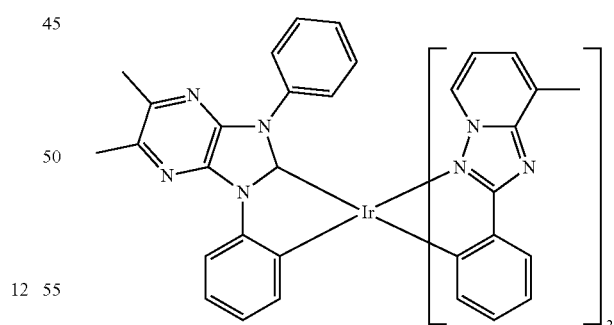

16

The organometallic compound represented by Formula 1 may have a maximum emission wavelength (actually measured value) of about 400 nanometers (nm) to 520 nm, for example, about 440 nm to about 480 nm. When the maximum emission wavelength is about 440 nm to about 480 nm, an organic light-emitting device that emits deep blue light may be provided.

Since the organometallic compound represented by Formula 1 essentially includes a 6-membered ring having $Y_{11}$, $Y_{12}$, and $X_{12}$ to $X_{15}$, a conjugated system increases as compared with a relatively unstable triazole 5-membered ring, thereby improving electrochemical stability. In addition, it is general that, when the conjugated system increases, a $T_1$ energy level is reduced. However, when a nitrogen atom (N) is introduced at a specific position, stability increases while a high $T_1$ energy level is maintained. Therefore, an organic light-emitting device including the organometallic compound represented by Formula 1 may improve a lifespan while maintaining a high $T_1$ energy level.

On the other hand, for example, when the organometallic compound represented by Formula 1 does not include the 6-membered ring having $Y_{11}$, $Y_{12}$, and $X_{12}$ to $X_{15}$ and includes the triazole 5-membered ring as a main ligand, a low $T_1$ energy level of not a blue range but a green range is exhibited. For example, when acetylacetonate (acac) having a weak bonding force is used as an auxiliary ligand, electrochemical and physical stability becomes poor.

In contrast, the organometallic compound represented by Formula 1 exhibits a high $T_1$ energy level of a blue range by introducing the nitrogen atom (N) as described above, and has an effect of increasing electrochemical and physical stability due to the increased conjugated system. Therefore, an organic light-emitting device including the organometallic compound represented by Formula 1 may increase a lifespan while maintaining a high $T_1$ energy level.

In addition, in the organometallic compound represented by Formula 1, since $W_{11}$ is selected from N and $N(R_{11})$, chemical and/or physical stability of the organometallic compound represented by Formula 1 may be improved. Therefore, the lifespan of the organic light-emitting device including the organometallic compound represented by Formula 1 may be improved.

In addition, when the organometallic compound represented by Formula 1 further includes an additional substituent in the 6-membered ring having $Y_{11}$, $Y_{12}$, and $X_{12}$ to $X_{15}$ and/or the 6-membered ring having $Z_{12}$, $Z_{13}$, and $X_{16}$ to Xi, blue light may be provided. While not wishing to be bound by theory, it is understood that when the organometallic compound represented by Formula 1 further includes the additional substituent, the organometallic compound may have a high triplet energy level due to a wider band gap, thereby providing deep blue light.

Therefore, the organometallic compound represented by Formula 1 may have a triplet energy level suitable for blue light and have improved chemical and/or physical stability. Therefore, the organic light-emitting device including the organometallic compound represented by Formula 1 may provide improved color purity and lifespan.

The HOMO energy level, LUMO energy level, and $T_1$ energy level of some Compounds and Compounds A to C in the organometallic compound represented by Formula 1 were evaluated by using Gaussian 09 program accompanying a molecular structure optimization by a B3LYP-based density functional theory (DFT) (structurally optimized at a level of B3LYP, 6-31G(d,p)), and results thereof are shown in Table 1.

TABLE 1

| Compound No. | HOMO (eV) | LUMO (eV) | $T_1$ (eV) |
|---|---|---|---|
| 1 | −4.89 | −1.36 | 2.76 |
| A | −5.30 | −1.68 | 2.69 |
| B | −4.36 | −0.76 | 2.65 |
| C | −4.49 | −1.16 | 2.44 |

TABLE 1-continued

| Compound No. | HOMO (eV) | LUMO (eV) | $T_1$ (eV) |
|---|---|---|---|

A

B

C

From Table 1, it is confirmed that the organometallic compound represented by Formula 1 has such electric characteristics that are suitable for use in an electric device, for example, for use as a dopant for an organic light-emitting device.

Synthesis methods of the organometallic compound represented by Formula 1 may be recognizable by one of ordinary skill in the art by referring to Synthesis Examples provided.

The organometallic compound represented by Formula 1 is suitable for use in an organic layer of an organic light-emitting device, for example, for use as a dopant in an emission layer of the organic layer. Thus, another aspect of the present description provides an organic light-emitting device that includes: a first electrode; a second electrode; and an organic layer that is disposed between the first electrode and the second electrode, wherein the organic layer includes an emission layer; and wherein the organic layer includes at least one organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this embodiment, the organometallic compound may act as a dopant, and the emission layer may further include a host (that is, an amount of the organometallic compound represented by Formula 1 is smaller than an amount of the host). In this embodiment, the dopant may emit blue light.

The expression "(an organic layer) includes at least one organometallic compound" as used herein may include an embodiment in which "(an organic layer) includes identical compounds represented by Formula 1" and an embodiment in which "(an organic layer) includes two or more different organometallic compounds represented by Formula 1."

For example, the organic layer may include, as the organometallic compound, only Compound 1. In this embodiment, Compound 1 may be included in an emission layer of the organic light-emitting device. In one or more embodiments, the organic layer may include, as the organometallic compound, Compound 1 and Compound 2. In this embodiment, Compound 1 and Compound 2 may be included in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, wherein the hole transport region includes at least one selected from a hole injection layer, a hole transport layer, and an electron blocking layer, and wherein the electron transport region includes at least one selected from a hole blocking layer, an electron transport layer, and an electron injection layer.

The term "organic layer" as used herein refers to a single layer and/or a plurality of layers between the first electrode and the second electrode of the organic light-emitting device. The "organic layer" may include, in addition to an organic compound, an organometallic compound including metal.

FIG. 1 is a schematic view of an organic light-emitting device 10 according to an embodiment. Hereinafter, the structure of an organic light-emitting device according to an embodiment and a method of manufacturing an organic light-emitting device according to an embodiment will be described in connection with FIG. 1. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

In one or more embodiments, the first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ to about $10^{-3}$ torr, and a deposition rate of about 0.01 Angstroms per second (Å/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), polyaniline/poly(4-styrene sulfonate) (PANI/PSS), a compound represented by Formula 201, and a compound represented by Formula 202:

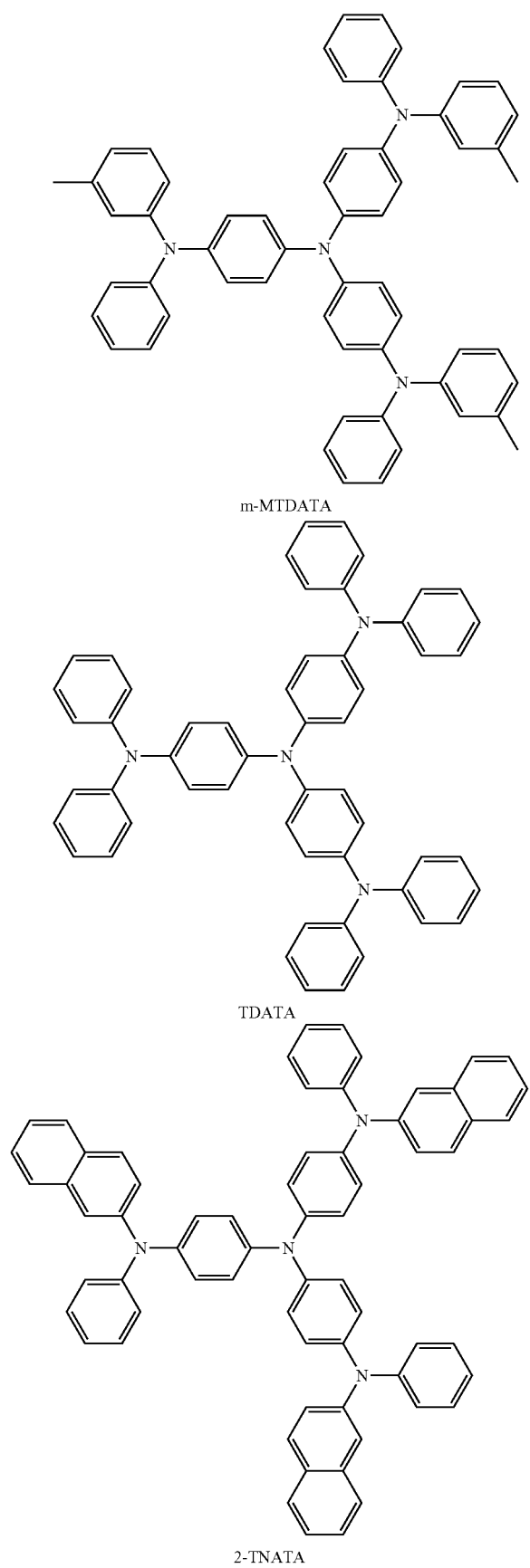
m-MTDATA
TDATA
2-TNATA
-continued
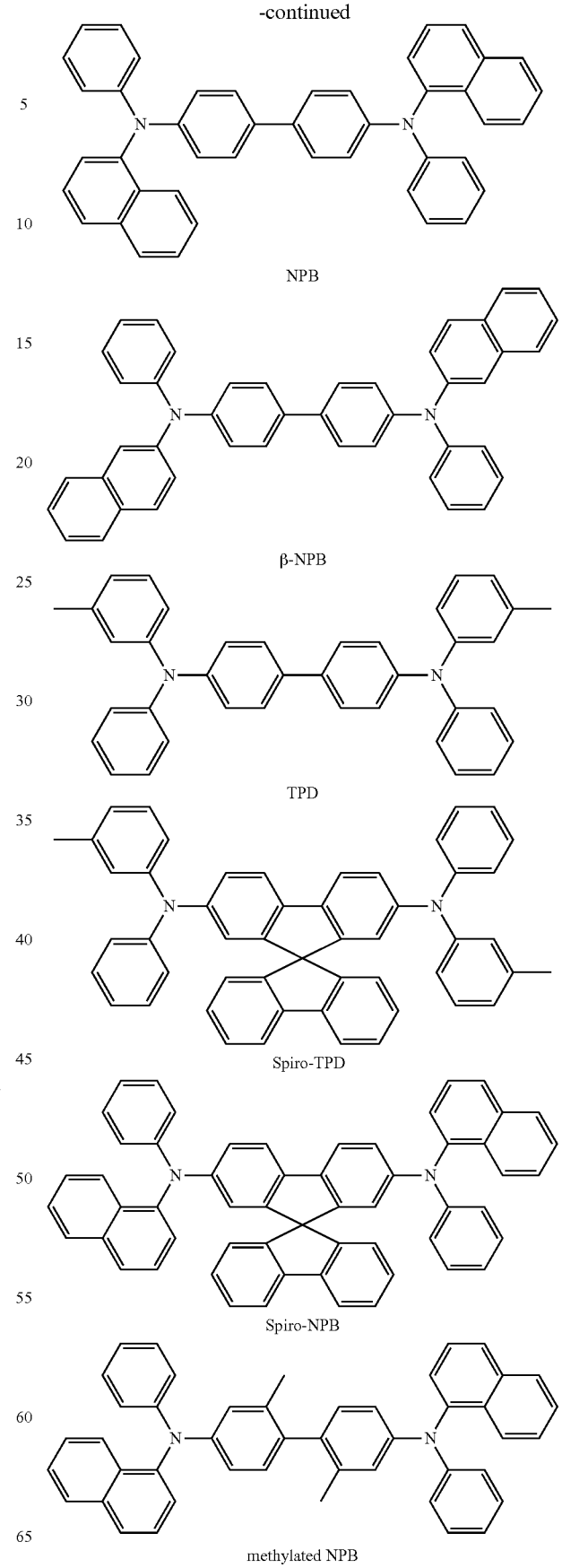
NPB
β-NPB
TPD
Spiro-TPD
Spiro-NPB
methylated NPB

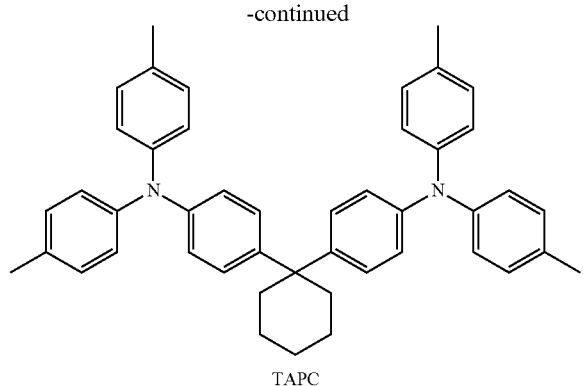

TAPC

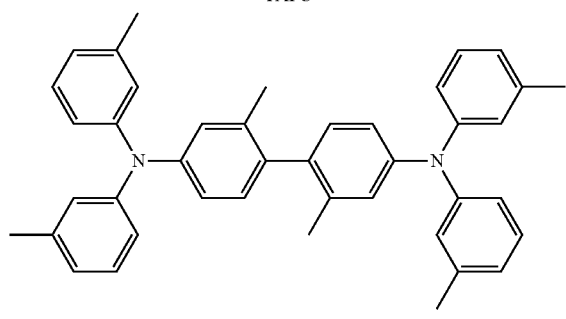

HMTPD

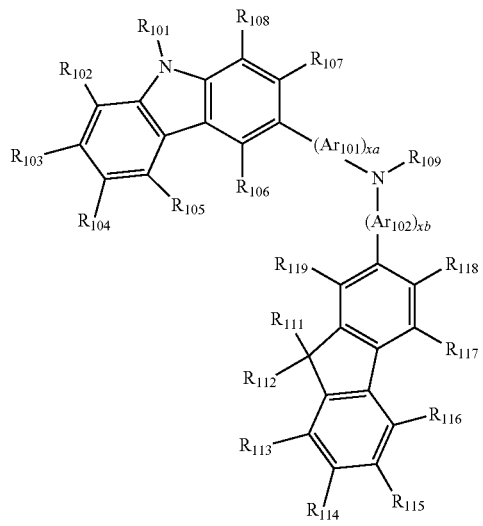

Formula 201

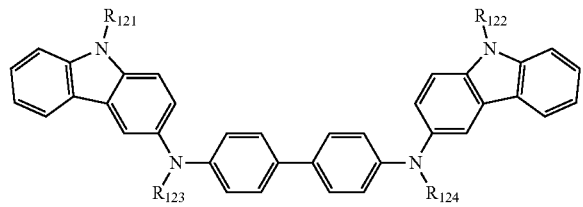

Formula 202

Ar$_{101}$ and Ar$_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer from 0 to 5, or 0, 1 or 2. For example, xa may be 1 and xb may be 0, but xa and xb are not limited thereto.

In Formulae 201 and 202, $R_{101}$ to $R_{108}$, $R_{111}$ to $R_{119}$, and $R_{121}$ to $R_{124}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and the like), and a $C_1$-$C_{10}$ alkoxy group (for example, a methoxy group, an ethoxy group, a propoxy group, a butoxy group, a pentoxy group, and the like);

a $C_1$-$C_{10}$ alkyl group and a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, or a pyrenyl group; or a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments of the present disclosure are not limited thereto.

In Formula 201, $R_{109}$ may be selected from:

a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In an embodiment, the compound represented by Formula 201 may be represented by Formula 201A, but embodiments of the present disclosure are not limited thereto:

Formula 201A

In Formula 201A, $R_{101}$, $R_{111}$, $R_{112}$, and $R_{109}$ may each independently be defined the same as described above.

For example, the compound represented by Formula 201, and the compound represented by Formula 202 may include compounds HT1 to HT20 illustrated, but are not limited thereto.

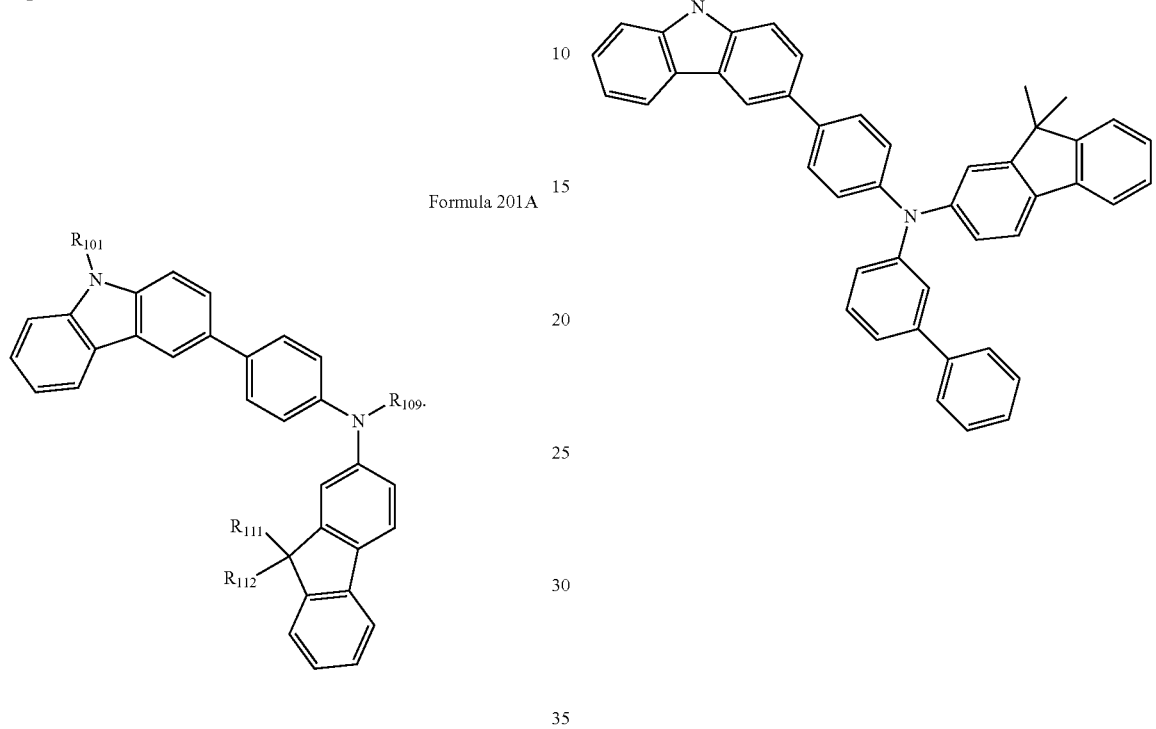

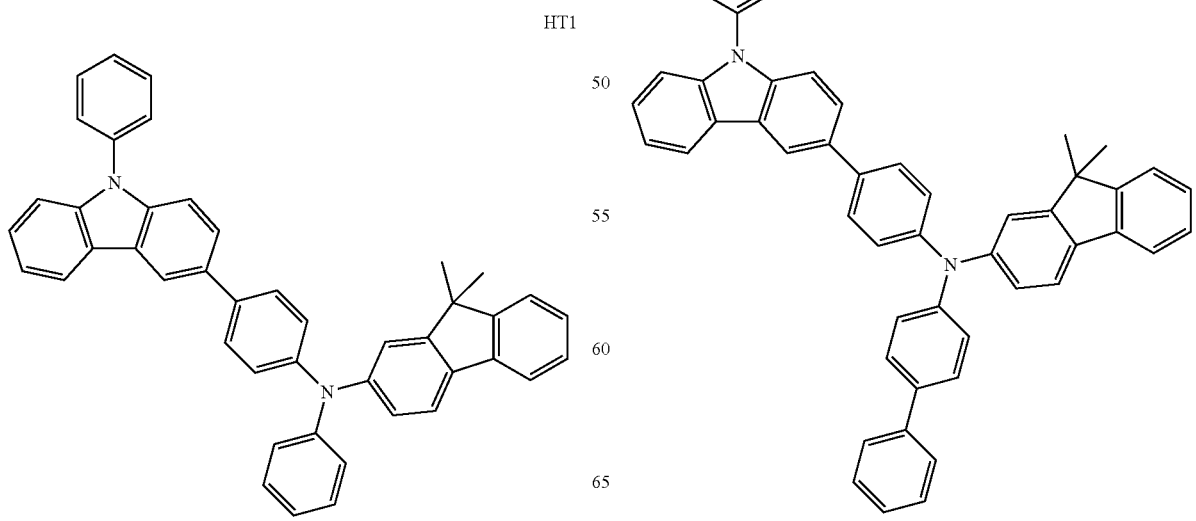

99
-continued
HT4
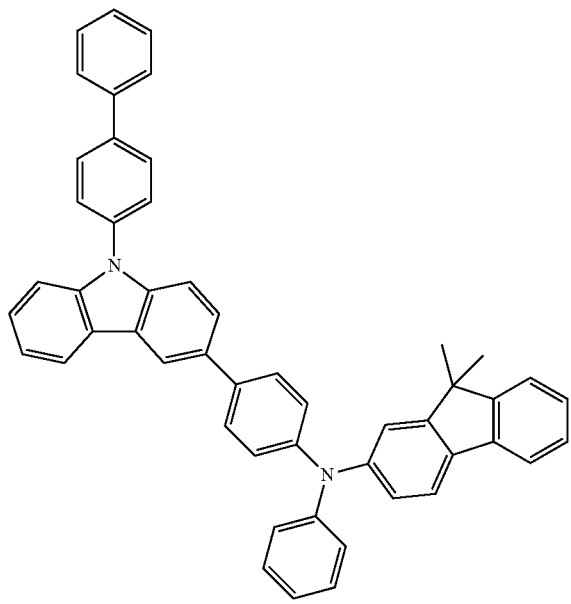
HT5
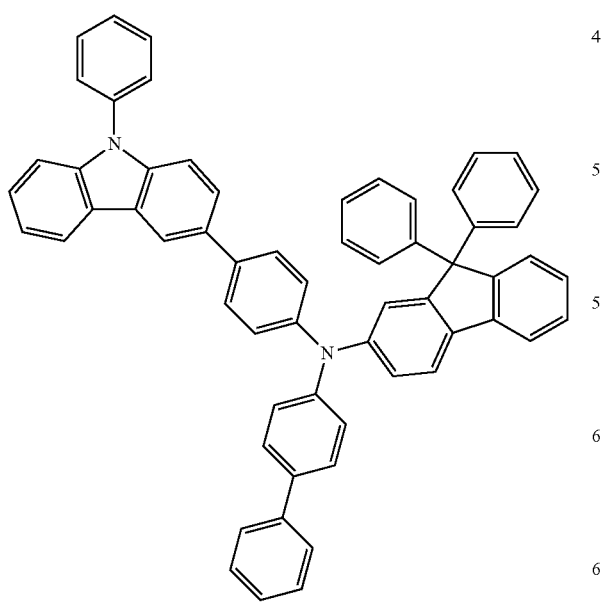
100
-continued
HT6
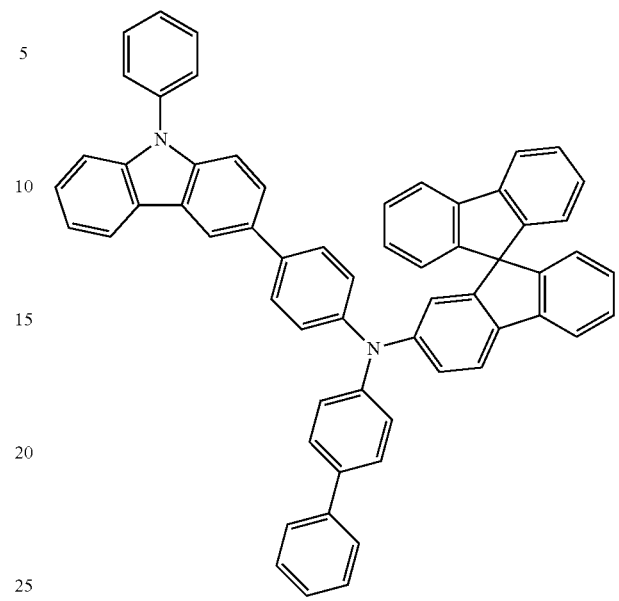
HT7
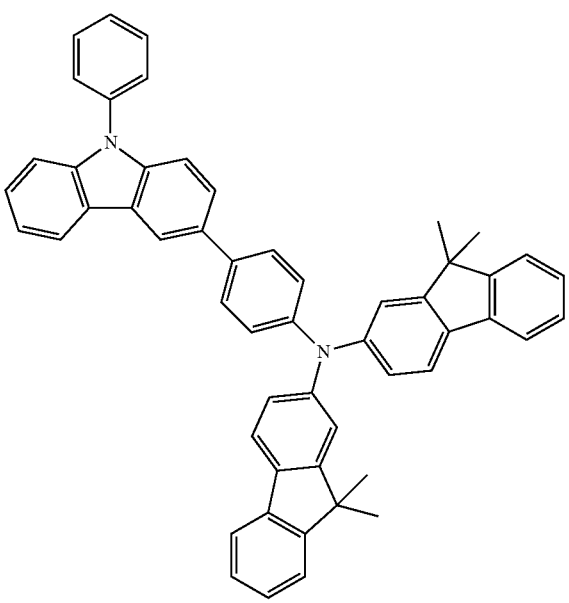

HT8
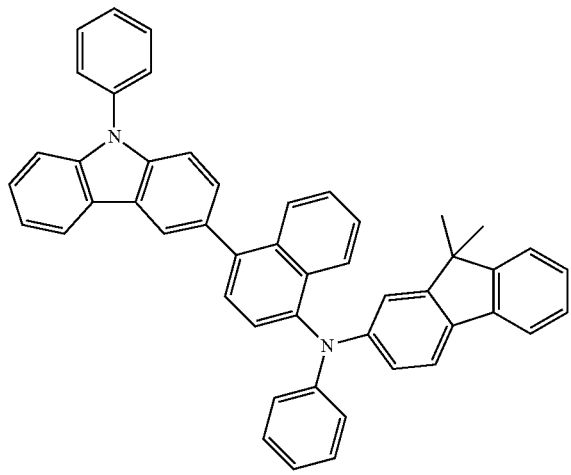
HT9
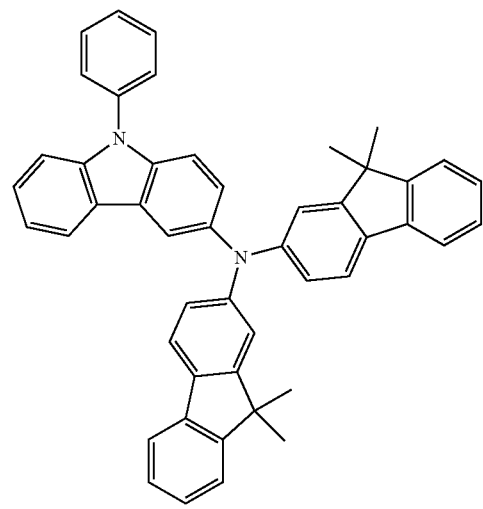
HT10
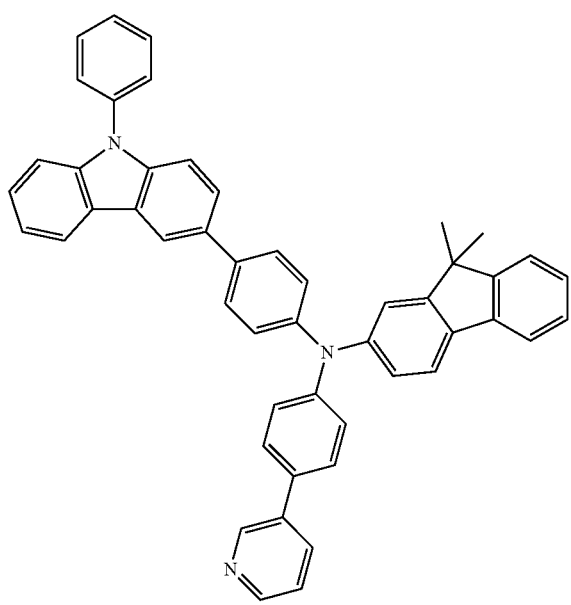
HT11
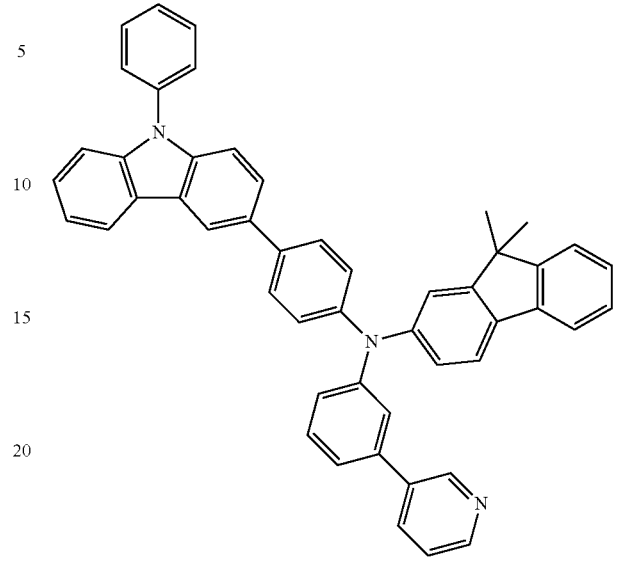
HT12
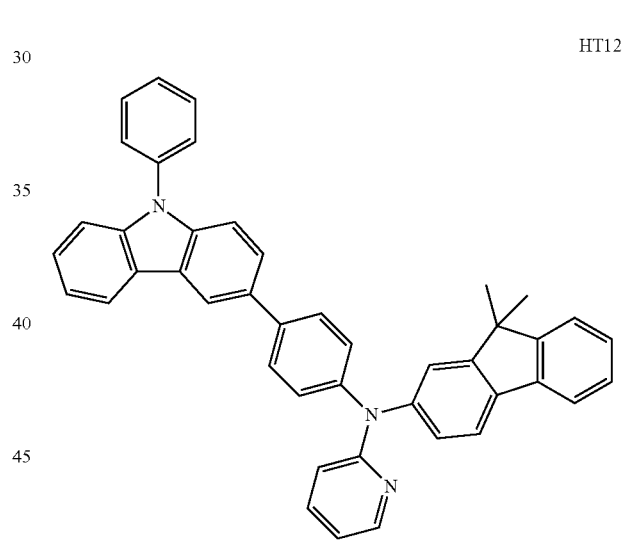
HT13
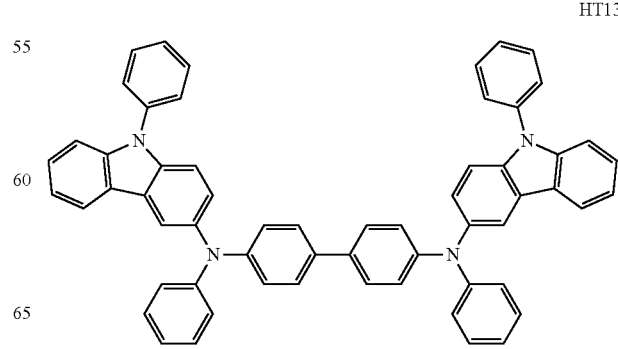

HT14
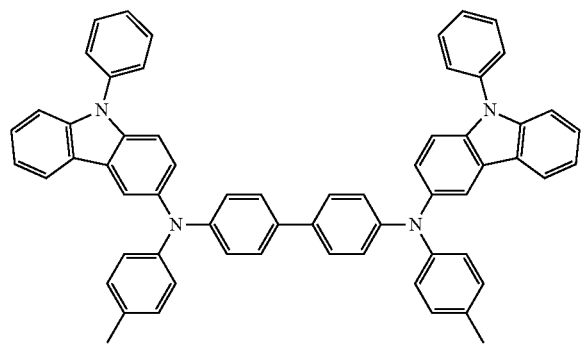

HT18
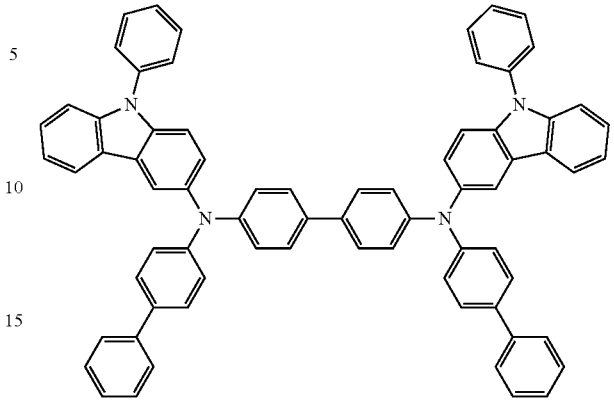

HT15
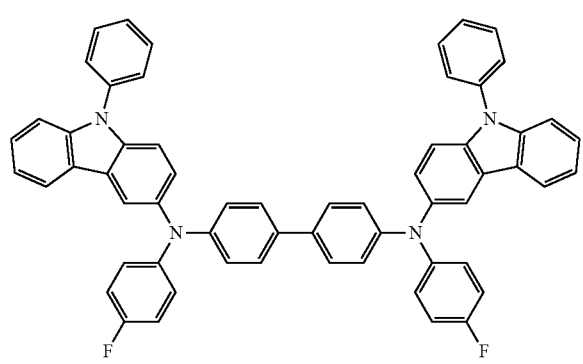

HT19
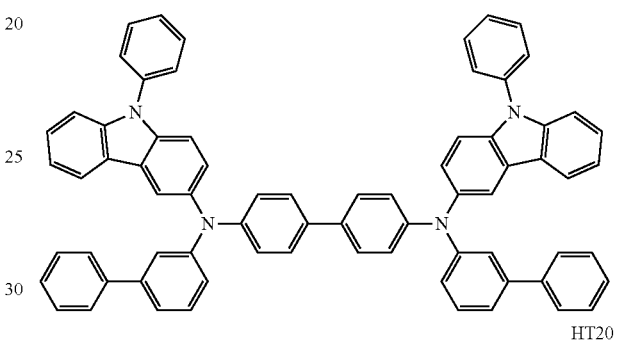

HT16
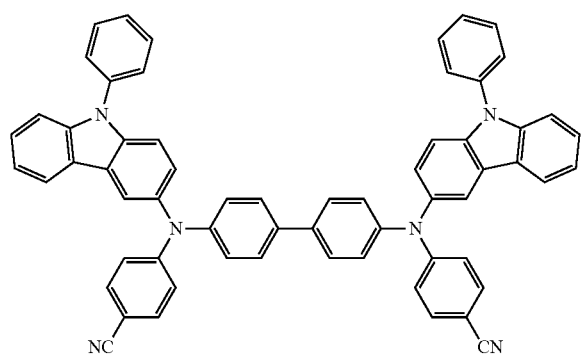

HT20
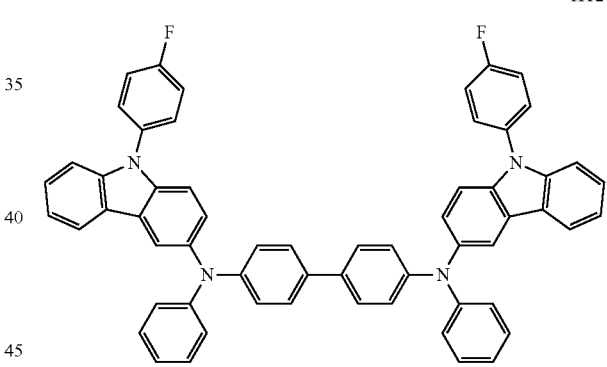

HT17
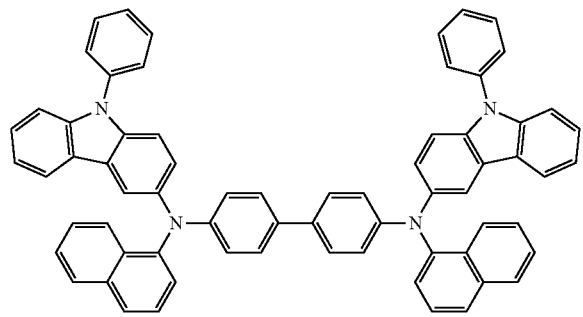

A thickness of the hole transport region may be in a range of about 100 Angstroms (Å) to about 10,000 Å, for example, about 100 Å to about 1,000 Å. When the hole transport region includes both a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 or Compound HT-D2, but are not limited thereto.

hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50 to Compound H52:

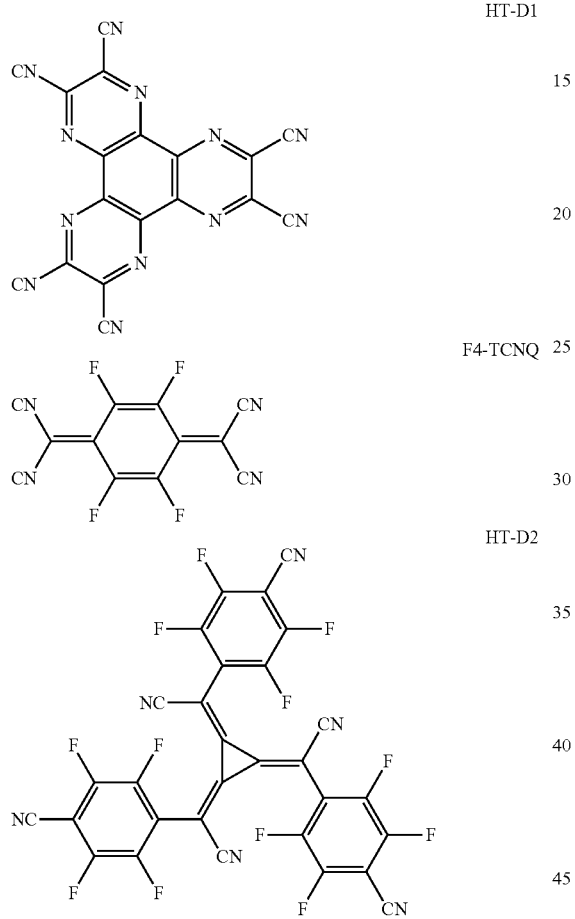

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the

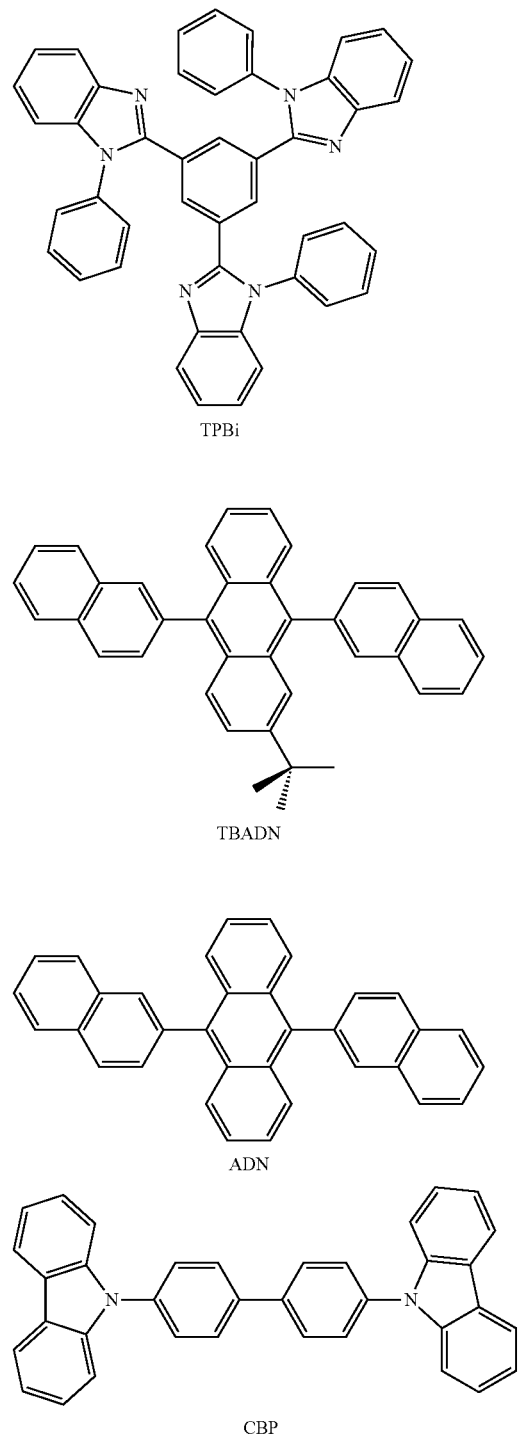

-continued

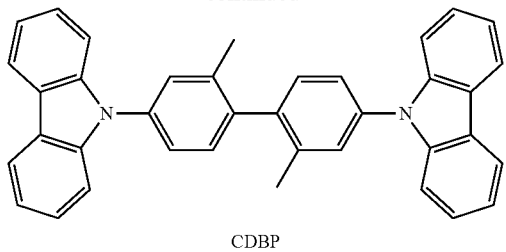
CDBP

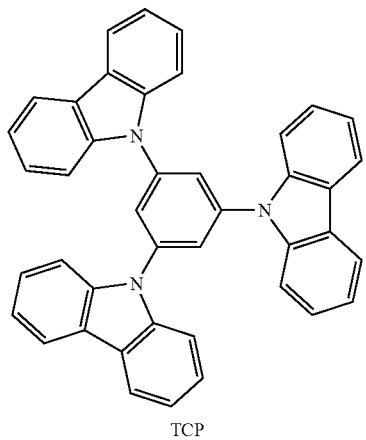
TCP

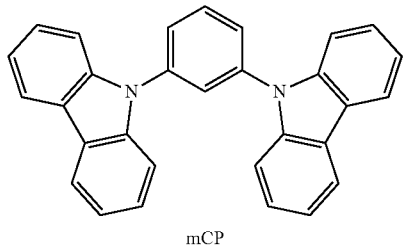
mCP

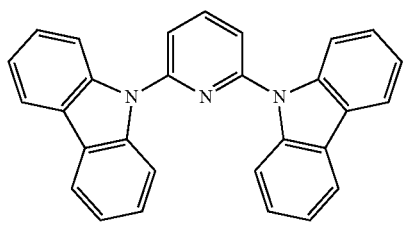
Compound H50

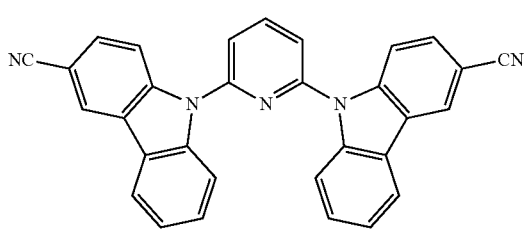
Compound H51

-continued

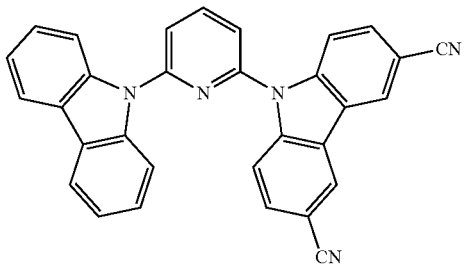
H52

In one or more embodiments, the host may further include a compound represented by Formula 301.

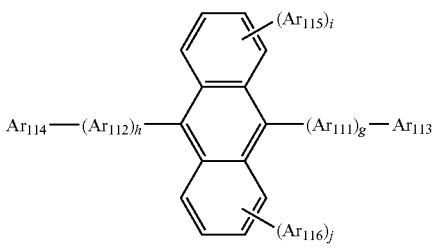
Formula 301

$Ar_{111}$ and $Ar_{112}$ in Formula 301 may each independently be selected from:

a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{11}$ in Formula 301 may each independently be selected from:

a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

In Formula 301, g, h, i, and j may each independently be an integer from 0 to 4, and may be, for example, 0, 1, or 2.

In Formula 301, $Ar_{113}$ and $Ar_{116}$ may each independently be selected from:

a $C_1$-$C_{10}$ alkyl group substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

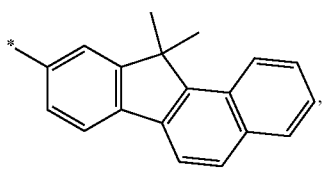

but embodiments of the present disclosure are not limited thereto.

In one or more embodiments, the host may include a compound represented by Formula 302:

Formula 302

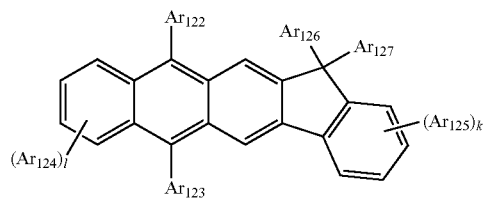

In Formula 302, $Ar_{122}$ to $Ar_{125}$ may each independently be defined the same as $Ar_{113}$ in Formula 301.

In Formula 302, $Ar_{126}$ and $Ar_{127}$ may each independently be a $C_1$-$C_{10}$ alkyl group (for example, a methyl group, an ethyl group, or a propyl group).

In Formula 302, k and l may each independently be an integer from 0 to 4. For example, k and l may be 0, 1, or 2.

The compound represented by Formula 301 and the compound represented by Formula 302 may include Compounds H1 to H42, but are not limited thereto.

H1

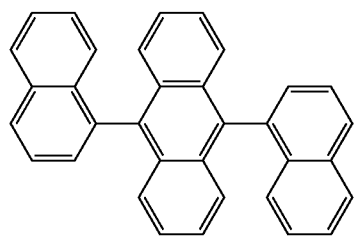

H2

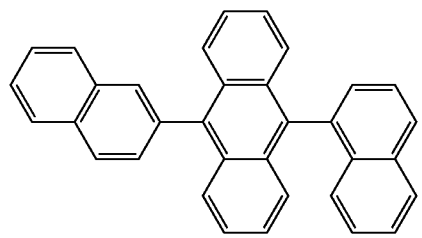

H3

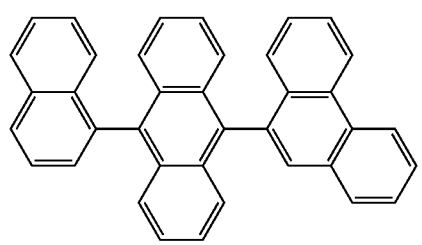

H4

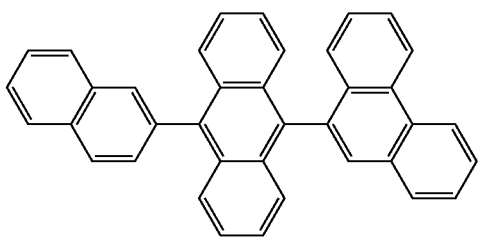

H5

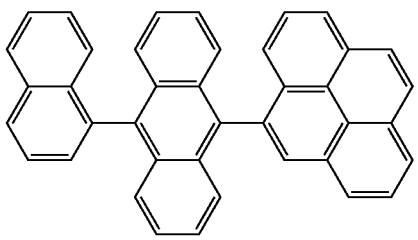

H6

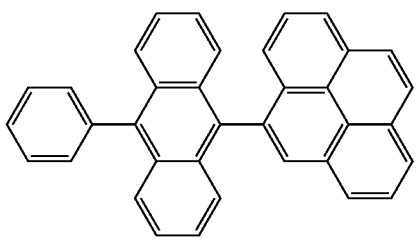

H7

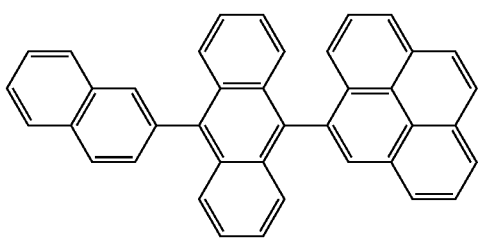

H8

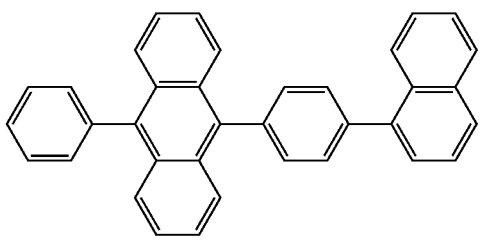

H9

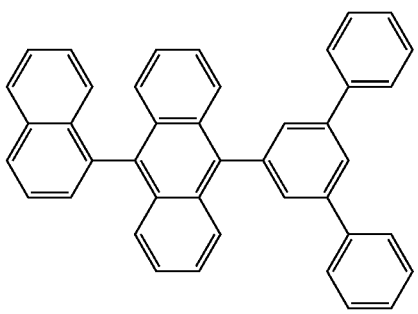

H10
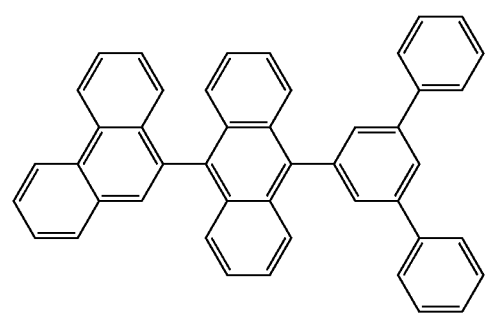
H11
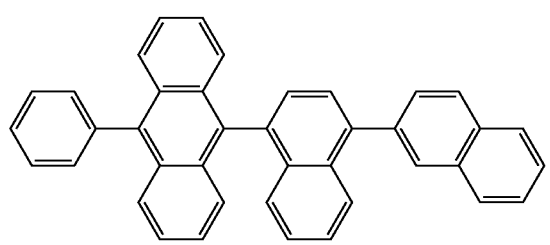
H12
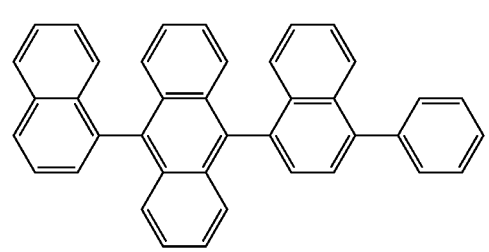
H13
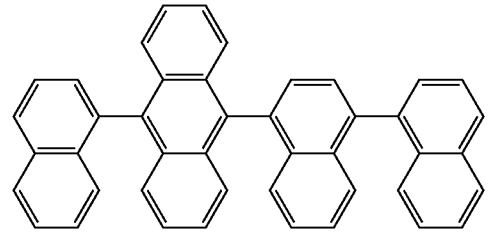
H14
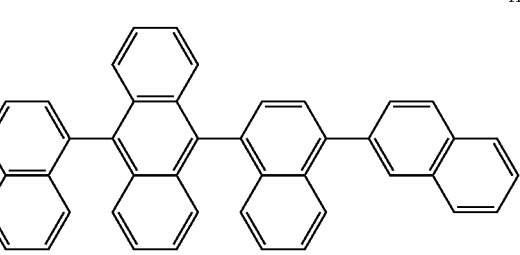
H15
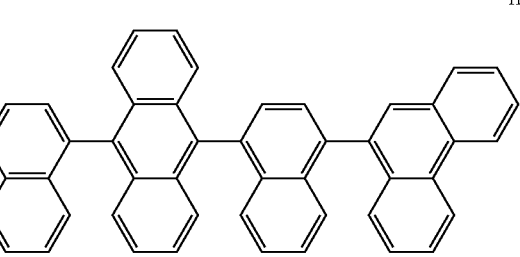
H16
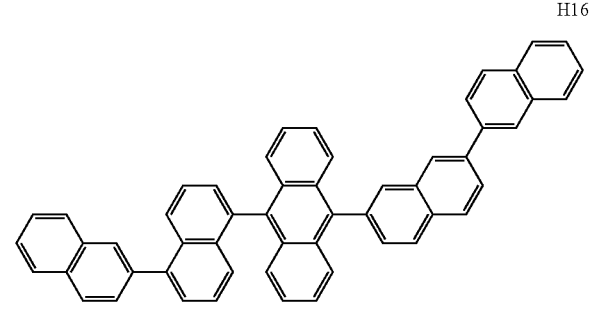
H17
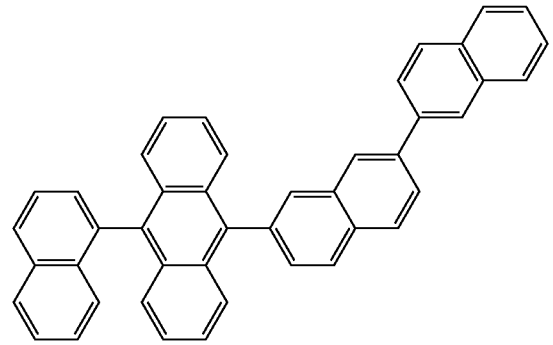
H18
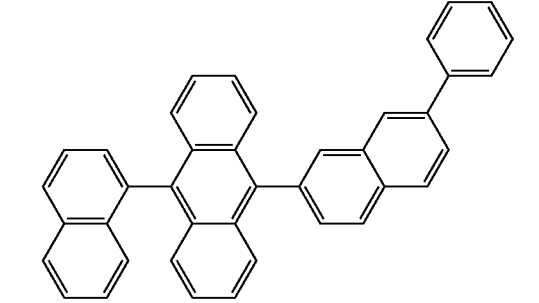
H19
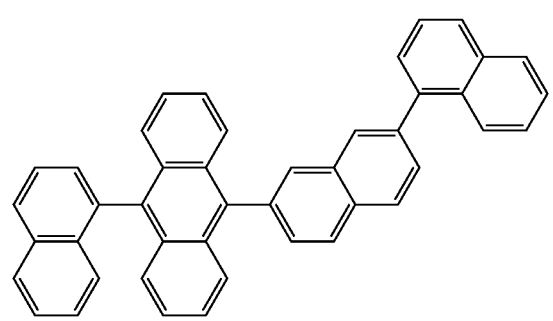

H20
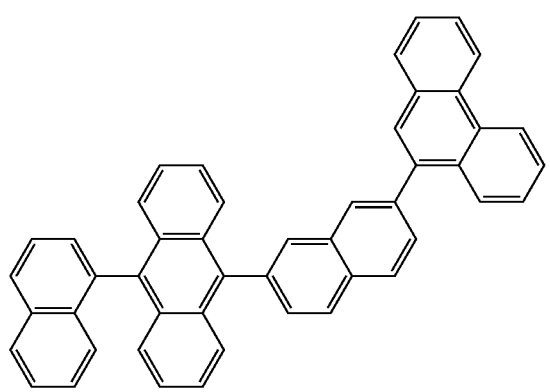
H21
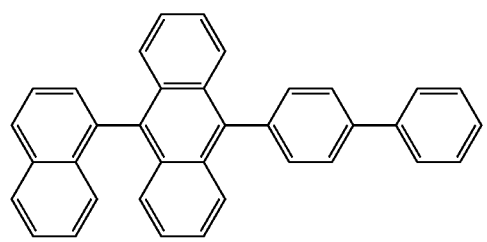
H22
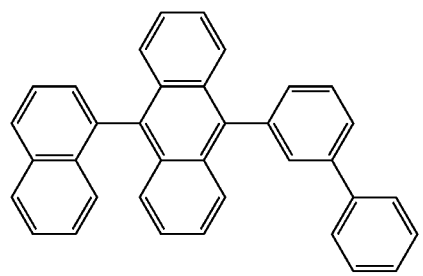
H23
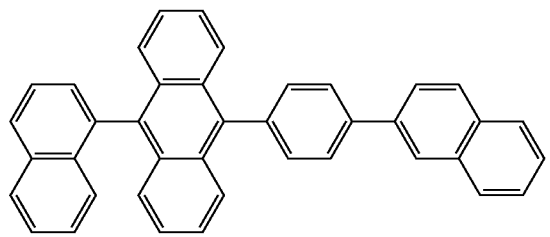
H24
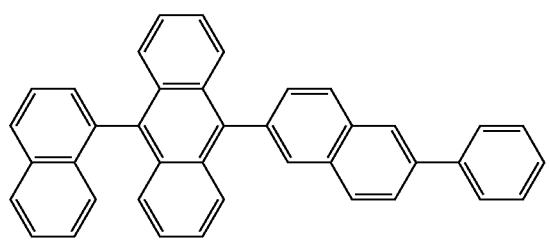
H25
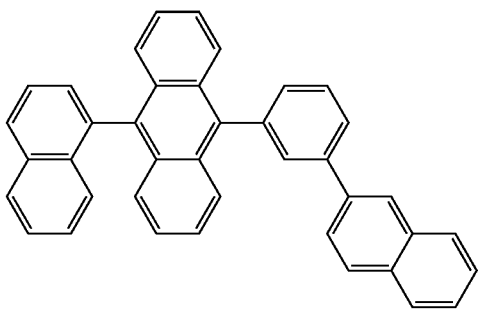
H26
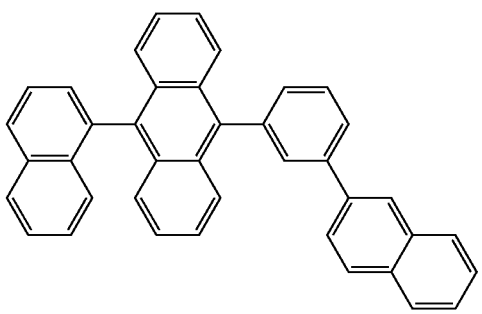
H27
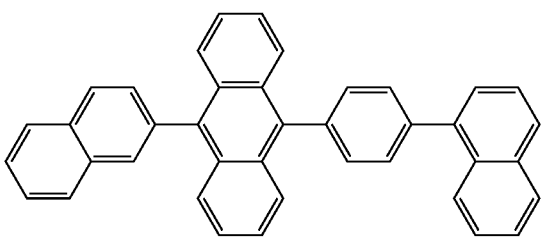
H28
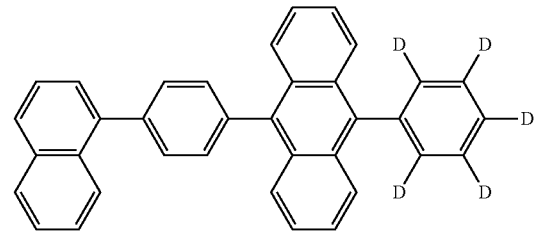
H29
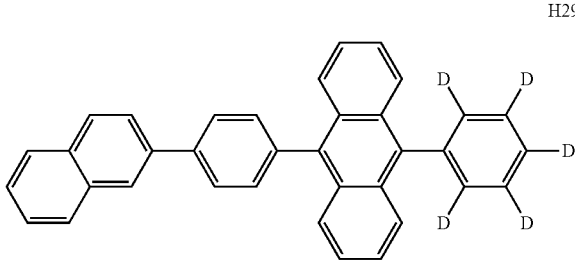
H30
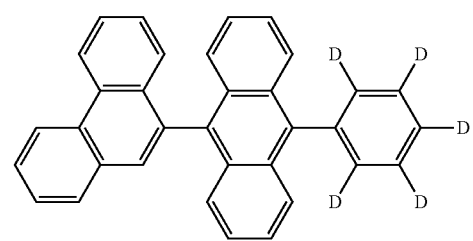

H31
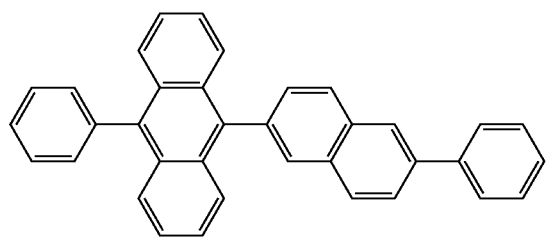
H32
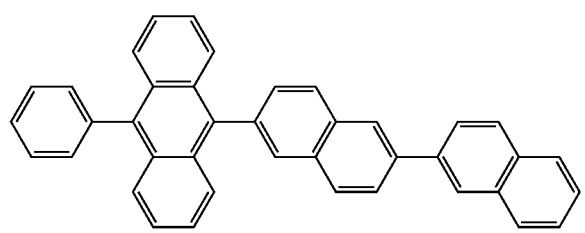
H33
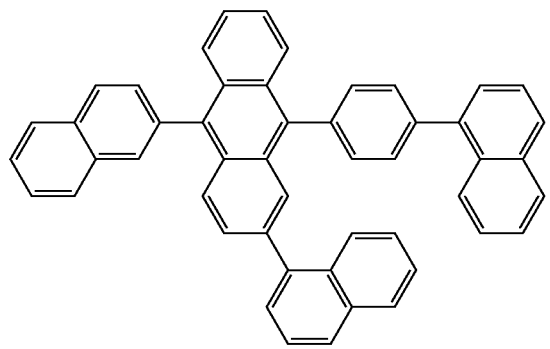
H34
H35
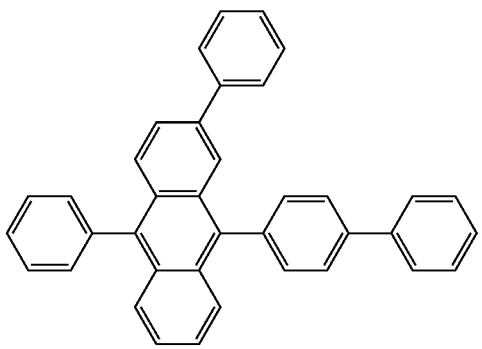
H36
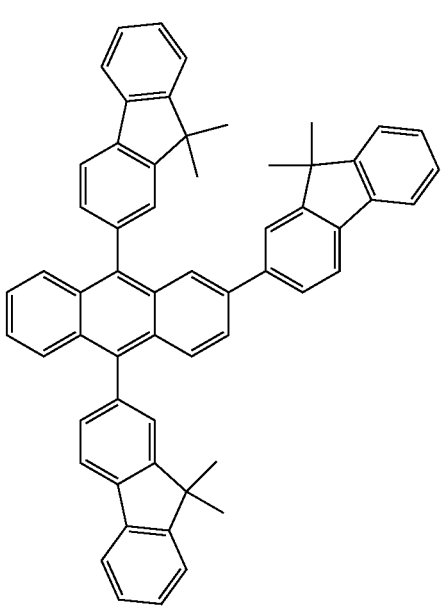
H37
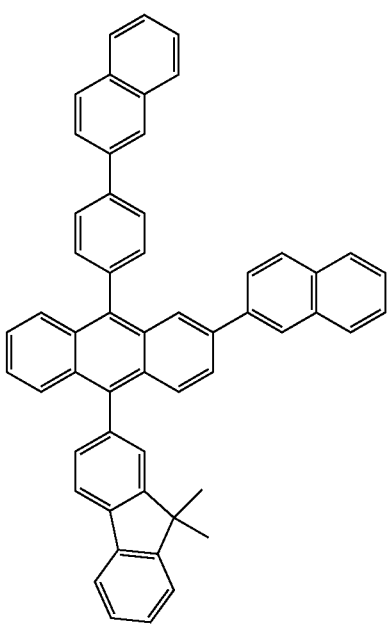

H38

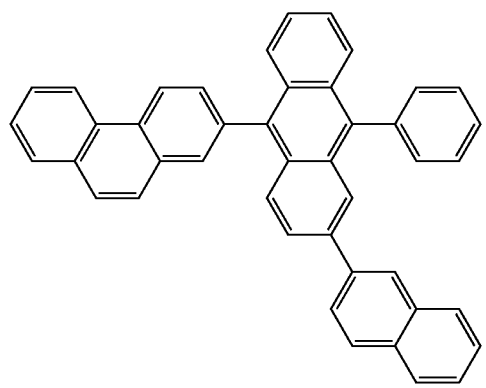

H41

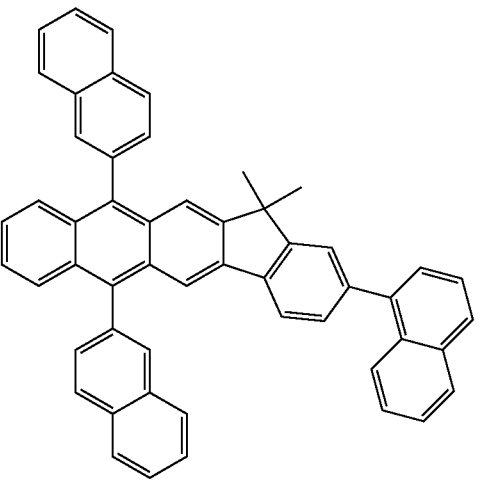

H39

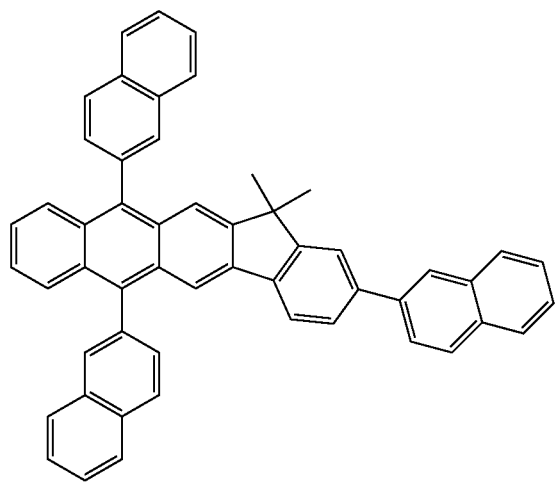

H42

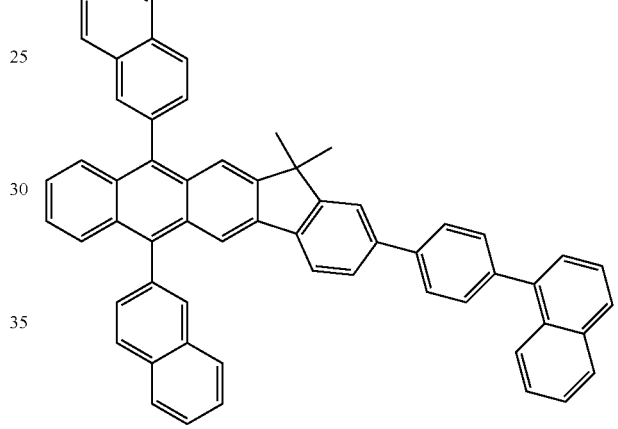

H40

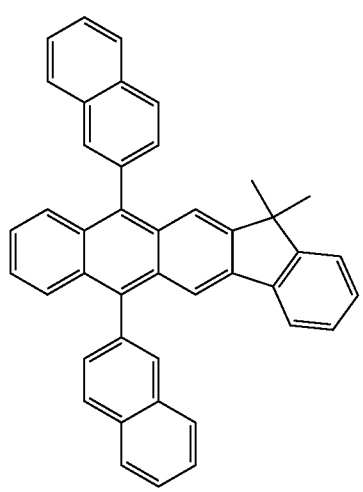

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be typically in a range of about 0.01 parts by weight to about 15 parts by weight based on 100 parts by weight of the host, but embodiments of the present disclosure are not limited thereto.

The dopant may include at least one of organometallic compounds represented by Formula 1.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

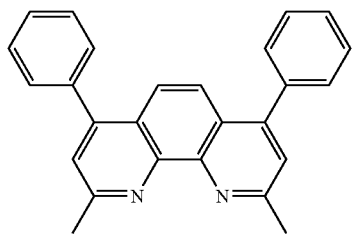

BCP

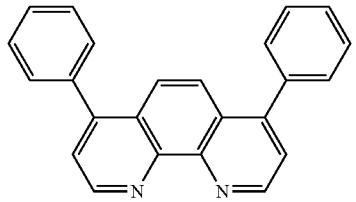

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have excellent hole blocking characteristics without a substantial increase in driving voltage.

The electron transport layer may further include, in addition to the organometallic compound represented by Formula 1, at least one selected from BCP, Bphen, $Alq_3$, BAlq, TAZ, and NTAZ.

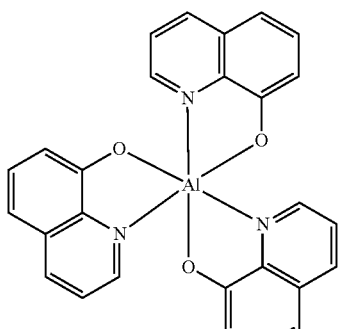

$Alq_3$

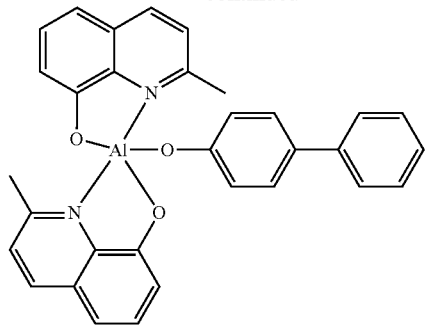

BAlq

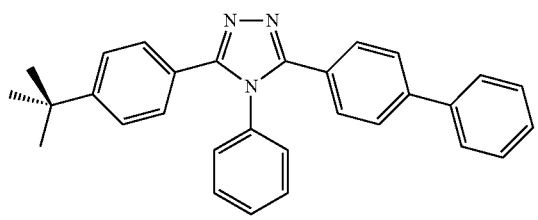

TAZ

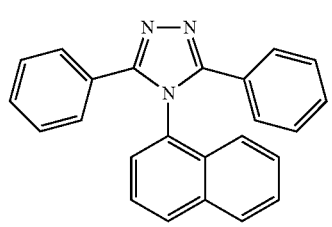

NTAZ

In one or more embodiments, the electron transport layer may include at least one of ET1 to ET25, but are not limited thereto:

ET1

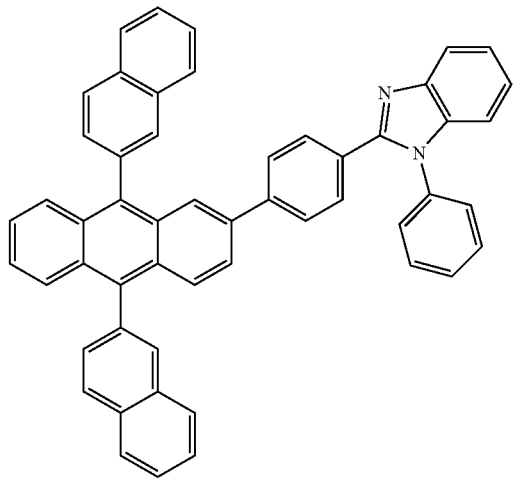

-continued
ET2
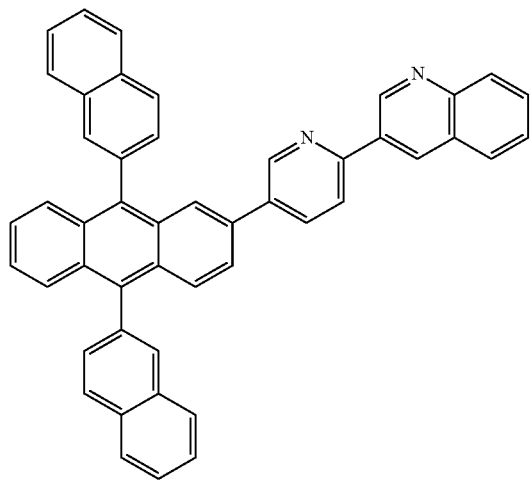
ET3
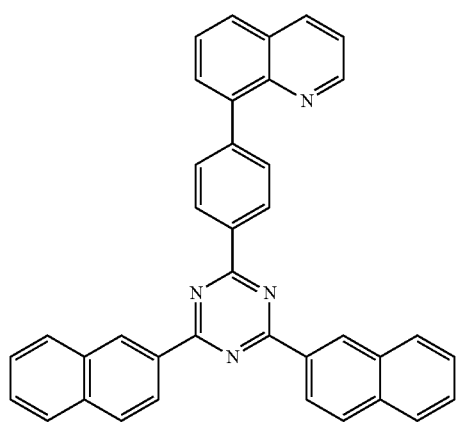
ET4
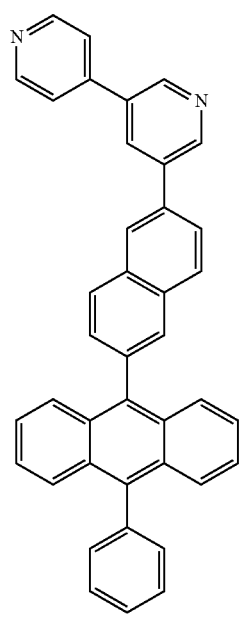
ET5
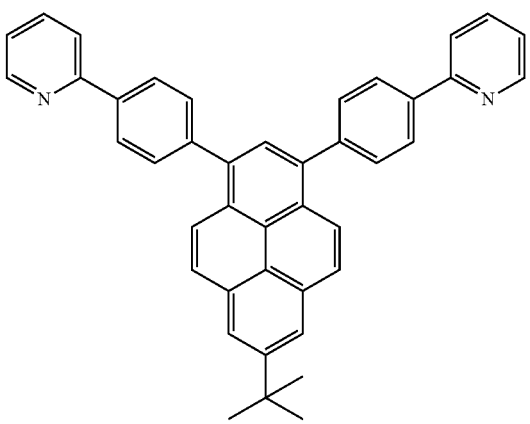
ET6
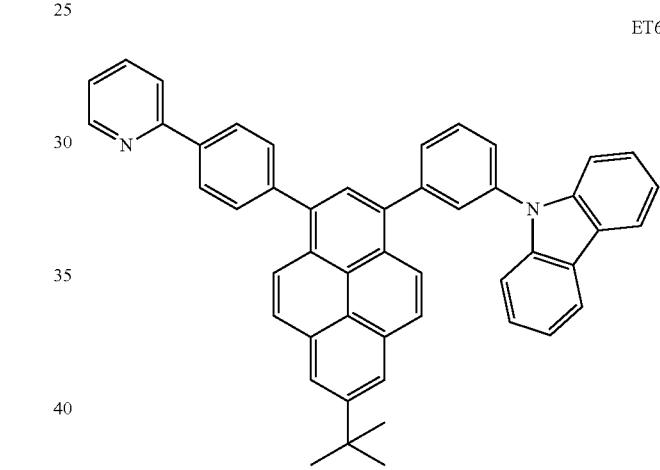
ET7
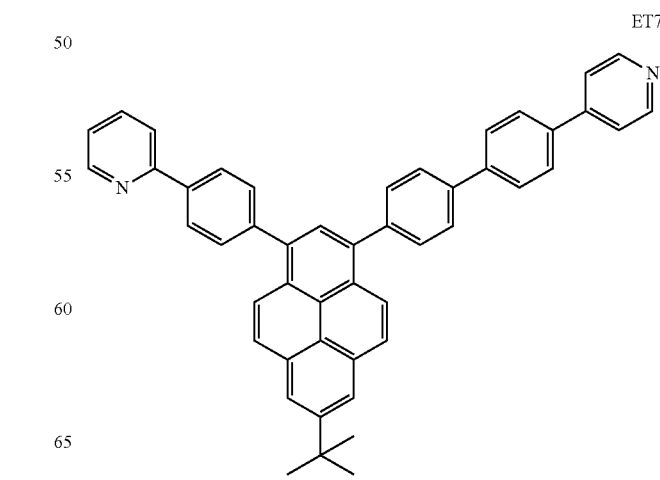

ET8
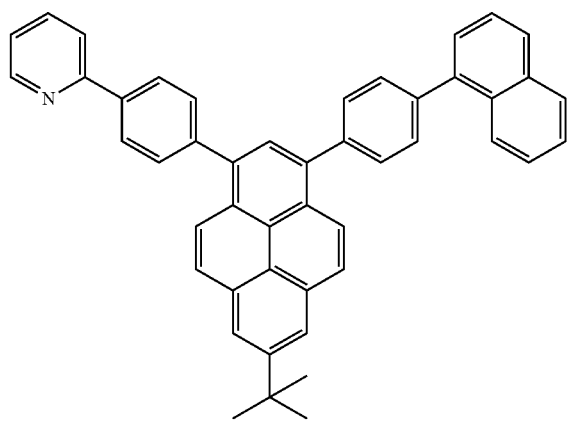
ET11
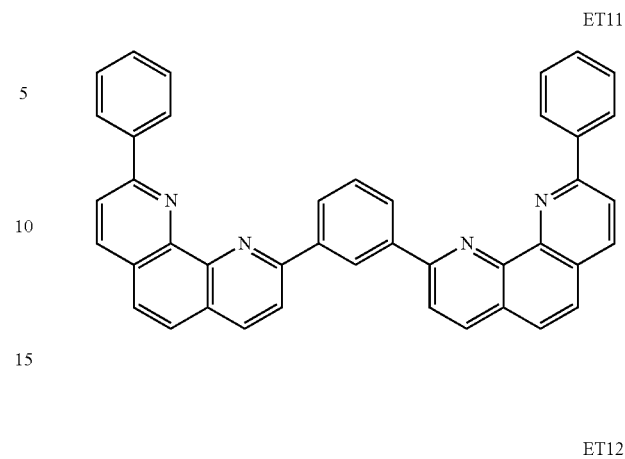
ET12
ET9
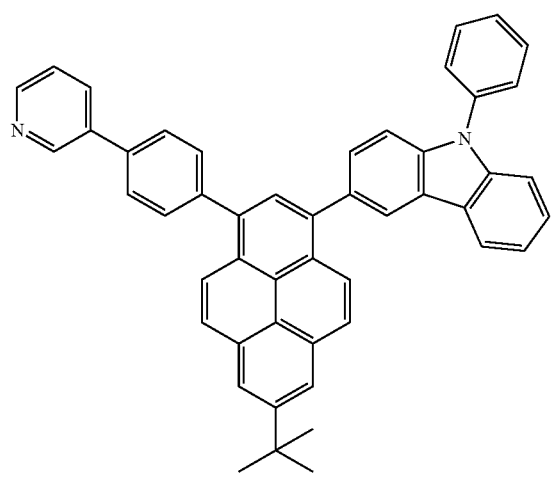
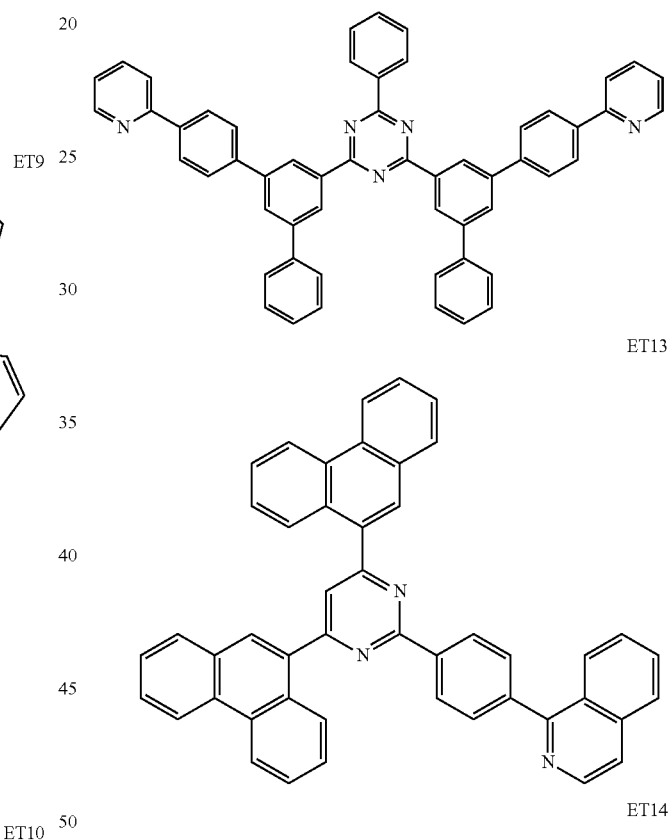
ET13
ET10
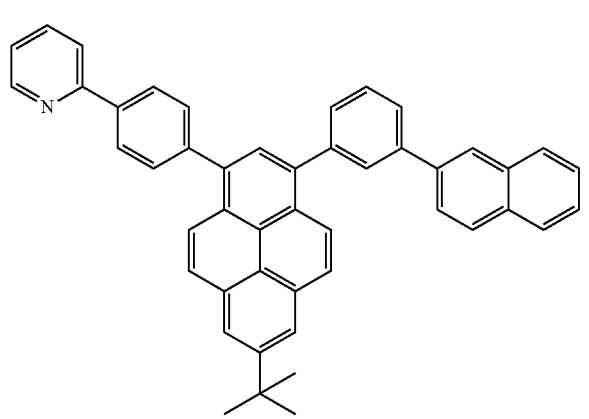
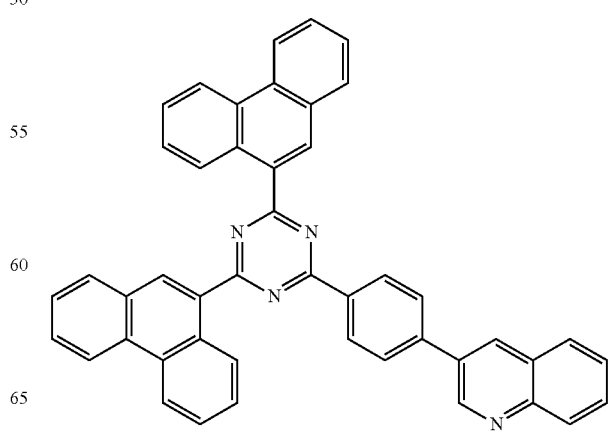
ET14

ET15
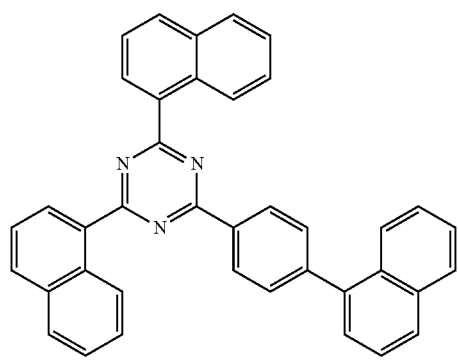
ET16
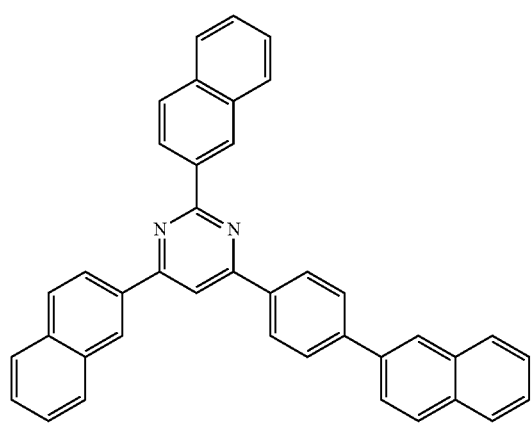
ET17
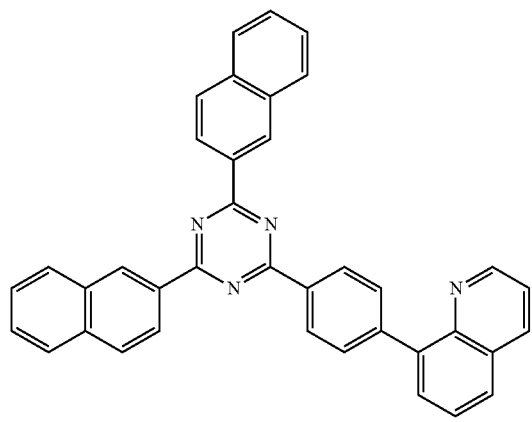
ET18
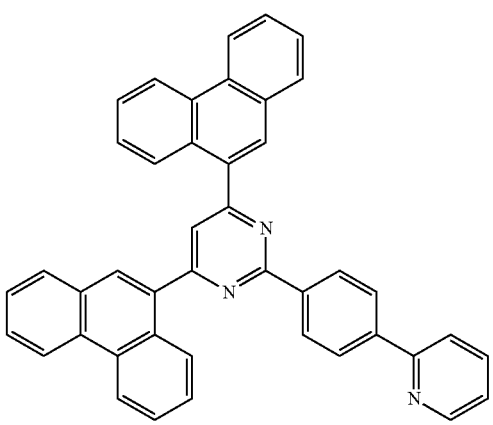
ET19
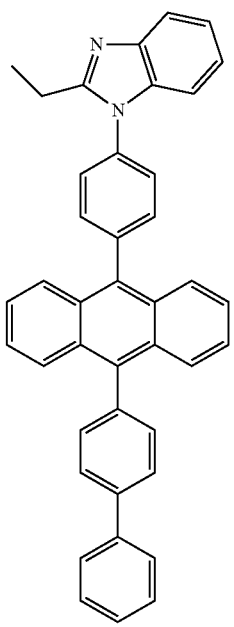
ET20
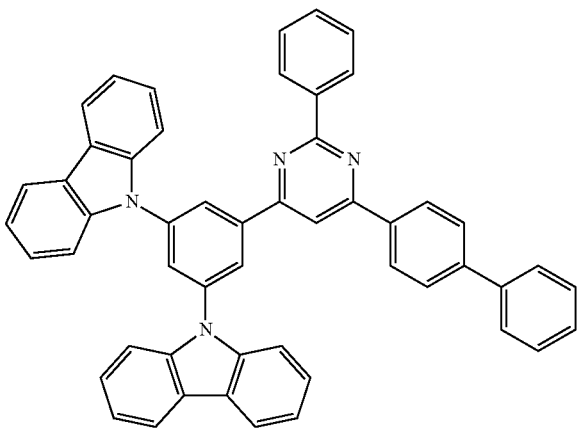

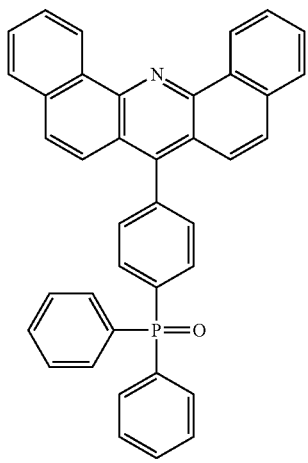
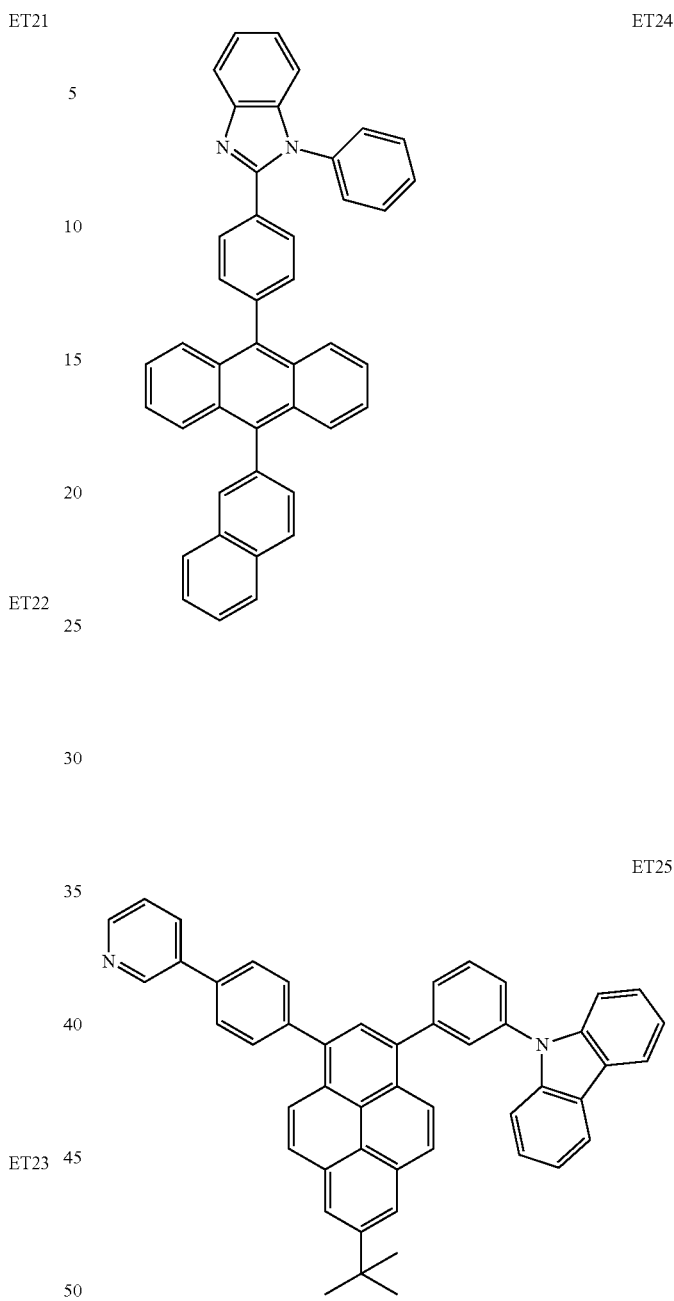

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium 8-hydroxyquinolate, LiQ) or ET-D2.

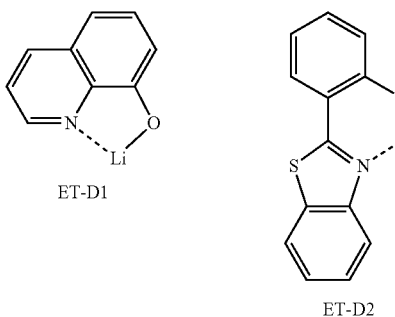

The electron transport region may include an electron injection layer (EIL) that promotes flow of electrons from the second electrode 19 thereinto.

The electron injection layer may include at least one selected from LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

The term "first-row transition metal of the Periodic Table of Elements" as used herein refers to an element of the Period 4 of the Periodic Table of Elements and belonging to a d-block, and examples thereof include scandium (Sc), titanium (Ti), vanadium (V), chromium (Cr), manganese (Mn), iron (Fe), cobalt (Co), nickel (Ni), copper (Cu), and zinc (Zn).

The term "second-row transition metal of the Periodic Table of Elements" as used herein refers to an element of the Period 5 of the Periodic Table of Elements and belonging to a d-block, and examples thereof include yttrium (Y), zirconium (Zr), niobium (Nb), molybdenum (Mo), technetium (Tc), ruthenium (Ru), rhodium (Rh), palladium (Pd), silver (Ag), and cadmium (Cd).

The term "third-row transition metal of the Periodic Table of Elements" as used herein refers to an element of the Period 6 and belonging to a d-block, and examples thereof include lanthanum (La), samarium (Sm), europium (Eu), terbium (Tb), thulium (Tm), ytterbium (Yb), lutetium (Lu), hafnium (Hf), tantalum (Ta), tungsten(W), rhenium (Re), osmium (Os), iridium (Ir), platinum (Pt), gold (Au), and mercury (Hg).

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an iso-propyloxy group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group.

The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group," as used herein, refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Examples of the $C_1$-$C_{60}$ heterocycloalkenyl group are a 2,3-dihydrofuranyl group, and a 2,3-dihydrothiophenyl group. The term "$C_1$-$C_{10}$ heterocycloalkenylene group," as used herein, refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a cyclic aromatic system that has at least one heteroatom selected from N, O, P, Si, and S as a ring-forming atom, in addition to 1 to 60 carbon atoms. The term "$C_1$-$C_{60}$ heteroarylene group" as used herein refers to a divalent group having a heterocyclic aromatic system that has at least one heteroatom selected from N, O, P, Si, and S as a ring-forming atom, in addition to 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

A $C_6$-$C_{60}$ aryloxy group as used herein indicates —$OA_{102}$ (wherein $A_{102}$ is the $C_6$-$C_{60}$ aryl group), and a $C_6$-$C_{60}$ arylthio group indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The term "$C_5$-$C_{30}$ carbocyclic group" as used herein refers to a monocyclic group or a polycyclic group, and, according to its chemical structure, a monovalent, divalent, trivalent, tetravalent, pentavalent, or hexavalent group.

The term "$C_1$-$C_{30}$ heterocyclic group" as used herein refers to a saturated or unsaturated cyclic group having at least one heteroatom selected from N, O, Si, P, and S other than 1 to 30 carbon atoms, as a ring-forming atom. The term "$C_1$-$C_{30}$ heterocyclic group" as used herein refers to a monocyclic group or a polycyclic group, and, according to its chemical structure, a monovalent, divalent, trivalent, tetravalent, pentavalent, or hexavalent group.

The term "5-membered aromatic heteroring" as used herein refers to an aromatic ring having, as a ring-forming atom, at least one heteroatom selected from N, O, P, Si, and S other than 3 to 5 carbon atoms.

The term "5-membered non-aromatic ring" as used herein refers to a saturated or unsaturated ring having, as a ring-forming atom, 3 to 5 carbon atoms.

The term "5-membered non-aromatic heteroring" as used herein refers to a saturated or unsaturated ring having at least one heteroatom selected from N, O, P, Si, and S other than 3 to 5 carbon atoms, as a ring-forming atom.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_1$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $-N(Q_{21})(Q_{22})$, $-Si(Q_{23})(Q_{24})(Q_{25})$, $-B(Q_{26})(Q_{27})$, and $-P(=O)(Q_{28})(Q_{29})$; and $-N(Q_{31})(Q_{32})$, $-Si(Q_{33})(Q_{34})(Q_{35})$, $-B(Q_{36})(Q_{37})$, and $-P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, $-F$, $-Cl$, $-Br$, $-I$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_1$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "'B' was used instead of 'A'" used in describing Synthesis Examples means that a molar equivalent of 'A' was identical to a molar equivalent of 'B'.

EXAMPLES

Synthesis Example 1: Synthesis of Compound 5

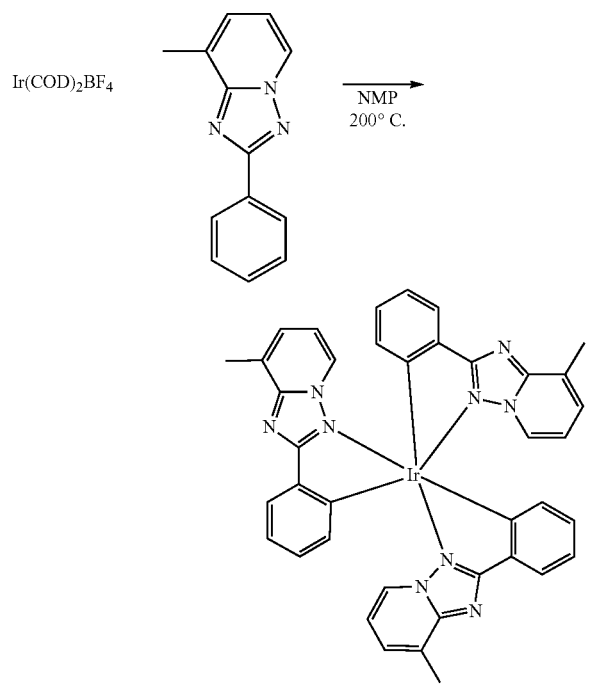

Ir(COD)$_2$BF$_4$ (5.32 millimoles, mmol), a ligand (26.58 mmol), and N-methyl-2-pyrrolidone were added to a reaction container, and the mixture is refluxed for 12 hours in a nitrogen atmosphere. After the reaction was completed, the reaction product was cooled to room temperature and an organic layer was extracted therefrom by using dichloromethane and distilled water. The collected organic layer was washed twice by using distilled water and dried by using MgSO$_4$, and a solvent was removed therefrom. A crude product obtained therefrom was purified by silica gel column chromatography (eluent: dichloromethane and n-hexane) to obtain Compound 5 (0.32 mmol, yield: 6%).

MALDI-TOF(m/z): 817.23 [M]$^+$.

Evaluation Example 1: Evaluation of HOMO, LUMO, and Triplet (Ti) Energy Levels

A HOMO energy level and a LUMO energy level of Compound 5 were evaluated according to the methods of Table 2, and results thereof are shown in Table 3.

TABLE 2

| | |
|---|---|
| HOMO energy level evaluation method | A voltage-current (V-A) graph of each Compound was obtained by using a cyclic voltammetry (CV) (electrolyte: 0.1 molar (M) Bu$_4$NClO$_4$/solvent: CH$_2$Cl$_2$/electrode: 3-electrode system (work electrode: GC, reference electrode: Ag/AgCl, auxiliary electrode: Pt)), and a HOMO energy level of each Compound was calculated from reduction onset of the graph. |
| LUMO energy level evaluation method | Each compound was diluted at a concentration of 1 × 10$^{-5}$M in CHCl$_3$, and a UV absorption spectrum thereof was measured at room temperature by using a Shimadzu UV-350 spectrometer, and a LUMO energy level thereof was calculated by using an optical band gap (E$_g$) from an edge of the absorption spectrum. |
| T$_1$ energy level evaluation method | A mixture of toluene and each compound (each compound was dissolved in an amount of 1 milligram (mg) in 3 milliliters (mL) of toluene) was loaded into a quartz cell, and then, the resultant quartz cell was loaded into liquid nitrogen (77 Kelvins, K). A photoluminescence (PL) spectrum thereof was measured by using a photoluminescence measurement device, and the obtained spectrum was compared with a PL spectrum measured at room temperature, and peaks observed only at low temperature were analyzed to calculate a T$_1$ energy level. |

TABLE 3

| Compound No. | HOMO (eV) | LUMO (eV) | T$_1$ (eV) |
|---|---|---|---|
| 5 | −5.38 | −2.54 | 2.58 |

Referring to Table 3, it is confirmed that Compound 5 has electric characteristics suitable for use as a material for an organic light-emitting device.

Evaluation Example 2: Evaluation of PL Spectrum

Figure 2:
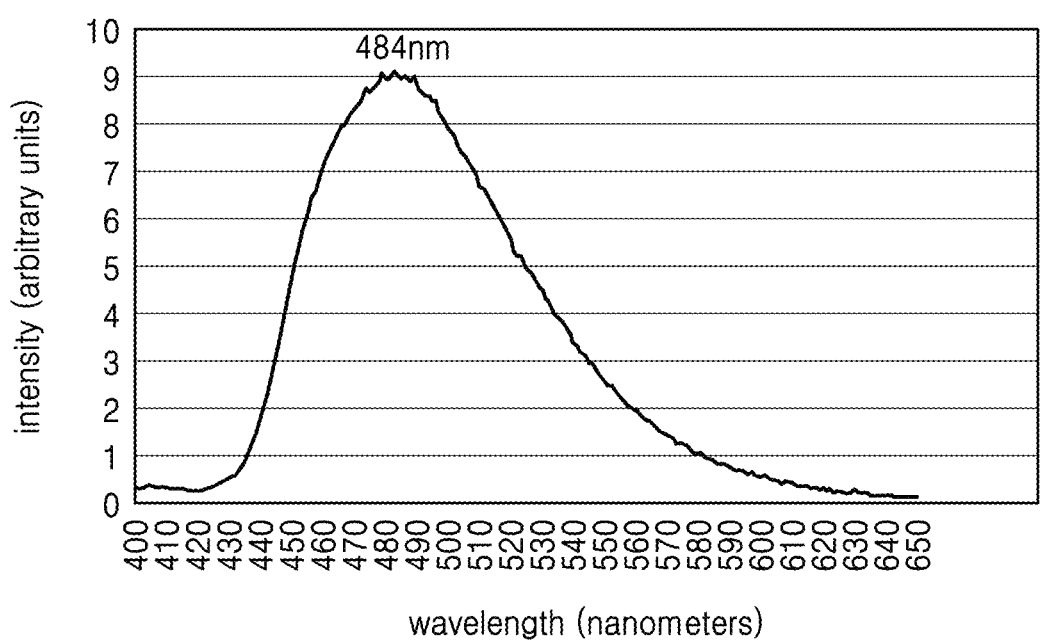
FIG. 2 is a graph showing a photoluminescence spectrum of Compound 5.

The PL spectrum of Compound 5 was evaluated so as to evaluate the light-emitting characteristics of each Compound. Compound 5 was diluted at a concentration of 10 millimolar (mM) in CHCl$_3$, and the PL spectrum thereof was measured at room temperature by using ISC PC1 Spectrofluorometer equipped with a xenon lamp. The maximum wavelength of the PL spectrum of Compound 5 is shown in Table 4 and FIG. 2.

TABLE 4

| Compound No. | $\lambda_{max}$ (nm) |
|---|---|
| 5 | 484 |

Referring to Table 4, it is confirmed that Compound 5 has PL characteristics suitable for emission of deep blue light.

Example 1

A glass substrate, on which a 1,500 Angstroms (Å) ITO electrode (first electrode, anode) was formed, was washed with distilled water ultrasonic waves. When the washing with distilled water was completed, sonification washing was performed by using a solvent, such as iso-propyl alcohol, acetone, or methanol. The result was dried and then transferred to a plasma washer, and the resultant substrate was washed with oxygen plasma for 5 minutes and then, transferred to a vacuum depositing device.

Compound HT3 and Compound HT-D1 were co-deposited on the ITO electrode of the glass substrate to form a hole injection layer having a thickness of 100 Å, Compound HT3 was deposited on the hole injection layer to form a hole transport layer having a thickness of 1,300 Å, and TAPC was deposited on the hole transport layer to form an electron blocking layer having a thickness of 100 Å, thereby forming a hole transport region.

Compound H52 (host) and Compound 5 (dopant, 7 percent by weight, weight %) were co-deposited on the hole transport region to form an emission layer having a thickness of 300 Å.

BCP was vacuum-deposited on the emission layer to form a hole blocking layer having a thickness of 250 Å, Compound ET3 and ET-D1 (LiQ) were co-deposited on the hole blocking layer to form an electron transport layer having a thickness of 300 Å, ET-D1 (LiQ) was deposited on the electron transport layer to form an electron injection layer having a thickness of 10 Å, and Al was deposited on the electron injection layer to form an Al second electrode (cathode) having a thickness of 1,200 Å, thereby completing the manufacture of an organic light-emitting device.

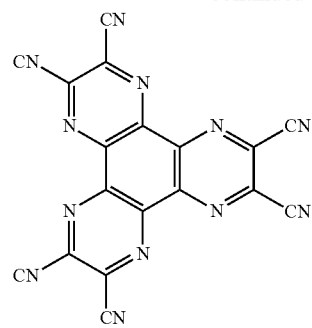

HT-D1

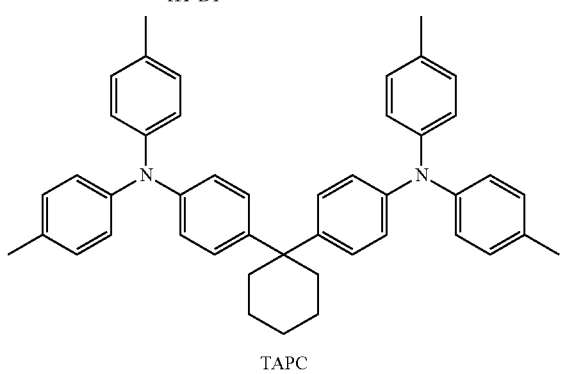

TAPC

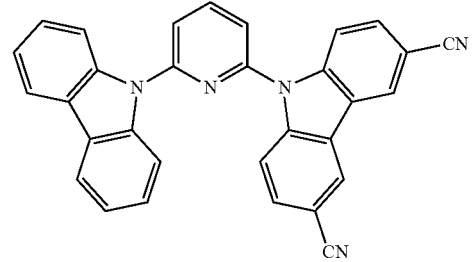

H52

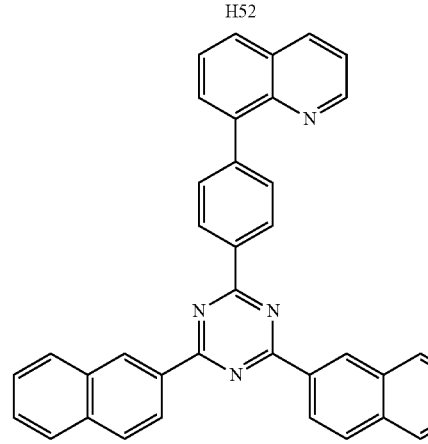

ET3

ET-D1

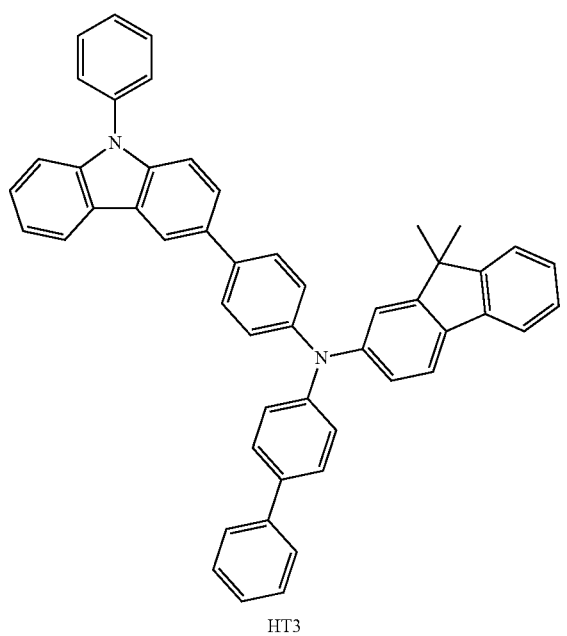

HT3

Comparative Examples 1 to 3

Organic light-emitting devices were manufactured in the same manner as in Example 1, except that Compounds shown in Table 5 were each used instead of Compound 5 as a dopant in forming an emission layer.

Evaluation Example 3: Evaluation of Characteristics of Organic Light-Emitting Devices The EL spectrum, change in current density according to a voltage, change in luminance according to a voltage, efficiency, conversion efficiency, external quantum efficiency, lifespan, and CIE color coordinates of the organic light-emitting devices manufactured according to Example 1 and Comparative Examples 1 to 3 were measured. A specific measuring method is as follows and results thereof are shown in Table 5.

(1) Measurement of EL Spectrum

The EL spectrum of the manufactured organic light-emitting device was measured at a luminance of 500 candelas per square meter ($cd/m^2$) by using a luminance meter (Minolta Cs-1000A).

(2) Measurement of Current Density According to Voltage

The current value flowing through a unit element in the manufactured organic light-emitting device was measured by using a current-voltage meter (Keithley 2400) while increasing a voltage from 0 volts (V) to 10 V, and the result was obtained by dividing the measured current value by an area.

(3) Measurement of Change in Luminance According to Voltage

The luminance of the manufactured organic light-emitting device was measured by using a luminance meter (Minolta Cs-1000A) while increasing a voltage from 0 V to 10 V.

(4) Measure of Conversion Efficiency

The current efficiency (candelas per ampere, cd/A) of the same current density (10 milliamperes per square centimeter, $mA/cm^2$) was calculated by using the luminance and the current density and the luminance measured in (2) and (3) and the voltage. Then, the conversion efficiency was calculated by dividing the current efficiency by the y value of the CIE color coordinates measured in (6).

(5) Measurement of Lifespan

The time taken until the luminance measured in (3) (initial luminance was set to 100%) decreased to 80% (To) was calculated.

(6) Measurement of CIE Color Coordinates

The CIE color coordinates were obtained by measuring the EL spectrum of the manufactured organic light-emitting device when the luminance was 500 $cd/m^2$ by using a luminance meter (Minolta Cs-1000A).

TABLE 5

| No. | Dopant | Driving voltage (V) | Luminance ($cd/m^2$) | Efficiency (cd/A) | EQE (%) | EL (nm) | $T_{80}$ (hr) | Color coordinates (x, y) |
|---|---|---|---|---|---|---|---|---|
| Example 1 | Compound 5 | 3.8 | 500 | 45.2 | 20 | 484 | 300 | 0.16 0.31 |
| Comparative Example 1 | Compound A | 4.5 | 500 | 14.1 | 6 | 480 | 1 | 0.15 0.30 |
| Comparative Example 2 | Compound B | 4.1 | 500 | 28.7 | 12 | 482 | 100 | 0.22 0.48 |
| Comparative Example 3 | Compound C | 5.6 | 500 | 30 | 14 | 520 | 150 | 0.42 0.57 |

A

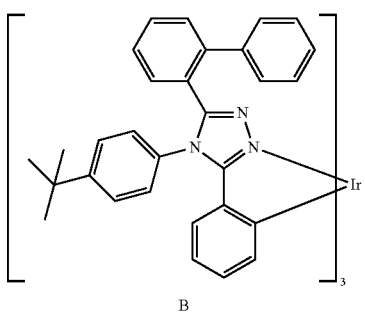

B

| No. | Dopant | Driving voltage (V) | Luminance (cd/m$^2$) | Efficiency (cd/A) | EQE (%) | EL (nm) | $T_{80}$ (hr) | Color coordinates (x, y) |
|---|---|---|---|---|---|---|---|---|

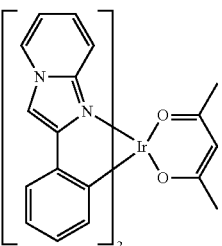

C

Referring to Table 5, it is confirmed that the organic light-emitting device of Example 1 has excellent efficiency, external quantum efficiency, and lifespan characteristics, as compared with the organic light-emitting devices of Comparative Examples 1 to 3, and also enables deep blue light to be emitted.

Since the organometallic compound has improved electric characteristics and/or thermal stability, an organic light-emitting device including the organometallic compound may have improved lifespan and color purity characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present description as defined by the following claims.

What is claimed is:

1. An organometallic compound represented by Formula 1:

$$M_{11}(L)_{n11}(L_{12})_{n12},\qquad \text{Formula 1}$$

wherein, in Formula 1, $M_{11}$ is a transition metal, $L_{11}$ is selected from a group represented by Formula 1A, n11 is selected from 1, 2, 3, and 4, wherein, when n11 is 2 or more, 2 or more groups $L_{11}$ are the same or different from each other, $L_{12}$ is selected from a one-coordinate ligand, a two-coordinate ligand, and a three-coordinate ligand, n12 is selected from 0, 1, 2, 3, and 4, wherein, when n12 is 2 or more, 2 or more groups $L_{12}$ are the same or different from each other, $L_{11}$ and $L_{12}$ are different from each other Formula 1A

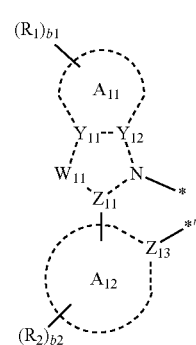

wherein, in Formula 1A, $A_{11}$ is a $C_1$-$C_{30}$ heterocyclic group, $A_{12}$ is a $C_5$-$C_{30}$ carbocyclic group or a $C_1$-$C_{30}$ heterocyclic group, $W_{11}$ is selected from N and N($R_{11}$), $Y_{11}$ and $Y_{12}$ are each independently selected from N and C, wherein at least one selected from $Y_{11}$ and $Y_{12}$ is N, $Z_{11}$ and $Z_{13}$ are each C, $R_1$, $R_2$, and $R_{11}$ are each independently selected from hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), two or more selected from $R_1$, $R_2$, and $R_{11}$ are optionally linked to each other to form a ring, two, three, or four selected from a plurality of neighboring $R_1$, $R_2$, and $R_{11}$ are optionally linked to each other to form a four-coordinate ligand, a six-coordinate ligand, or an eight-coordinate ligand, $Q_1$ to $Q_9$ are each independently selected from hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one selected from deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, and the following compound is excluded from the organometallic compound represented by Formula 1:

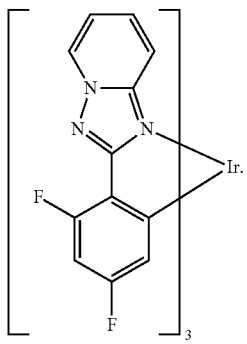

2. The organometallic compound of claim 1, wherein $M_{11}$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), and thulium (Tm).

3. The organometallic compound of claim 1, wherein $M_{11}$ is selected from Ir, Os, and Pt.

4. The organometallic compound of claim 1, wherein a moiety represented by

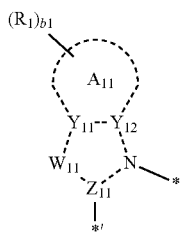

is represented by Formula 1A-1, and a moiety represented by

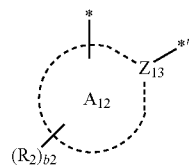

is represented by Formula 1A-2:

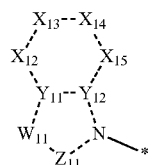
Formula 1A-1

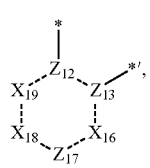
Formula 1A-2 wherein, in Formulae 1A-1 and 1A-2, $Y_{11}$, $Y_{12}$, $W_{11}$, $Z_{11}$, and $Z_{13}$ are each independently the same as described in Formula 1A;

$X_{12}$ is selected from N, $N(R_{12a})$, O, S, $C(R_{12a})$, and $C(R_{12a})(R_{12b})$, $X_{13}$ is selected from N, $N(R_{13a})$, O, S, $C(R_{13a})$, and $C(R_{13a})(R_{13b})$, $X_{14}$ is selected from N, $N(R_{14a})$, O, S, $C(R_{14a})$, and $C(R_{14a})(R_{14b})$, $X_{15}$ is selected from N, $N(R_{15a})$, O, S, $C(R_{15a})$, and $C(R_{15a})(R_{15b})$, $X_{16}$ is selected from N, $N(R_{16a})$, O, S, $C(R_{16a})$, and $C(R_{16a})(R_{16b})$, $X_{17}$ is selected from N, $N(R_{17a})$, O, S, $C(R_{17a})$, and $C(R_{17a})(R_{17b})$, $X_{18}$ is selected from N, $N(R_{18a})$, O, S, $C(R_{18a})$, and $C(R_{18a})(R_{18b})$, and $X_{19}$ is selected from N, $N(R_{19a})$, O, S, $C(R_{19a})$, and $C(R_{19a})(R_{19b})$, $R_{12a}$, $R_{12b}$, $R_{13a}$, $R_{13b}$, $R_{14a}$, $R_{14b}$, $R_{15a}$, $R_{15b}$, $R_{16a}$, $R_{16b}$, $R_{17a}$, $R_{17b}$, $R_{18a}$, $R_{18b}$, $R_{19a}$, and $R_{19b}$ are each independently defined the same as $R_1$ in Formula 1A;

in Formulae 1A-1, * indicates a binding site to $M_{11}$ of Formula 1, and *' indicates a binding site to a neighboring atom, and in Formulae 1A-2, *' indicates a binding site to $M_{11}$ of Formula 1, and * indicates a binding site to a neighboring atom.

5. The organometallic compound of claim 4, wherein
i) $X_{12}$ is selected from N and $C(R_{12a})$, $X_{13}$ is selected from N and $C(R_{13a})$, $X_{14}$ is selected from N and $C(R_{14a})$, $X_{15}$ is selected from N and $C(R_{15a})$, $X_{16}$ is selected from N and $C(R_{16a})$, $X_{17}$ is selected from N and $C(R_{17a})$, $X_{18}$ is selected from N and $C(R_{18a})$, and $X_{19}$ is selected from N and $C(R_{19a})$; and
ii) $X_{16}$ is N, $X_{17}$ is $C(R_{17a})$, $X_{18}$ is $C(R_{18a})$, and $X_{19}$ is $C(R_{19a})$; $X_{16}$ is $C(R_{16a})$, $X_{17}$ is N, $X_{18}$ is $C(R_{18a})$, and $X_{19}$ is $C(R_{19a})$; $X_{16}$ is $C(R_{16a})$, $X_{17}$ is $C(R_{17a})$, $X_{18}$ is N, and $X_{19}$ is $C(R_{19a})$; $X_{16}$ is $C(R_{16a})$, $X_{17}$ is $C(R_{17a})$, $X_{18}$ is $C(R_{18a})$, and $X_{19}$ is N; or $X_{16}$ is $C(R_{16a})$, $X_{17}$ is $C(R_{17a})$, $X_{18}$ is $C(R_{18a})$, and $X_{19}$ is $C(R_{19a})$.

6. The organometallic compound of claim 1, wherein $Y_{11}$ is N, and $Y_{12}$ is C;
$Y_{11}$ is C, and $Y_{12}$ is N; or
$Y_{11}$ is N, and $Y_{12}$ is N.

7. The organometallic compound of claim 1, wherein a moiety represented by
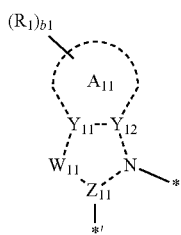
is represented by one selected from Formulae 2-1 to 2-15:
2-1
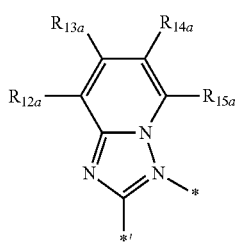
2-2
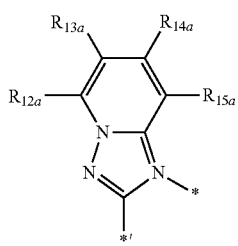
2-3
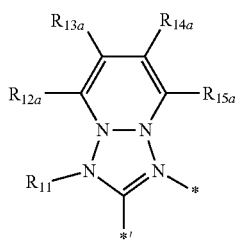
2-4
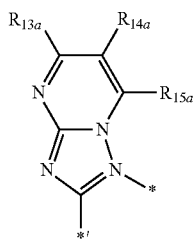
2-5
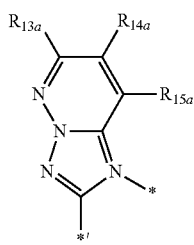
-continued
2-6
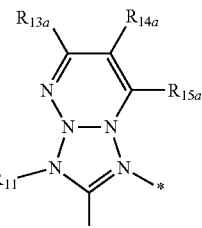
2-7
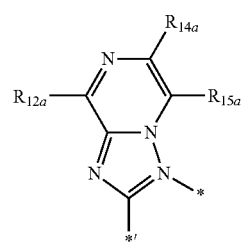
2-8
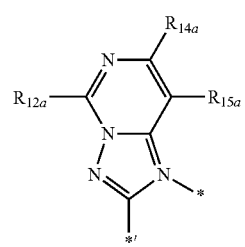
2-9
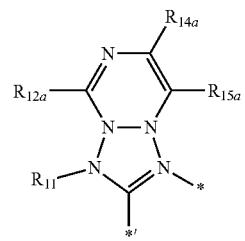
2-10
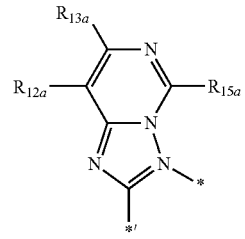
2-11
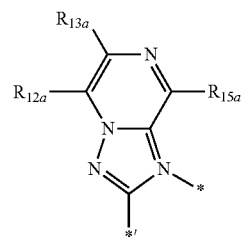

-continued
2-12
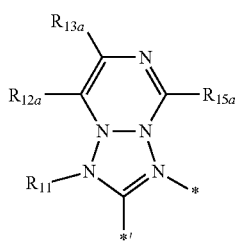
2-13
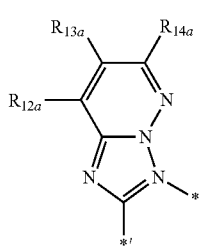
2-14
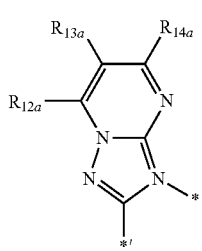
2-15
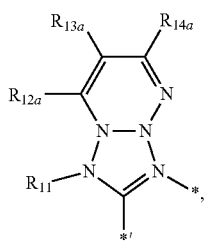
wherein, in Formulae 2-1 to 2-15,
$R_{11}$ is the same as described in Formula 1A,
$R_{12a}$, $R_{13a}$, $R_{14a}$, and $R_{15a}$ are each independently defined the same as $R_1$ in Formula 1A; and
* and *' each indicate a binding site to a neighboring atom.
8. The organometallic compound of claim 1, wherein a moiety represented by
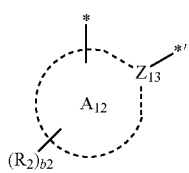
is represented by one selected from Formulae 3-1 to 3-8:
3-1
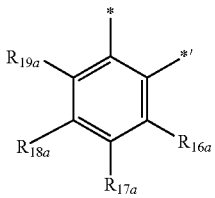
3-2
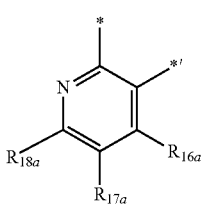
3-3
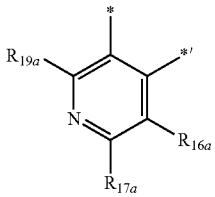
3-4
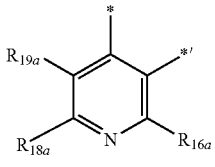
3-5
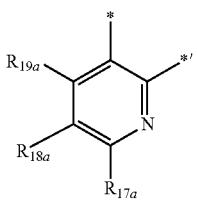
3-6
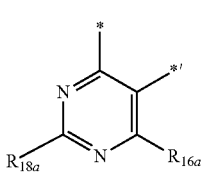
3-7
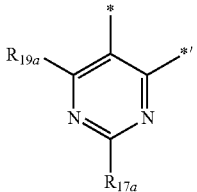

-continued 3-8

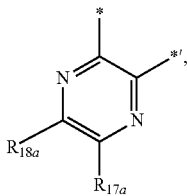

wherein, in Formulae 3-1 to 3-8,
$R_{16a}$, $R_{17a}$, $R_{18a}$, and $R_{19a}$ are each independently defined the same as $R_2$ in Formula 1A, and
* and *' each indicate a binding site to a neighboring atom.

9. The organometallic compound of claim 1, wherein $R_1$, $R_2$, and $R_{11}$ are each independently selected from:
hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, and a $C_1$-$C_{20}$ alkoxy group;
a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;
a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group;
a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, and —$Si(Q_{33})(Q_{34})(Q_{35})$; and —N(Q$_1$)(Q$_2$), —Si(Q$_3$)(Q$_4$)(Q$_5$), —B(Q$_6$)(Q$_7$), and —P(=O)(Q$_8$)(Q$_9$), and Q$_1$ to Q$_9$ and Q$_{33}$ to Q$_{35}$ are each independently selected from:
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a C$_1$-C$_{10}$ alkyl group, and a phenyl group.

10. The organometallic compound of claim 1, wherein R$_1$, R$_2$, and R$_1$ are each independently selected from:

hydrogen, deuterium, —F, a cyano group, a nitro group, —SF$_5$, a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group;

a methyl group, an ethyl group, an n-propyl group, an iso-propyl group, an n-butyl group, an iso-butyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, and a dibenzosilolyl group, each substituted with at least one selected from deuterium, —F, —CD$_3$, —CD$_2$H, —CDH$_2$, —CF$_3$, —CF$_2$H, —CFH$_2$, a cyano group, a nitro group, a C$_1$-C$_{10}$ alkyl group, a C$_1$-C$_{10}$ alkoxy group, a cyclopentyl group, a cyclopentyl group substituted with deuterium, a cyclohexyl group, a cyclohexyl group substituted with deuterium, a cycloheptyl group, a cycloheptyl group substituted with deuterium, a cyclooctyl group, a cyclooctyl group substituted with deuterium, a bicyclo[2.2.1]heptanyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a fluorenyl group, a carbazolyl group, a dibenzofuranyl group, a dibenzothiophenyl group, a dibenzosilolyl group, and —Si(Q$_{33}$)(Q$_{34}$)(Q$_{35}$); and —N(Q$_1$)(Q$_2$), —Si(Q$_3$)(Q$_4$)(Q$_5$), —B(Q$_6$)(Q$_7$), and —P(=O)(Q$_8$)(Q$_9$), and Q$_1$ to Q$_9$ and Q$_{33}$ to Q$_{35}$ are each independently selected from:
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a C$_1$-C$_{10}$ alkyl group, and a phenyl group.

11. The organometallic compound of claim 1, wherein at least one selected from R$_1$, R$_2$, and R$_{11}$ is selected from deuterium, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{60}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted monovalent non-aromatic condensed polycyclic group, a substituted or unsubstituted monovalent non-aromatic condensed heteropolycyclic group, —N(Q$_1$)(Q$_2$), —Si(Q$_3$)(Q$_4$)(Q$_5$), —B(Q$_6$)(Q$_7$), and —P(=O)(Q$_8$)(Q$_9$).

12. The organometallic compound of claim 1, wherein n11 is selected from 1, 2, and 3, and n12 is selected from 0, 1, and 2.

13. The organometallic compound of claim 1, wherein M$_{11}$ is Ir, n11 is selected from 2 and 3, and n12 is selected from 0, 1, and 2.

14. The organometallic compound of claim 1, wherein L$_{12}$ is represented by one selected from Formulae 7-1 to 7-11:

7-1 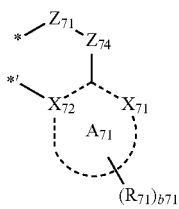

7-2 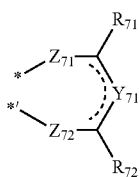

7-3 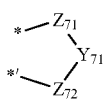

7-4 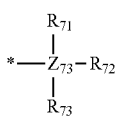

7-5 

7-6 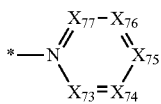

7-7 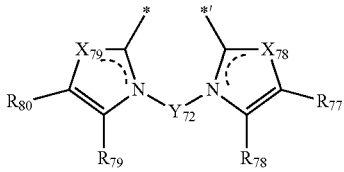

7-8 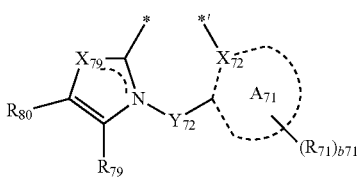

7-9 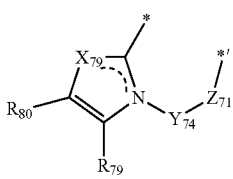

7-10

7-11 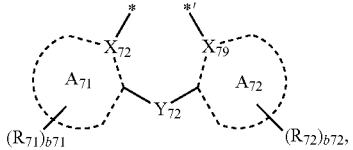

wherein, in Formulae 7-1 to 7-11, $A_{71}$ and $A_{72}$ are each independently selected from a $C_5$-$C_{20}$ carbocyclic group and a $C_1$-$C_{20}$ heterocyclic group, $X_{71}$ and $X_{72}$ are each independently selected from C and N, $X_{73}$ is N or $C(Q_{73})$; $X_{74}$ is N or $C(Q_{74})$; $X_{75}$ is N or $C(Q_{75})$; $X_{76}$ is N or $C(Q_{76})$; and $X_{77}$ is N or $C(Q_{77})$, $X_{78}$ is O, S, or $N(Q_{78})$; and $X_{79}$ is O, S, or $N(Q_{79})$, $Y_{71}$ and $Y_{72}$ are each independently selected from a single bond, a double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group, $Z_{71}$ and $Z_{72}$ are each independently selected from N, O, $N(R_{75})$, $P(R_{75})(R_{76})$, and $As(R_{75})(R_{76})$, $Z_{73}$ is selected from P and As, $Z_{74}$ is selected from CO and $CH_2$, $R_{71}$ to $R_{80}$ and $Q_{73}$ to $Q_{79}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group; $R_{71}$ and $R_{72}$ are optionally linked to each other to form a ring; $R_{77}$ and $R_{78}$ are optionally linked to each other to form a ring; $R_{78}$ and $R_{79}$ are optionally linked to each other to form a ring; and $R_{79}$ and $R_{80}$ are optionally linked to each other to form a ring, b71 and b72 are each independently selected from 1, 2, and 3, and

* and *' each indicate a binding site to a neighboring atom.

15. The organometallic compound of claim 1, wherein the organometallic compound represented by Formula 1 is represented by one selected from Formulae 1-1 and 1-2:

1-1

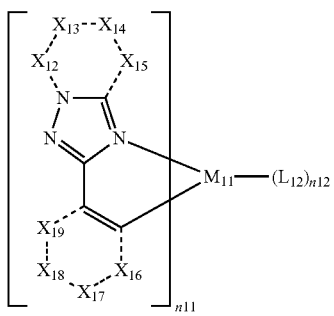

1-2

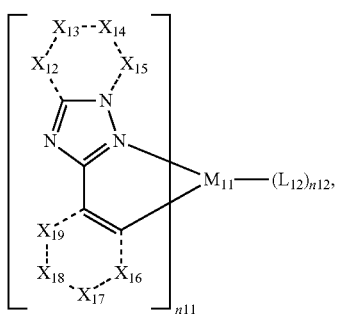

wherein, in Formulae 1-1 and 1-2, $M_{11}$, n11, n12, and $L_{12}$ are each independently the same as described in Formula 1, $X_{12}$ is selected from N, N($R_{12a}$), O, S, C($R_{12a}$), and C($R_{12a}$)($R_{12b}$), $X_{13}$ is selected from N, N($R_{13a}$), O, S, C($R_{13a}$), and C($R_{13a}$)($R_{13b}$), $X_{14}$ is selected from N, N($R_{14a}$), O, S, C($R_{14a}$), and C($R_{14a}$)($R_{14b}$), $X_{15}$ is selected from N, N($R_{15a}$), O, S, C($R_{15a}$), and C($R_{15a}$)($R_{15b}$), $X_{16}$ is selected from N, N($R_{16a}$), O, S, C($R_{16a}$), and C($R_{16a}$)($R_{16b}$), $X_{17}$ is selected from N, N($R_{17a}$), O, S, C($R_{17a}$), and C($R_{17a}$)($R_{17b}$), $X_{18}$ is selected from N, N($R_{18a}$), O, S, C($R_{18a}$), and C($R_{18a}$)($R_{18b}$), and $X_{19}$ is selected from N, N($R_{19a}$), O, S, C($R_{19a}$), and C($R_{19a}$)($R_{19b}$), and $R_{12a}$, $R_{12b}$, $R_{13a}$, $R_{13b}$, $R_{14a}$, $R_{14b}$, $R_{15a}$, $R_{15b}$, $R_{16a}$, $R_{16b}$, $R_{17a}$, $R_{17b}$, $R_{18a}$, $R_{18b}$, $R_{19a}$, and $R_{19b}$ are each independently defined the same as $R_1$ in Formula 1A.

16. The organometallic compound of claim 1, wherein the organometallic compound represented by Formula 1 is selected from Compounds 1 to 16:

1

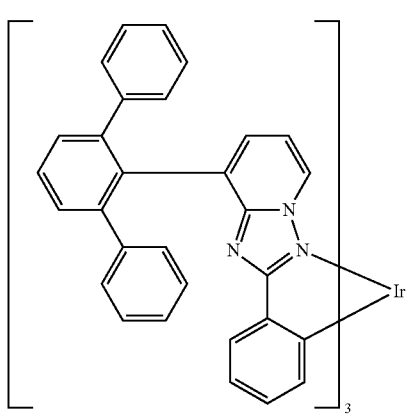

2

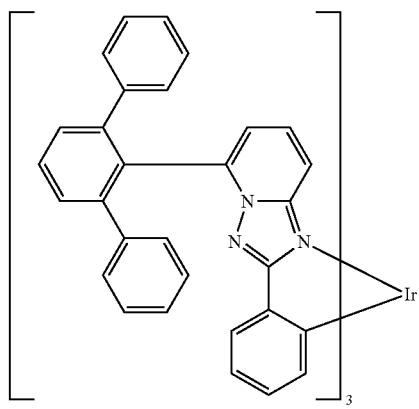

3

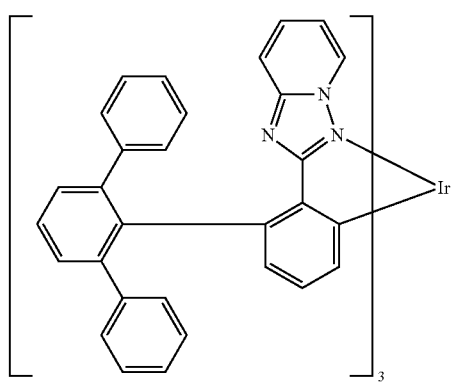

4

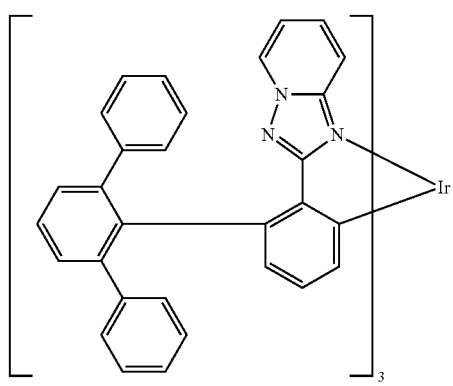

5

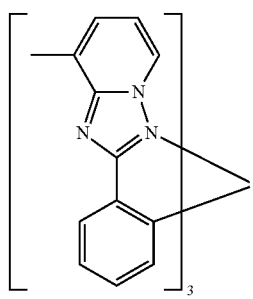

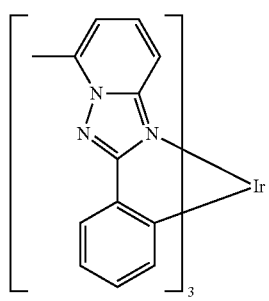
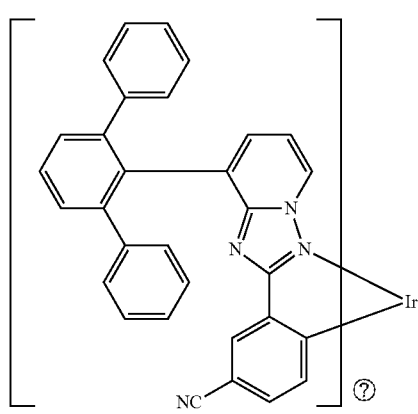
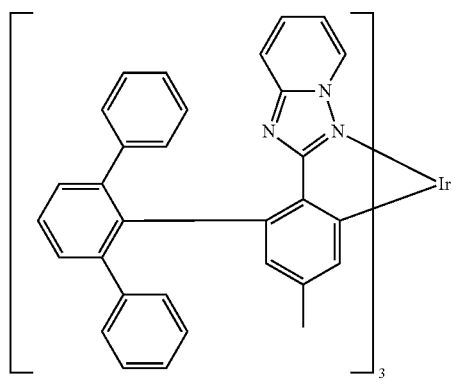
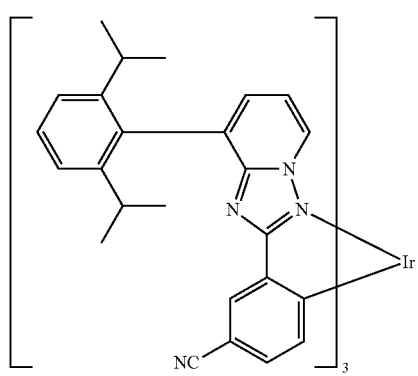
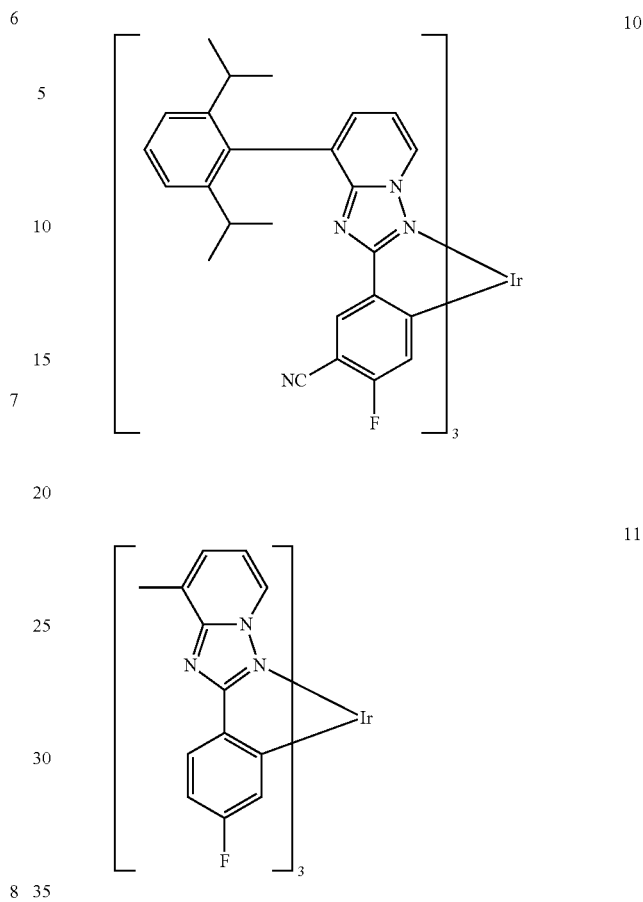
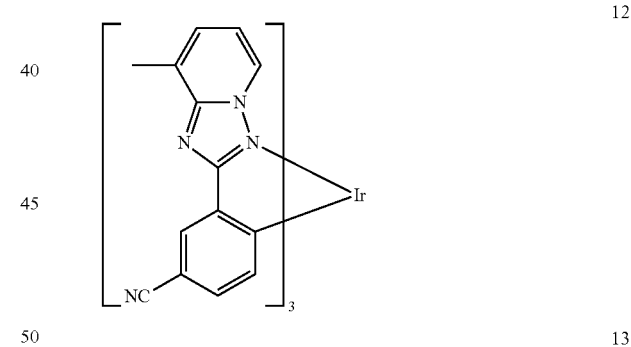
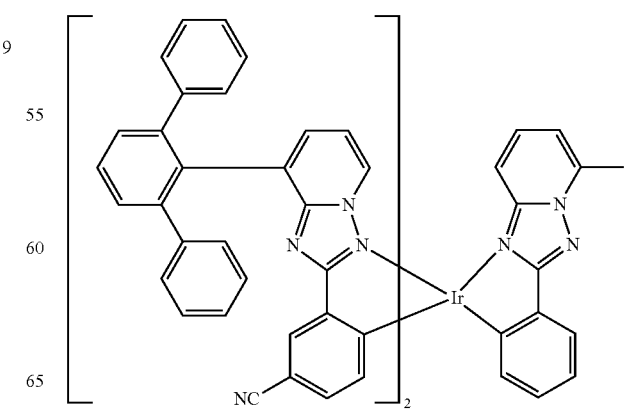

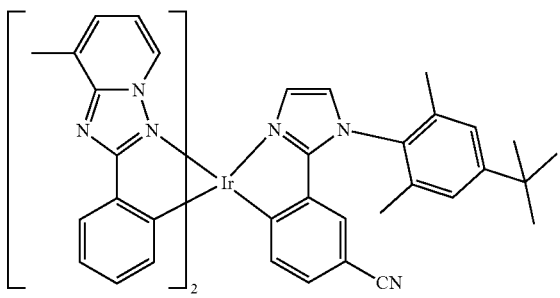

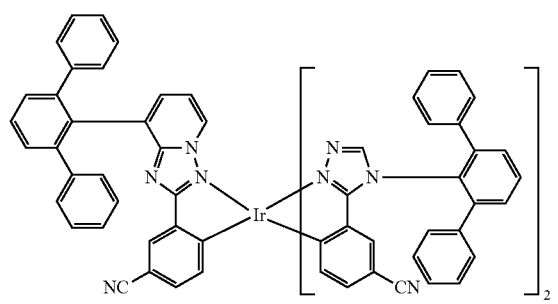

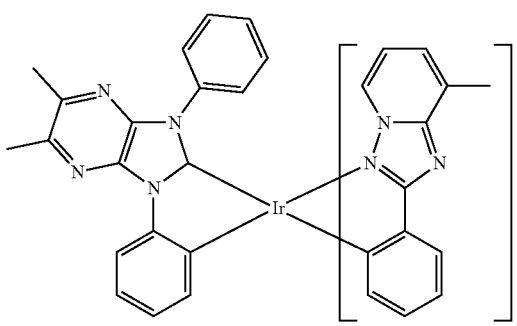

17. The organometallic compound of claim 1, wherein the organometallic compound emits blue light having a maximum emission wavelength of about 400 nanometers to about 520 nanometers.

18. An organic light-emitting device comprising:
a first electrode;
a second electrode; and
an organic layer disposed between the first electrode and the second electrode and comprising an emission layer,
wherein the organic layer comprises the organometallic compound of claim 1.

19. The organic light-emitting device of claim 18, wherein the emission layer comprises the organometallic compound.

20. The organic light-emitting device of claim 19, wherein the emission layer further comprises a host, and an amount of the host is larger than an amount of the organometallic compound.

* * * * *